US008704736B2

(12) United States Patent
Kimura

(10) Patent No.: US 8,704,736 B2
(45) Date of Patent: *Apr. 22, 2014

(54) LIGHT EMITTING DEVICE, METHOD OF DRIVING A LIGHT EMITTING DEVICE, ELEMENT SUBSTRATE, AND ELECTRONIC EQUIPMENT

(71) Applicant: Semiconductor Energy Laboratory Co., Ltd., Atsugi (JP)

(72) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/936,778

(22) Filed: Jul. 8, 2013

(65) Prior Publication Data

US 2014/0015738 A1    Jan. 16, 2014

Related U.S. Application Data

(63) Continuation of application No. 12/190,333, filed on Aug. 12, 2008, now Pat. No. 8,482,491, which is a continuation of application No. 11/382,085, filed on May 8, 2006, now Pat. No. 7,411,586, and a continuation of application No. 10/230,068, filed on Aug. 29, 2002, now Pat. No. 7,046,240.

(30) Foreign Application Priority Data

Aug. 29, 2001   (JP) .................................. 2001-258936

(51) Int. Cl.
G09G 3/30       (2006.01)
G06F 3/038      (2013.01)
G09G 5/00       (2006.01)
G09G 5/10       (2006.01)

(52) U.S. Cl.
USPC ............................. 345/76; 345/214; 345/690

(58) Field of Classification Search
USPC ............................. 345/76–84, 204, 214, 690
See application file for complete search history.

(56) References Cited

U.S. PATENT DOCUMENTS 3,786,279 A  *  1/1974  Wilson ......................... 327/487
5,684,365 A     11/1997  Tang
(Continued)

FOREIGN PATENT DOCUMENTS

EP    0 717 446 A2    6/1996
EP    1 102 234 A2    5/2001
(Continued)

OTHER PUBLICATIONS

Baldo et al.; "Highly efficient phosphorescent emission from organic electroluminescent devices"; Letters to Nature, vol. 395; pp. 151-154; Sep. 10, 1998.

(Continued)

Primary Examiner — Sumati Lefkowitz
Assistant Examiner — David Tung
(74) Attorney, Agent, or Firm — Fish & Richardson P.C.

(57) ABSTRACT

A display device capable of obtaining a constant luminance without being influenced by temperature change is provided as well as a method of driving the display device. A current mirror circuit composed of a first transistor and a second transistor is provided in each pixel. The first transistor and second transistor of the current mirror circuit are connected such that their drain currents are kept almost equal irrespective of the level of load resistance. By controlling the OLED drive current using the current mirror circuit, a change in OLED drive current due to fluctuation in characteristics between transistors is avoided and a constant luminance is obtained without being influenced by temperature change.

15 Claims, 38 Drawing Sheets

Structure 2

(56) References Cited

U.S. PATENT DOCUMENTS

| | | | |
|---|---|---|---|
| 5,952,789 A | 9/1999 | Stewart | |
| 5,990,629 A | 11/1999 | Yamada | |
| 6,023,259 A | 2/2000 | Howard | |
| 6,091,203 A | 7/2000 | Kawashima et al. | |
| 6,222,357 B1 | 4/2001 | Sakuragi | |
| 6,229,506 B1 | 5/2001 | Dawson | |
| 6,246,180 B1 | 6/2001 | Nishigaki | |
| 6,307,322 B1 | 10/2001 | Dawson | |
| 6,331,844 B1 | 12/2001 | Okumura et al. | |
| 6,351,078 B1 | 2/2002 | Wang et al. | |
| 6,366,116 B1 | 4/2002 | Juang | |
| 6,373,454 B1 | 4/2002 | Knapp et al. | |
| 6,452,341 B1 | 9/2002 | Yamauchi et al. | |
| 6,486,606 B1 | 11/2002 | Ting | |
| 6,501,466 B1 | 12/2002 | Yamagishi | |
| 6,535,185 B2 | 3/2003 | Kim | |
| 6,753,654 B2 | 6/2004 | Koyama | |
| 6,777,710 B1 | 8/2004 | Koyama | |
| 6,839,057 B2 | 1/2005 | Iguchi | |
| 6,859,193 B1 | 2/2005 | Yumoto | |
| 7,046,240 B2 | 5/2006 | Kimura | |
| 7,138,968 B2 | 11/2006 | Kasai et al. | |
| 7,411,586 B2 | 8/2008 | Kimura | |
| 7,551,151 B2 | 6/2009 | Kasai et al. | |
| 2001/0002703 A1* | 6/2001 | Koyama | 257/40 |
| 2001/0045929 A1 | 11/2001 | Prache et al. | |
| 2001/0052941 A1 | 12/2001 | Matsunaga | |
| 2001/0055828 A1 | 12/2001 | Kaneko | |
| 2002/0030647 A1 | 3/2002 | Hack | |
| 2002/0033718 A1* | 3/2002 | Tam | 327/94 |
| 2002/0135313 A1 | 9/2002 | Koyama | |
| 2002/0180369 A1 | 12/2002 | Koyama | |
| 2003/0043131 A1 | 3/2003 | Iguchi | |
| 2003/0062524 A1 | 4/2003 | Kimura | |
| 2003/0189206 A1 | 10/2003 | Koyama | |
| 2004/0155574 A1 | 8/2004 | Lai et al. | |
| 2004/0239654 A1 | 12/2004 | Okuda | |

FOREIGN PATENT DOCUMENTS

| | | |
|---|---|---|
| EP | 1 130 565 A1 | 9/2001 |
| EP | 1 291 839 A1 | 3/2003 |
| EP | 2 157 562 A2 | 2/2010 |
| JP | 08-234683 A | 9/1996 |
| JP | 09-329806 A | 12/1997 |
| JP | 10-214060 A | 8/1998 |
| JP | 11-282419 A | 10/1999 |
| JP | 2000-40924 A | 2/2000 |
| JP | 2000-56847 A | 2/2000 |
| JP | 2000-081920 A | 3/2000 |
| JP | 2000-138572 A | 5/2000 |
| JP | 2000-221942 A | 8/2000 |
| JP | 2000-267164 A | 9/2000 |
| JP | 2001-042826 A | 2/2001 |
| JP | 2001-147659 A | 5/2001 |
| JP | 2001-324958 A | 11/2001 |
| JP | 2002-358049 A | 12/2002 |
| JP | 2003-022049 A | 1/2003 |
| JP | 2003-022050 A | 1/2003 |
| JP | 2003-076327 A | 3/2003 |
| JP | 2003-099001 A | 4/2003 |
| JP | 2003-108065 A | 4/2003 |
| JP | 2003-108066 A | 4/2003 |
| JP | 2003-114644 A | 4/2003 |
| JP | 2003-150109 A | 5/2003 |
| JP | 2003-177712 A | 6/2003 |
| JP | 2003-288055 A | 10/2003 |
| JP | 2004-029755 A | 1/2004 |
| JP | 2004-145241 A | 5/2004 |
| JP | 2009-169442 A | 7/2009 |
| WO | 99/65012 A1 | 12/1999 |
| WO | 01/06484 A1 | 1/2001 |
| WO | 03/034381 A1 | 4/2003 |

OTHER PUBLICATIONS

Baldo et al.; "Very high-efficiency green organic light-emitting devices based on electrophosphorescence"; Applied Physics Letters, vol. 75, No. 1; pp. 4-6; Jul. 5, 1999.

I.M. Hunter et al.; "Active Matrix Addressing of Polymer Light Emitting Diodes Using Low Temperature Poly Silicon TFTs"; AM-LCD 2000; pp. 249-252; 2000.

R.M.A. Dawson et al.; "The Impact of the Transient Response of Organic Light Emitting Diodes on the Design of Active Matrix OLED Displays"; IEDM 98; pp. 875-878; 1998.

R.M.A. Dawson et al.; "A Poly-Si Active-Matrix OLED Display with Integrated Drivers"; SID 99 Digest; pp. 438-441; 1999.

R.M.A. Dawson et al.; "Design of an Improved Pixel for a Polysilicon Active-Matrix Organic LED Display"; SID 98 Digest; pp. 11-14; 1998.

M. Kimura et al.; "Low-Temperature Poly-Si TFT Display Using Light-Emitting-Polymer"; AM-LCD 2000; pp. 245-248; 2000.

Sedra & Smith; "6.7 MOS Differential Amplifiers"; Micro-Electronics Circuits; pp. 447-456; 1991.

Sung Joon Bae et al.; "A Novel Pixel Design for an Active Matrix Organic Light Emitting Diode Display"; SID 2000 Digest; pp. 358-361; 2000.

Tsutsui et al.; "High Quantum Efficiency in Organic Light-Emitting Devices with Iridium-Complex as a Triplet Emissive Center"; Japan Journal of Applied Physics, vol. 38, Part 2, No. 12B; pp. L1502-L1504; Dec. 15, 1999.

Yumoto et al.; "Pixel-Driving Methods for Large-Sized Poly-Si AM-OLED Displays"; Asia Display / IDW '01; pp. 1395-1398; 2001.

Office Action (Chinese Application No. 02142123.4), dated Dec. 29, 2006 with English translation.

* cited by examiner

Fig. 3    structure 4

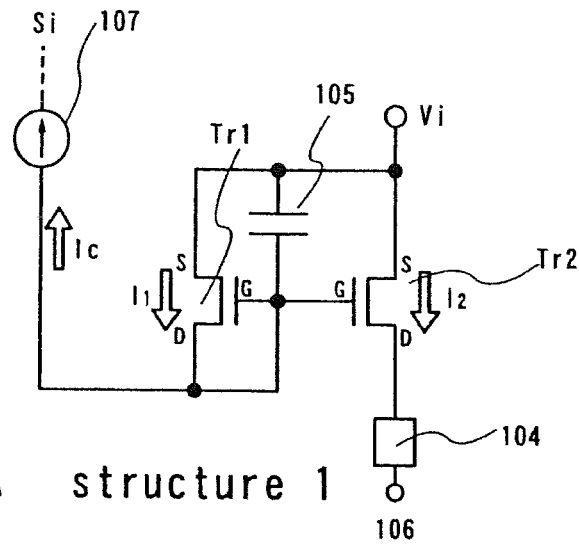
Fig. 5A  structure 1
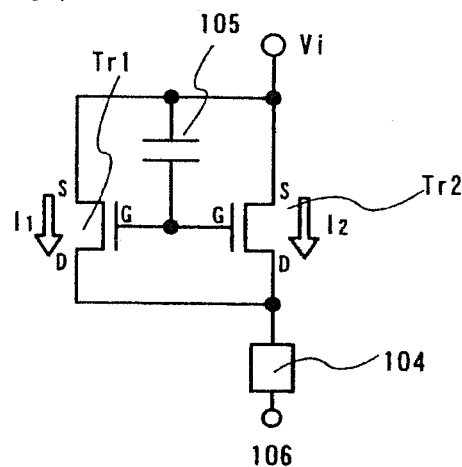
Fig. 5B  structure 1

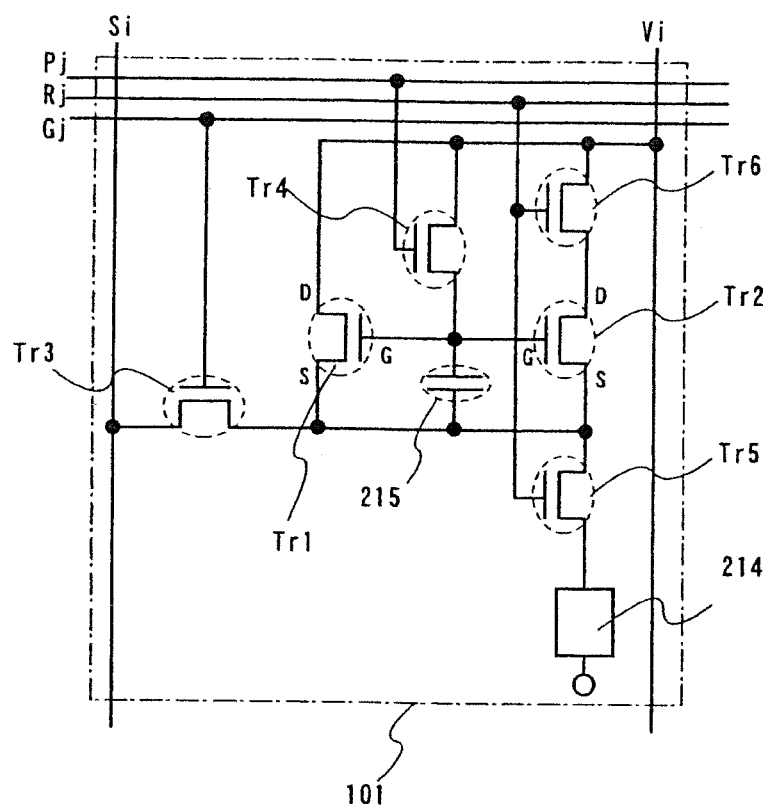
Fig. 6  structure 2 writing period Ta
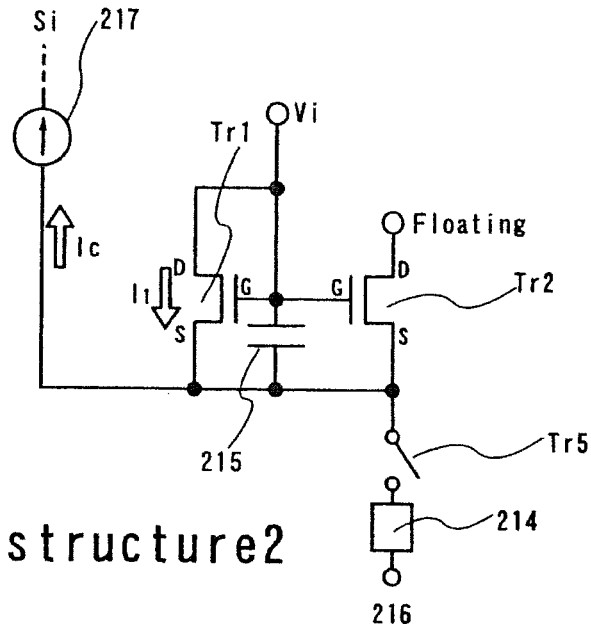
Fig. 7A structure2
display period Td
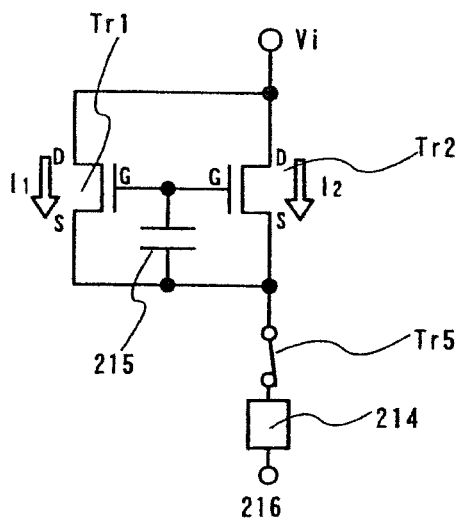
Fig. 7B structure2

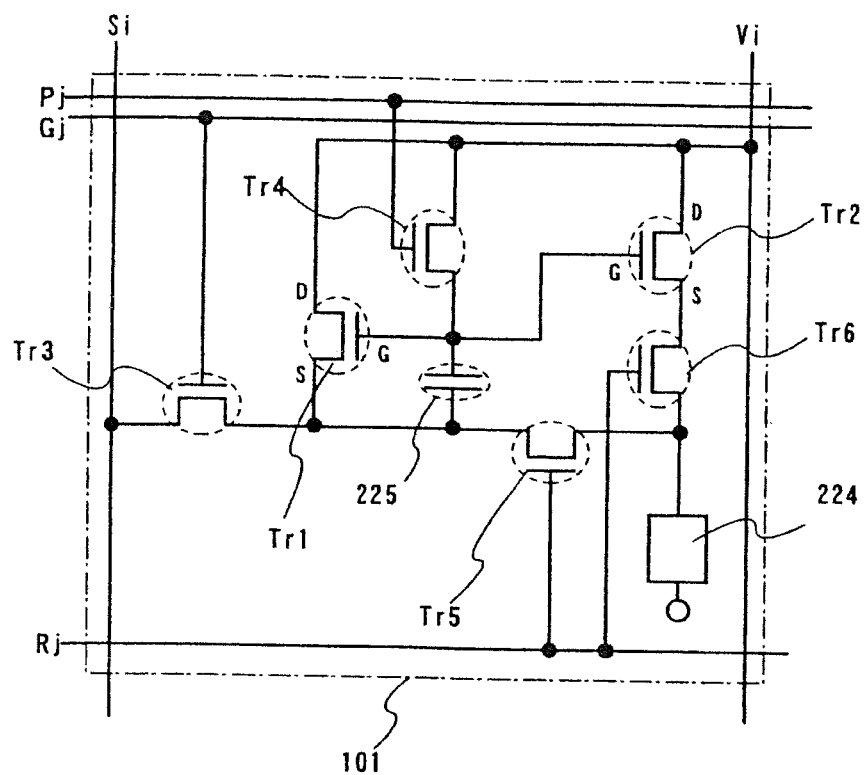
Fig. 8  structure 3

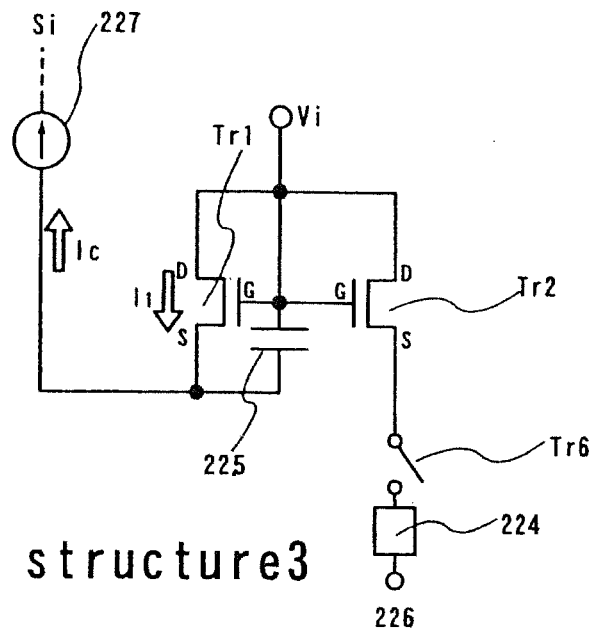
Fig. 9A structure3
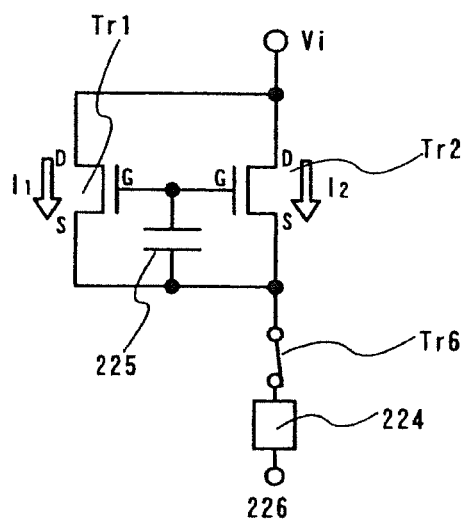
Fig. 9B structure3

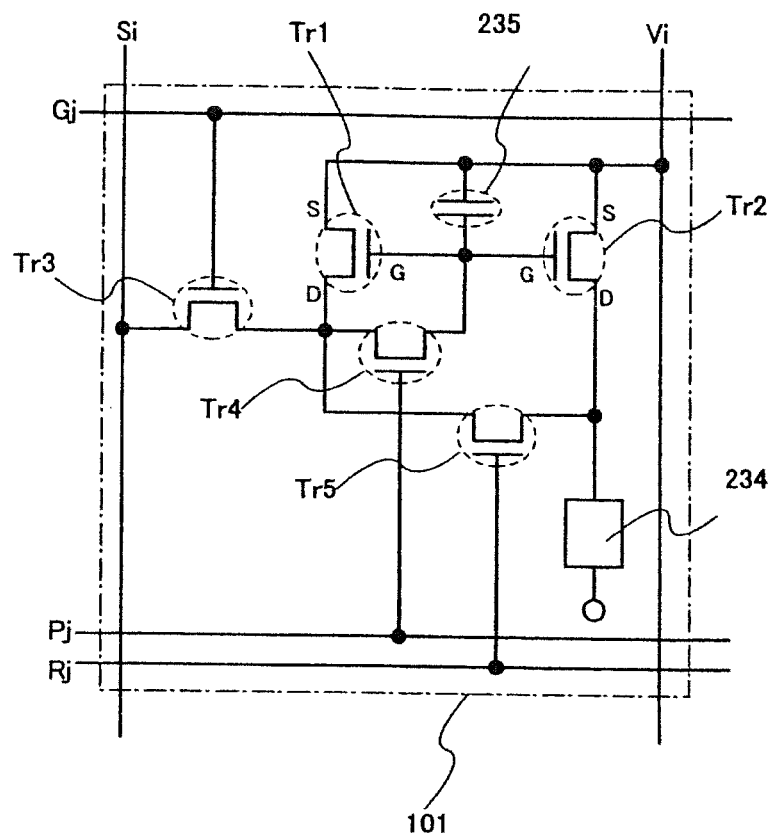
Fig. 10  Structure 1

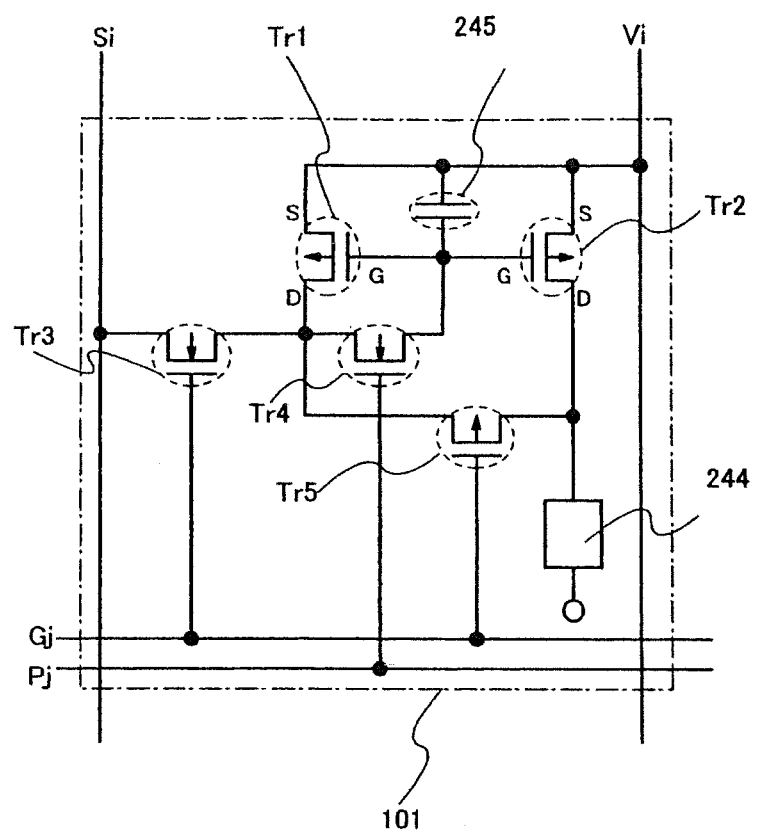
Fig. 11  Structure 5

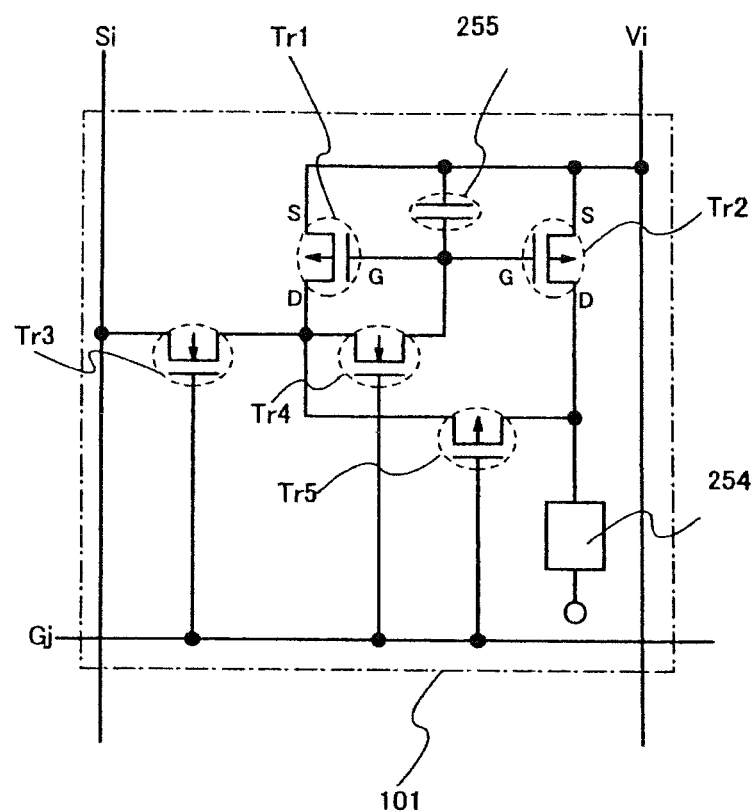
Fig. 12  structure 6

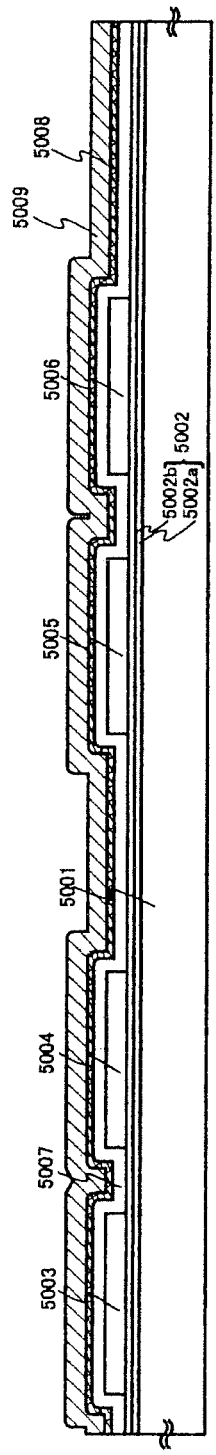
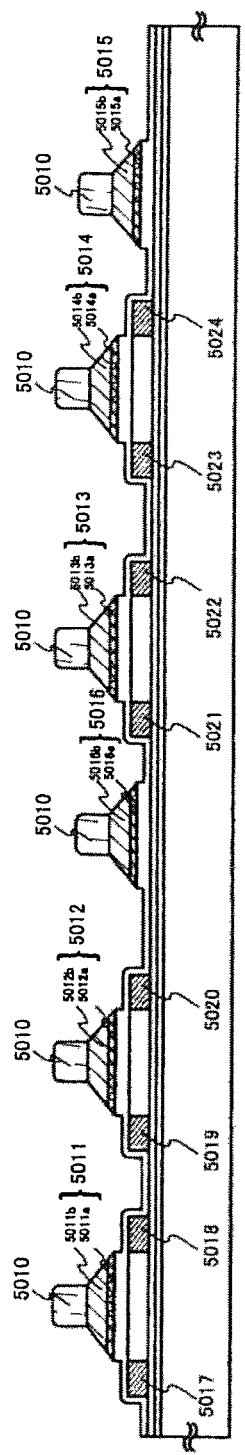
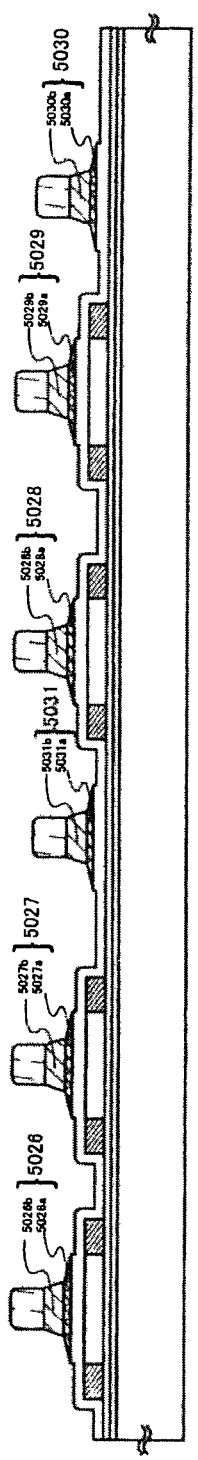
Fig. 13A
Fig. 13B
Fig. 13C

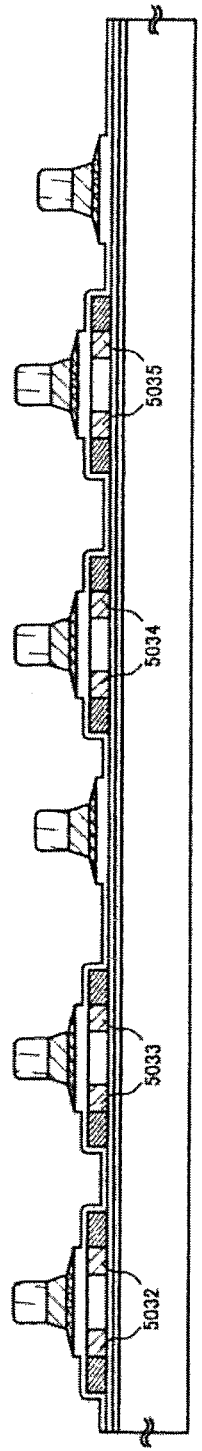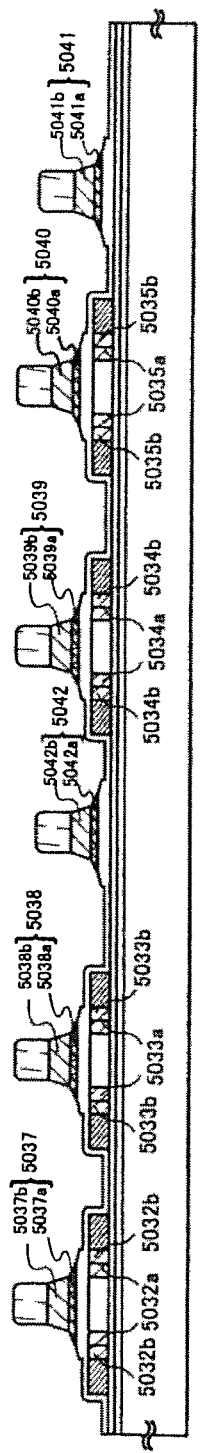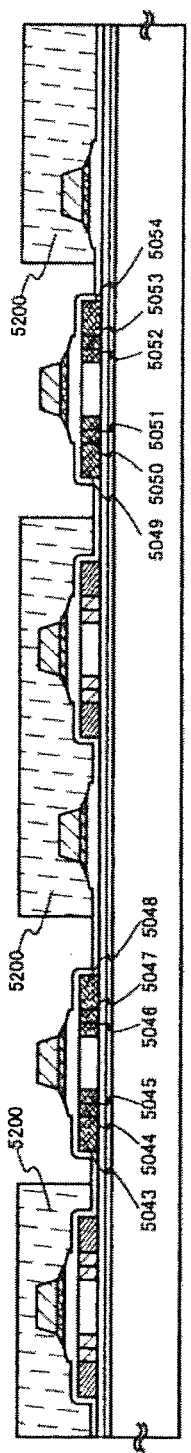

writing period Ta display period Td writing preiod Ta display period Td writing period Ta display period Td writing period Ta display period Td

LIGHT EMITTING DEVICE, METHOD OF DRIVING A LIGHT EMITTING DEVICE, ELEMENT SUBSTRATE, AND ELECTRONIC EQUIPMENT

CROSS-REFERENCE TO RELATED APPLICATIONS

This application is a continuation of U.S. application Ser. No. 12/190,333, filed Aug. 12, 2008, now allowed, which is continuation of U.S. application Ser. No. 11/382,085, filed May 8, 2006, now U.S. Pat. No. 7,411,586, which is a continuation of U.S. application Ser. No. 10/230,068, filed Aug. 29, 2002, now U.S. Pat. No. 7,046,240, which claims the benefit of a foreign priority application filed in Japan as Serial No. 2001-258936 on Aug. 29, 2001, all of which are incorporated by reference.

BACKGROUND OF THE INVENTION

1. Field of the Invention

The present invention relates to a light emitting panel in which a light emitting element formed on a substrate is enclosed between the substrate and a cover member. Also, the present invention relates to a light emitting module in which an IC or the like is mounted on the light emitting panel. Note that, in this specification, the light emitting panel and the light emitting module are generically called light emitting devices. The present invention further relates to a method of driving the light emitting device and an electronic appliance using the light emitting device. Moreover, present invention relates to an element substrate corresponding to one mode before the light emitting element is completed in the step of manufacturing the light emitting device, wherein said element substrate includes means for providing electric current to the light emitting element in a plurality of pixels, respectively.

2. Description of the Related Art

An light emitting element emits light by itself, and thus, has high visibility. The light emitting element does not need a backlight necessary for a liquid crystal display device (LCD), which is suitable for a reduction of a light emitting device in thickness. Also, the light emitting element has no limitation on a viewing angle. Therefore, the light emitting device using the light emitting element has recently been attracting attention as a display device that substitutes for a CRT or the LCD.

Incidentally, the light emitting element means an element of which a luminance is controlled by electric current or voltage in this specification. The light emitting element includes an OLED (organic light emitting diode), an MIM type electron source element (electron emitting elements) used to a FED (field emission display) and the like.

The OLED includes a layer containing an organic compound in which luminescence generated by application of an electric field (electroluminescence) is obtained (organic light emitting material) (hereinafter, referred to as organic light emitting layer), an anode layer and a cathode layer. A light emission in returning to a base state from a singlet excitation state (fluorescence) and a light emission in returning to a base state from a triplet excitation state (phosphorescence) exist as the luminescence in the organic compound. The light emitting device of the present invention may use one or both of the above-described light emissions.

Note that, in this specification, all the layers provided between an anode and a cathode of the OLED are defined as the organic light emitting layers. The organic light emitting layers specifically include a light emitting layer, a hole injecting layer, an electron injecting layer, a hole transporting layer, an electron transporting layer and the like. The OLED basically has a structure in which an anode, a light emitting layer, a cathode are laminated in order. Besides this structure, the OLED may take a structure in which an anode, a hole injecting layer, a light emitting layer, a cathode are laminated in order or a structure in which an anode, a hole injecting layer, a light emitting layer, an electron transporting layer, a cathode are laminated in order. These layers may have an inorganic compound therein.

FIG. 25 shows the structure of a pixel in a general light emitting device. The pixel shown in FIG. 25 has TFTs 50 and 51, a storage capacitor 52, and a light emitting element 53.

A gate of the TFT 50 is connected to a scanning line 55. The TFT 50 has a source and a drain one of which is connected to a signal line 54 and the other of which is connected to a gate of the TFT 51. The TFT 51 has a source connected to a power supply 56 and has a drain connected to an anode of the light emitting element 53. A cathode of the light emitting element 53 is connected to power supply 57. The storage capacitor 52 is provided to hold the voltage between the gate and source of the TFT 51.

When the TFT 50 is turned ON by the voltage of the scanning line 55, a video signal inputted to the signal line 54 is inputted to the gate of the TFT 51. Upon input of the video signal, the gate voltage (voltage difference between the gate and the source) of the TFT 51 is determined in accordance with the voltage of the video signal inputted. The gate voltage causes a drain current to flow in the TFT 51 and the drain current is supplied to the light emitting element 53, which emits light upon receiving the current.

TFTs formed of polysilicon are higher in field effect mobility and larger in ON current than TFTs formed of amorphous silicon. Therefore TFTs formed of polysilicon are more suitable as transistors for light emitting element panels.

However, electric characteristics of polysilicon TFTs are far behind the electric characteristics of MOS transistors that are formed on single crystal silicon substrates. For example, the field effect mobility of polysilicon TFTs is ¹/₁₀ or less of the field effect mobility of single crystal silicon TFTs. Furthermore, polysilicon TFTs are easily fluctuated in characteristics because of defects in grain boundaries.

In the case where pixels are structured as shown in FIG. 25, if the threshold, ON current, and other characteristics of the TFT 51 fluctuate from one pixel to another, the amount of drain current of the TFT 51 varies between pixels despite the voltage of the video signal being the same. This leads to fluctuation in luminance of the light emitting element 53.

To avoid the problem described above, various kinds of current input type pixel structures have been devised which can control the amount of current flowing into a light emitting element without being influenced by characteristics of TFTs. Two examples of typical current input type pixel will be given below to describe their structures.

The structure of a current input type pixel disclosed in JP 2001-147659 A is described first with reference to FIG. 26A.

The pixel shown in FIG. 26A has TFTs 11, 12, 13, and 14, a storage capacitor 15, and a light emitting element 16.

A gate of the TFT 11 is connected to a terminal 18. The TFT 11 has a source and a drain one of which is connected to a current source 17 and the other of which is connected to a drain of the TFT 13. A gate of the TFT 12 is connected to a terminal 19. The TFT 12 has a source and a drain one of which is connected to the drain of the TFT 13 and the other of which is connected to a gate of the TFT 13. The TFT 13 and the TFT 14 are connected to each other at their gates. Sources of the TFTs 13 and 14 are both connected to a terminal 20. A drain of the TFT 14 is connected to an anode of the light emitting element 16. A cathode of the light emitting element 16 is connected to a terminal 21. The storage capacitor 15 is provided to hold the voltage between the gate and source of the TFTs 13 and 14. Given voltages are applied to the terminals 20 and 21 from a power supply, and the voltage of the terminal 20 is different from the voltage of the terminal 21.

After the TFTs 11 and 12 are turned ON by the voltages applied to the terminals 18 and 19, the drain current of the TFT 13 is controlled by the current source 17. Since the gate and drain of the TFT 13 are connected to each other, the TFT 13 operates in a saturation region and the drain current of the TFT 13 is expressed by the following Expression 1. $V_{GS}$ represents the gate voltage; $\mu$, the mobility; $C_o$, the gate capacity per unit area; W/L, the ratio of a channel width W of a channel formation region to a channel length L; $V_{TH}$, the threshold; and I, the drain current.

$$I = \mu C_o W/L (V_{GS} - V_{TH})^2 / 2 \qquad \text{[Expression 1]}$$

In Expression 1, $\mu$, $C_o$, W/L, and $V_{TH}$ are fixed values unique to each transistor. It is understood from Expression 1 that the drain current of the TFT 13 is changed by the gate voltage $V_{GS}$. According to Expression 1, the level of gate voltage $V_{GS}$ generated in the TFT 13 is determined by the drain current.

At this point, the gate voltage of the TFT 14 is kept at the same level as the gate voltage of the TFT 13 because the gate and source of the TFTs 13 and 14 are connected to each other.

Therefore, the drain current of the TFT 13 and the drain current of the TFT 14 are in proportion to each other. If $\mu$, $C_o$, W/L, and $V_{TH}$ of the TFT 13 are identical with those of the TFT 14, the TFTs 13 and 14 have the same amount of drain current. The drain current flowing in the TFT 14 is supplied to the light emitting element 16, which emits light at a luminance according to the amount of the supplied drain current.

The light emitting element 16 continues to emit light even after the TFTs 11 and 12 are turned OFF by the voltages applied to the terminals 18 and 19, as long as the gate voltage of the TFT 14 is held by the storage capacitor 15.

As described above, the pixel shown in FIG. 26A has means for converting a current supplied to the pixel into a voltage to hold the voltage and means for causing a current to flow to the light emitting element in an amount according to the voltage held. FIG. 27A is a block diagram showing a relation between the means of the pixel of FIG. 26A and the light emitting element of the pixel. A pixel 80 has a converting unit 81 for converting a current supplied to the pixel into a voltage to hold the voltage, a driving unit 82 for causing a current to flow to a light emitting element in an amount according to the voltage held, and a light emitting element 83. The current supplied to the pixel 80 is converted into a voltage in the converting unit 81, and the voltage is given to the driving unit 82. The driving unit 82 supplies a current to the light emitting element 83 in an amount according to the voltage given.

Specifically, the TFT 12, the TFT 13, and the storage capacitor 15 in FIG. 26A correspond to the means for converting a supplied current into a voltage to hold the voltage. The TFT 14 corresponds to the means for causing a current to flow to the light emitting device in an amount according to the voltage held.

Described next with reference to FIG. 26B is the structure of a current input type pixel disclosed in Tech. Digest IEDM 98, 875, by R. M. A. Dawson etc. The pixel shown in FIG. 26B has TFTs 31, 32, 33, and 34, a storage capacitor 35, and a light emitting element 36.

A gate of the TFT 31 is connected to a terminal 38. The TFT 31 has a source and a drain one of which is connected to a current source 37 and the other of which is connected to a source of the TFT 33. A gate of the TFT 34 is connected to the terminal 38. The TFT 34 has a source and a drain one of which is connected to a gate of the TFT 33 and the other of which is connected to a drain of the TFT 33. A gate of the TFT 32 is connected to a terminal 39. The TFT 32 has a source and a drain one of which is connected to a terminal 40 and the other of which is connected to a source of the TFT 33. The drain of the TFT 34 is connected to an anode of the light emitting element 36. A cathode of the light emitting element 36 is connected to a terminal 41. The storage capacitor 35 is provided to hold the voltage between the gate and source of the TFT 33. Given voltages are applied to the terminals 40 and 41 from a power supply and the voltage of the terminal 40 is different from the voltage of the terminal 41.

After the TFTs 31 and 34 are turned ON by the voltage applied to the terminal 38 and the TFT 32 is turned OFF by the voltage applied to the terminal 39, the drain current of the TFT 33 is controlled by the current source 37. Since the gate and drain of the TFT 33 are connected to each other, the TFT 33 operates in a saturation region and the drain current of the TFT 33 is expressed by the above-mentioned Expression 1. It is understood from Expression 1 that the drain current of the TFT 33 is changed by the gate voltage $V_{GS}$.

According to Expression 1, the level of gate voltage $V_{GS}$ generated in the TFT 33 is determined by the drain current.

The drain current flowing in the TFT 33 is supplied to the light emitting element 36, which emits light at a luminance according to the amount of the supplied drain current.

After the TFTs 31 and 34 are turned OFF by the voltage applied to the terminal 38, the TFT 32 is turned ON by the voltage applied to the terminal 39. The light emitting element 36 continues to emit light at the same luminance as the luminance of light emitted while the TFTs 31 and 34 are ON as long as the gate voltage of the TFT 33 is held by the storage capacitor 35.

As described above, the pixel shown in FIG. 26B has means for converting a current supplied to the pixel into a voltage to hold the voltage and for causing a current to flow to the light emitting element in an amount according to the voltage held. In short, the functions of the two means of the pixel in FIG. 26A are home by one means in the pixel of FIG. 26B. FIG. 27B is a block diagram showing a relation between the means of the pixel of FIG. 26B and the light emitting element of the pixel. In FIG. 27B, one means carries out the function of the converting unit and the function of the driving unit; a current supplied to a pixel 85 is converted into a voltage in means 86 that is a converting unit and at the same time a driving unit, and then the means supplies a current to a light emitting element 87 in an amount according to the voltage converted.

Specifically, the TFT 33, the TFT 34, and the storage capacitor 35 in FIG. 26B correspond to the means for converting a current supplied to the pixel into a voltage to hold the voltage and for causing a current to flow to the light emitting element in an amount according to the voltage held.

When pixels are structured as shown in FIG. 26A or 26B, the amount of current flowing into a light emitting element can be controlled by a current source even if TFT characteristics such as threshold and ON current fluctuate between pixels. Therefore it is possible to prevent fluctuation in luminance of light emitting element between pixels.

In general, lowering of luminance due to degradation of an organic light emitting material is smaller in a light emitting element that emits light with the current between electrodes kept constant than in a light emitting element that emits light with the voltage between electrodes kept constant. In the case of the two current input type pixels illustrated in FIGS. 26A and 26B, the amount of current flowing into a light emitting element can always be kept at a desired value without being influenced by degradation of an organic light emitting material. Accordingly, lowering of luminance due to degradation of organic light emitting element in the pixels of FIGS. 26A and 26B is smaller than in the voltage input type pixel of FIG. 25 where the TFT 51 operates in a linear range.

The luminance of light emitting element and the amount of current flowing in an organic light emitting layer are in proportion to each other. In a current input type light emitting device, the amount of current flowing into a light emitting element can be kept constant regardless of change in organic light emitting element temperature by the outside temperature and by heat generated from the light emitting panel itself. This type of light emitting device therefore can reduce change in luminance of light emitting element and can prevent an increase in current consumption due to a temperature rise.

However, the two pixels of FIGS. 26A and 26B also have problems.

In a pixel that has two means, one for converting a current supplied to the pixel into a voltage to hold the voltage and one for causing a current to flow to a light emitting element in an amount according to the voltage held, as typified in FIG. 26A, characteristic balance between the two means may be lost if characteristics of one of the two means are changed for some reason. Then the amount of current supplied to the light emitting element from the driving unit cannot be kept at a desired value any longer, thereby causing fluctuation in luminance of light emitting element between pixels.

Specifically, when $\mu$, $C_o$, $V_{TH}$, and W/L that are characteristics unique to each TFT are deviated in the TFT 13 or 14 in FIG. 26A, the ratio of drain current of the TFT 13 to drain current of the TFT 14 varies from one pixel to another and the luminance of light emitting element fluctuates between pixels.

On the other hand, in a pixel that has means for converting a current supplied to the pixel into a voltage to hold the voltage and for causing a current to flow to a light emitting element in an amount according to the voltage held as typified in FIG. 26B, a current flows to a light emitting element when a current supplied to the pixel is converted into a voltage. The light emitting element has a relatively large capacitor. For that reason, when display is to be changed from low gray scale to high gray scale, for example, the value of voltage converted from current is not stabilized until electric charges are accumulated in the capacitor of the light emitting element. Therefore the change from low gray scale to high gray scale takes long. On the other hand, when display is to be changed from high gray scale to low gray scale, the value of voltage converted from current is not stabilized until electric charges are discharged from the capacitor of the light emitting element. Therefore the change from high gray scale to low gray scale takes long.

To be specific, it takes time for gate voltage of the TFT 33 to gain stability when the amount of current supplied from the current source 37 is changed in FIG. 26B. A time required to write the current is therefore long to bring undesirable results such as after image recognized in animation display. This cancels out a characteristic of light emitting element, suitability for animation display because of its fast response.

SUMMARY OF THE INVENTION

The present invention has been made in view of the above, and an object of the present invention is therefore to provide a current drive type light emitting device in which fluctuation in luminance of light emitting element between pixels due to difference in TFT characteristics is reduced and after image is hardly recognized.

A light emitting device of a first structure of the present invention has, in a pixel, first means for converting a current supplied to the pixel into a voltage to hold the voltage and for causing a current to flow to a light emitting element in an amount according to the voltage, and second means for causing a current to flow to the light emitting element in an amount according to the voltage held by the first means.

FIG. 1 is a block diagram showing a relation between means of a pixel of a first structure according to the present invention and a light emitting element of the pixel. A pixel 90 of the present invention has first means 91, which converts a current supplied to the pixel 90 into a voltage to hold the voltage and which flows a current to a light emitting element 93 of the pixel 90 in an amount according to the voltage held. In short, the first means 91 is a converting unit and at the same time a driving unit. Hereinafter a driving unit of the first means 91 is called a driving unit A. The pixel 90 also has second means 92, which flows a current to the light emitting element 93 in an amount according to the level of the voltage converted and held by the first means. A driving unit of the second means 92 will be called a driving unit B in the following description.

In the pixel of the first structure of the present invention, a current $I_1$ from the first means 91 that is the converting unit as well as the driving unit A and a current $I_2$ from the second means 92 that is the driving unit B are both supplied to the light emitting element 93. The luminance of the light emitting element 93 is determined by the sum amount of the current $I_1$ and current $I_2$.

As in the pixel shown in FIG. 27A, characteristic balance between the first means and the second means of the pixel of the first structure of the present invention could be lost to make it impossible to keep the amount of current $I_2$ supplied from the driving unit B to the light emitting element at a desired value when characteristics of one of the two means are changed. However, the amount of current $I_1$ supplied to the light emitting element 93 from the first means 91 that is the converting unit as well as the driving unit A is kept at a desired value without being influenced by a characteristic change. Since the light emitting element is supplied with the sum amount of current $I_1$ and current $I_2$, fluctuation in amount of current supplied to the light emitting element due to a characteristic change can be reduced to about half the fluctuation of the pixel shown in FIG. 27A. Therefore the fluctuation in luminance between pixels can be reduced in the present invention.

A light emitting device of a second structure of the present invention has in a pixel first means for converting a current supplied to the pixel into a voltage to hold the voltage and second means for causing a current to flow to a light emitting element in an amount according to the voltage held.

FIG. 36 is a block diagram showing a relation between means of a pixel of the second structure according to the present invention and a light emitting element of the pixel. A pixel 60 of the present invention has first means 61, which converts a current supplied to the pixel 60 into a voltage to hold the voltage. Hereinafter the converting unit that is the first means 61 is called a converting unit A. The pixel 60 also has second means 62, which converts a current supplied to the pixel 60 into a voltage to hold the voltage and which flows a current to a light emitting element 63 in an amount according to the voltage held. In short, the second means 62 is a converting unit and at the same time a driving unit. The converting unit of the second means 92 will be called a converting unit B in the following description.

In the pixel of the second structure of the present invention, a current supplied to the pixel is converted into a voltage in the first means and the second means both and a current $I_2$ is supplied to the light emitting element 63 from the driving unit of the second means in an amount according to this voltage. The luminance of the light emitting element 63 is determined by the current $I_2$.

As in the pixel shown in FIG. 27A, characteristic balance between the first means and the second means of the pixel of the second structure of the present invention could be lost to make it impossible to keep the amount of current $I_2$ supplied from the driving unit to the light emitting element at a desired value when characteristics of one of the two means are changed. However, the converted voltage is averaged by using the two converting units A and B. Since the current $I_2$ supplied from the driving unit to the light emitting element is in an amount according to the averaged voltage, fluctuation in amount of current supplied to the light emitting element due to a characteristic change can be reduced to about half the fluctuation of the pixel shown in FIG. 27A. Therefore the fluctuation in luminance between pixels can be reduced in the present invention. Furthermore, the current supplied to the pixel is larger than the current $I_2$ and therefore time required to write the current can be shortened.

It is sufficient for an element substrate, which is a mode of a light emitting element before the light emitting element is completed, to have the first means and second means described above in each pixel. To be specific, the element substrate can be any one of the modes before completion of light emitting element, and may be at a stage where a pixel electrode alone out of the components of the light emitting element is formed or may be at a stage where a conductive film to serve as a pixel electrode is formed but not patterned yet to form the pixel electrode.

In a pixel having the first or second structure of the present invention described above, a current supplied to the pixel does not flow into its light emitting element when the current supplied to the pixel is converted into a voltage by the first means. Therefore the time required to stabilize the voltage converted from the supplied current is not influenced by a capacitor of the light emitting element. Compared to the pixel shown in FIG. 27B, a pixel of the present invention is quicker in stabilizing the voltage converted from the supplied current and therefore a current can be written in a shorter period of time and after image is prevented from being recognized in animation display.

A light emitting device of the present invention also has the advantage of conventional current input type light emitting devices; the fluctuation in luminance of light emitting element between pixels is smaller in the present invention than in voltage input type light emitting devices when TFT characteristics vary from one pixel to another. In addition, lowering of luminance due to degradation of light emitting element is smaller in the present invention than in the voltage input type pixel of FIG. 25 where the TFT 51 operates in a linear range. Furthermore the present invention can reduce change in luminance of light emitting element regardless of change in organic light emitting layer temperature by the outside temperature and by heat generated from the light emitting panel itself, and can prevent an increase in current consumption accompanying a temperature rise.

BRIEF DESCRIPTION OF THE DRAWINGS

In the accompanying drawings:
FIGS. 5A and 5B are schematic diagrams of a pixel being driven;
FIG. 6 is a circuit diagram of a pixel in a light emitting device of the present invention;
FIGS. 7A and 7B are schematic diagrams of a pixel being driven;
FIG. 8 is a circuit diagram of a pixel in a light emitting device of the present invention;
FIGS. 9A and 9B are schematic diagrams of a pixel being driven;
FIG. 10 is a circuit diagram of a pixel in a light emitting device of the present invention;
FIG. 11 is a circuit diagram of a pixel in a light emitting device of the present invention;
FIG. 12 is a circuit diagram of a pixel in a light emitting device of the present invention;
FIGS. 13A to 13C are diagrams showing a method of manufacturing a light emitting device in accordance with the present invention;
FIGS. 14A to 14C are diagrams showing a method of manufacturing a light emitting device in accordance with the present invention.

DETAILED DESCRIPTION OF THE PREFERRED EMBODIMENTS

Embodiment Mode 1

Figure 1:
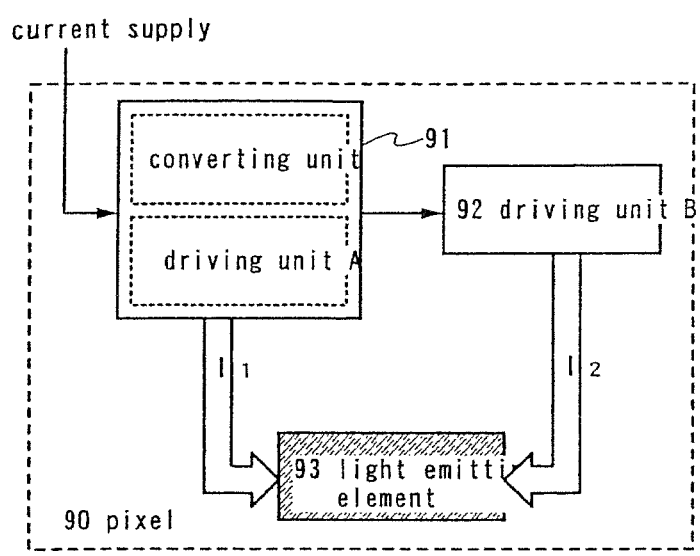
FIG. 1 is a block diagram of a current input type pixel of the present invention.
Figure 2:
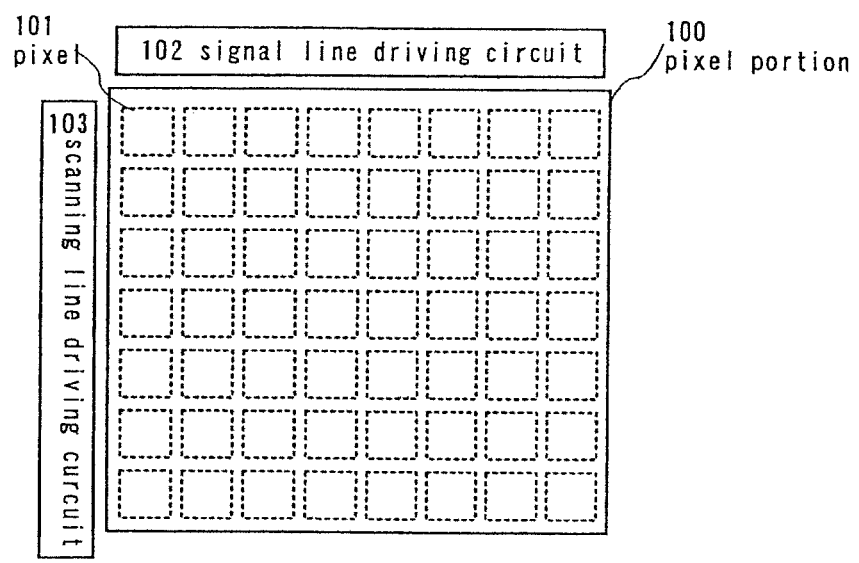
FIG. 2 is a block diagram showing a top view of a light emitting device of the present invention.

FIG. 2 is a block diagram showing the structure of a light emitting panel of the present invention. Denoted by 100 is a pixel portion in which a plurality of pixels form a matrix pattern. Each pixel is denoted by 101. 102 denotes a signal line driving circuit and 103 denotes a scanning line driving circuit.

In FIG. 2, the signal line driving circuit 102 and the scanning line driving circuit 103 are formed on the same substrate where the pixel portion 100 is formed. However, the present invention is not limited thereto. The signal line driving circuit 102 and the scanning line driving circuit 103 may be formed on a substrate different from the one on which the pixel portion 100 is formed, and may be connected to the pixel portion 100 through a connector such as an FPC. The device in FIG. 2 has one signal line driving circuit 102 and one scanning line driving circuit 103. However, the present invention is not limited thereto and the number of signal line driving circuit 102 and the number of scanning line driving circuit 103 can be set at designer's discretion.

In this specification, connection means electric connection unless otherwise stated.

Though not shown in FIG. 2, the pixel portion 100 has signal lines S1 to Sx, power supply lines V1 to Vx, first scanning lines G1 to Gy, second scanning lines P1 to Py, and third scanning lines R1 to Ry. The number of signal lines and the number of power supply lines may not always match. The number of first scanning lines, the number of second scanning lines, and the number of third scanning lines may not always match. The pixel portion does not necessarily have all of those wiring lines, or may have different wiring lines in addition to those wiring lines.

The power supply lines V1 to Vx are kept at a given voltage. The structure shown in FIG. 2 is of a light emitting device that displays a monochrome image. However, a light emitting device of the present invention may also be one that displays a color image. In this case, not all of the power supply lines V1 to Vx are kept at the same level of voltage and the voltage of a power supply line for one color differs from the voltage of a power supply line for another color.

In this specification, the term voltage means an electric potential difference from the ground unless otherwise stated.

Figure 3:
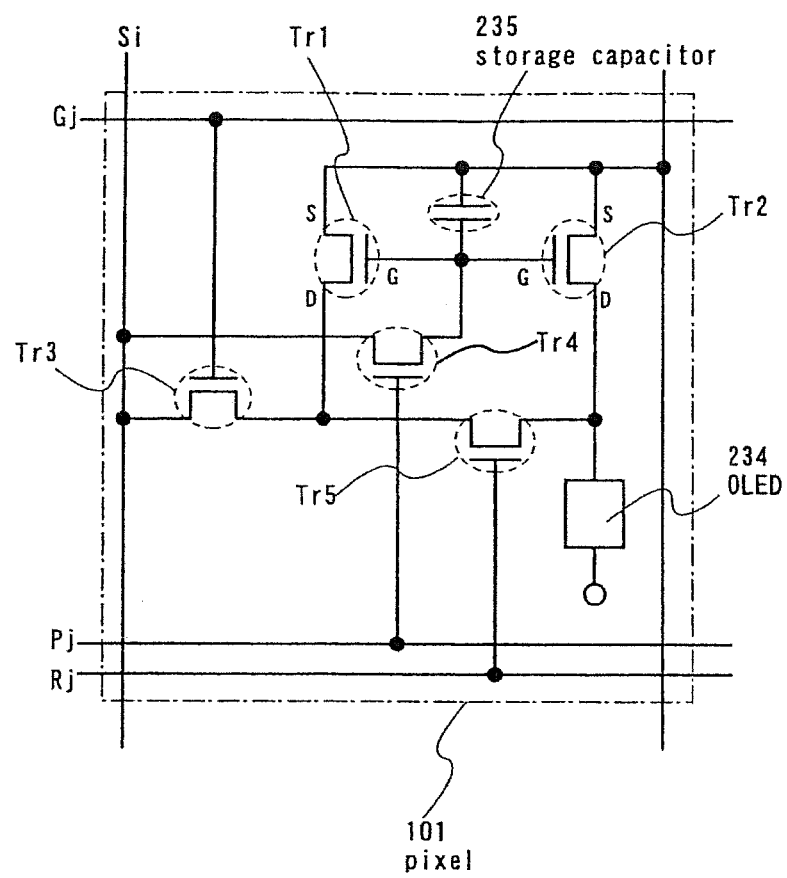
FIG. 3 is a circuit diagram of a pixel in a light emitting device of the present invention.

FIG. 3 shows a detailed structure of the pixel 101 in FIG. 2. The pixel 101 shown in FIG. 3 has a signal line Si (one of S1 to Sx), a first scanning line Gj (one of G1 to Gy), a second scanning line Pj (one of P1 to Py), a third scanning line Rj (one of R1 to Ry), and a power supply line Vi (one of V1 to Vx).

The pixel 101 also has a transistor Tr1, a transistor Tr2, a transistor Tr3, a transistor Tr4, a transistor Tr5, a light emitting element 104, and a storage capacitor 105. The storage capacitor 105 is provided to hold the voltage between a gate and source of the transistors Tr1 and Tr2 (gate voltage) more securely, but it is not always necessary.

A gate of the transistor Tr3 is connected to the first scanning line Gj. The transistor Tr3 has a source and a drain one of which is connected to the signal line Si and the other of which is connected to a drain of the transistor Tr1.

In this specification, a voltage given to a source of an n-channel transistor is lower than a voltage given to its drain. A voltage given to a source of a p-channel transistor is higher than a voltage given to its drain.

A gate of the transistor Tr4 is connected to the second scanning line Pj. The transistor Tr4 has a source and a drain one of which is connected to the signal line Si and the other of which is connected to the gate of the transistor Tr1 and to the gate of the transistor Tr2.

A gate of the transistor Tr5 is connected to the third scanning line Rj. The transistor Tr5 has a source and a drain one of which is connected to the drain of the transistor Tr1 and the other of which is connected to a drain of the transistor Tr2.

The gates of the transistors Tr1 and Tr2 are connected to each other. Sources of the transistors Tr1 and Tr2 are both connected to the power supply line Vi. The drain of the transistor Tr2 is connected to a pixel electrode of the light emitting element 104.

The storage capacitor 105 has two electrodes one of which is connected to the gates of the transistors Tr1 and Tr2 and the other of which is connected to the power supply line Vi.

The light emitting element 104 has an anode and a cathode. In this specification, a cathode is called an opposite electrode if an anode serves as a pixel electrode and, if a cathode serves as a pixel electrode, an anode is called an opposite electrode.

The voltage of the power supply line Vi (power supply voltage) is kept at a constant level. The voltage of the opposite electrode is also kept at a constant level.

The transistors Tr1 and Tr2 each may be an n-channel transistor or a p-channel transistor. However, the transistors Tr1 and Tr2 have to have the same polarity. When the anode serves as a pixel electrode and the cathode is used as an opposite electrode, the transistors Tr1 and Tr2 are desirably p-channel transistors. On the other hand, when the anode serves as an opposite electrode and the cathode is used as a pixel electrode, the transistors Tr1 and Tr2 are desirably n-channel transistors.

The transistor Tr3 may be an n-channel transistor or a p-channel transistor, and the same applies to the transistors Tr4 and Tr5.

Figure 4:
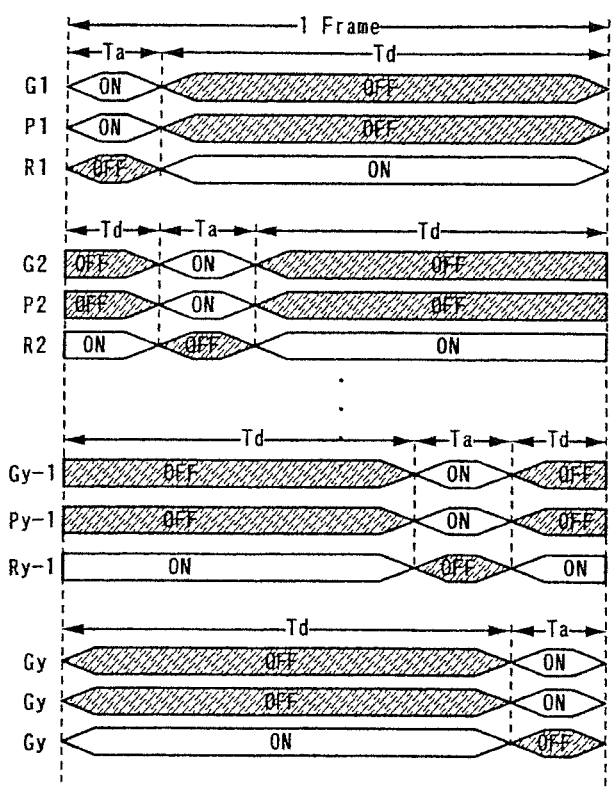
FIG. 4 is a timing chart of signals inputted to scanning lines.

Next, a description is given on the operation of the light emitting device of this embodiment mode with reference to FIG. 4 and FIGS. 5A and 5B. The description on the operation of the light emitting device having the first structure of the present invention is divided into one for a writing period Ta and one for a display period Td for pixels on each line. FIG. 4 is a timing chart of the first to third scanning lines. In the timing chart, a period in which a scanning line is selected, in other words, a period in which every transistor whose gate is connected to the selected scanning line is turned ON is indicated by ON. On the contrary, a period in which a scanning line is not selected, in other words, a period in which every transistor whose gate is connected to the scanning line is turned OFF is indicated by OFF. FIGS. 5A and 5B are simplified diagrams showing how the transistors Tr1 and Tr2 are connected in a writing period Ta and in a display period Td.

First, a writing period Ta is started in pixels on Line One. As the writing period Ta is started, the first scanning line G1 and the second scanning line P1 are selected. This turns the transistors Tr3 and Tr4 ON. Since the third scanning line R1 is not selected, the transistor Tr5 is OFF.

When a video signal is inputted to the signal line driving circuit 102, a current flows between the signal lines S1 to Sx and the power supply lines V1 to Vx in an amount according to the video signal inputted (hereinafter referred to as signal current Ic). In this specification, the signal current Ic is called a signal current.

FIG. 5A is a schematic diagram of the pixel 101 when a signal current Ic according to a video signal flows in the signal line Si during a writing period Ta. 106 represents a terminal for connection with a power supply that gives a voltage to the opposite electrode. 107 represents a constant current source of the signal line driving circuit 102.

The transistor Tr3 is now turned ON and therefore a signal current Ic flows between the drain and source of the transistor Tr1 when the signal current Ic according to the video signal flows in the signal line Si. At this point, the gate of the transistor Tr1 is connected to the drain of Tr1 and therefore the transistor Tr1 operates in a saturation region to satisfy Expression 1. Accordingly, the gate voltage $V_{GS}$ of the transistor Tr1 is determined by the current value Ic.

The gate of the transistor Tr2 is connected to the gate of the transistor Tr1. The source of the transistor Tr2 is connected to the source of the transistor Tr1. Therefore, the gate voltage of the transistor Tr1 is equal to the gate voltage of the transistor Tr2. This means that the drain current of the transistor Tr1 is in proportion with the drain current of the transistor Tr1. If $\mu$ $C_o$ W/L, and $V_{TH}$ of Tr1 are equal to $\mu$ $C_o$ W/L, and $V_{TH}$ of the transistor Tr2, the drain current of the transistor Tr1 and the drain current of the transistor Tr2 are identical with each other and $I_2=Ic$ is satisfied.

Then the drain current $I_2$ of the transistor Tr2 flows into the light emitting element 104. The amount of current flowing into the light emitting element is set in accordance with the signal current Ic that is determined by the constant current source 107. The light emitting element 104 emits light at a luminance according to the amount of the current it receives. When a current flowing into the light emitting element is very close to 0 or if the light emitting element receives a current flowing in the reverse bias direction, the light emitting element 104 does not emit light.

After the writing period Ta is ended in the pixels on Line One, the first scanning line G1 and the second scanning line P1 are no longer selected. At this point, it is desirable if the selection period of the second scanning line P1 is ended earlier than the selection period of the first scanning line G1. This is because electric charges of the storage capacitor 105 leak through Tr4 if the transistor Tr3 is turned OFF first. Subsequently, a writing period Ta is started in pixels on Line Two and the first scanning line G2 and the second scanning line P2 are selected. This turns the transistor Tr3 and the transistor Tr4 ON in each of the pixels on Line Two. Since the third scanning line R2 is not selected, the transistor Tr5 is OFF.

Then a video signal is inputted to the signal line driving circuit 102, and a signal current Ic flows between the signal lines S1 to Sx and the power supply lines V1 to Vx in an amount according to the video signal inputted. A current in an amount according to the signal current Ic flows into the light emitting element 104 and the light emitting element 104 emits light at a luminance according to the amount of the received current.

After the writing period Ta is ended in the pixels on Line Two, a writing period Ta is started in pixels on Line Three and then in pixels on subsequent lines in order until pixels on Line Y are reached. In each writing period Ta, the operation described above is repeated.

The end of the writing period Ta in the pixels on Line One is followed by the start of a display period Td. As the display period Td is started, the third scanning line R1 is selected and the transistor Tr5 is turned ON in each of the pixels on Line One. The first scanning line G1 and the second scanning line P1 are not selected and therefore the transistors Tr3 and Tr4 are OFF.

FIG. 5B is a schematic diagram of the pixel in the display period Td. The transistors Tr3 and Tr4 are OFF. Sources of the transistors Tr1 and Tr2 are connected to the power supply line Vi and receive a constant voltage (power supply voltage).

Besides, in the transistors Tr1 and Tr2, $V_{GS}$ set in the writing period Ta is held as it is. Therefore, both the drain current $I_1$ of the transistor Tr1 and the drain current $I_2$ of the transistor Tr2 are still kept at the amount set in accordance with the signal current Ic. Since the transistor Tr5 is ON, the drain current $I_1$ of the transistor Tr1 and the drain current $I_2$ of the transistor Tr2 both flow into the light emitting element 104. The light emitting element 104 thus emits light at a luminance according to the sum amount of the drain current $I_1$ and the drain current $I_2$.

Then, the end of the writing period Ta in the pixels on Line Two is followed by the start of a display period Td in the pixels on Line Two. Then, similar to the case of the pixels on Line One, the third scanning line R2 is selected and the transistor Tr5 is turned ON. The first scanning line G2 and the second scanning line P2 are not selected and therefore the transistors Tr3 and Tr4 are OFF. The drain current $I_1$ and the drain current $I_2$ flow into the light emitting element 104 and the light emitting element 104 emits light at a luminance according to the sum amount of current it receives.

After the display period Td is started in the pixels on Line Two, a display period Td is started in pixels on Line Three and then in pixels on subsequent lines in order until pixels on Line Y are reached. In each display period Td, the operation described above is repeated.

When every writing period Ta and every display period Td are ended, one frame period is completed. One image is displayed in one frame period. Then the next frame period is started to start a writing period Ta and the operation described above is repeated.

The light emitting element 104 emits light at a luminance according to the amount of current flowing into the light emitting element. Therefore the gray scale of each pixel is determined by the amount of current that flows into the light emitting element in a display period Td. Although the light emitting element also emits light during a writing period Ta at a luminance according to the amount of drain current $I_1$, the influence of this light on gray scale is considered small enough to be ignored in an actual display panel. This is because, in the case of a VGA level display panel, for example, its pixel portion has 480 lines of pixels and a writing period Ta for one line of pixels is as short as $\frac{1}{480}$ of one frame period. Of course the amount of signal current Ic may be corrected by taking into account the influence of current flowing into the light emitting element during a writing period Ta on gray scale.

In the pixel of the first structure of the present invention, the current flowing into the light emitting element in a display period is the sum of the drain current $I_1$ and the drain current $I_2$, meaning that the current flowing into the light emitting element is not solely dependent on the drain current $I_2$. Accordingly, the amount of current flowing into the light emitting element is less varied from one pixel to another and recognition of fluctuation in luminance can be avoided even when characteristics of the transistors Tr1 and Tr2 are changed and the ratio of the drain current $I_1$ of the transistor Tr1 to the drain current $I_2$ of the transistor Tr2 varies between pixels.

In the pixel of the present invention, the drain current of the transistor Tr1 does not flow into the light emitting element during a writing period Ta. Accordingly, the capacitor of the light emitting element does not influence the length of period which starts with supply of current to the pixel from the signal line driving circuit to cause the flow of drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

Figure 25:
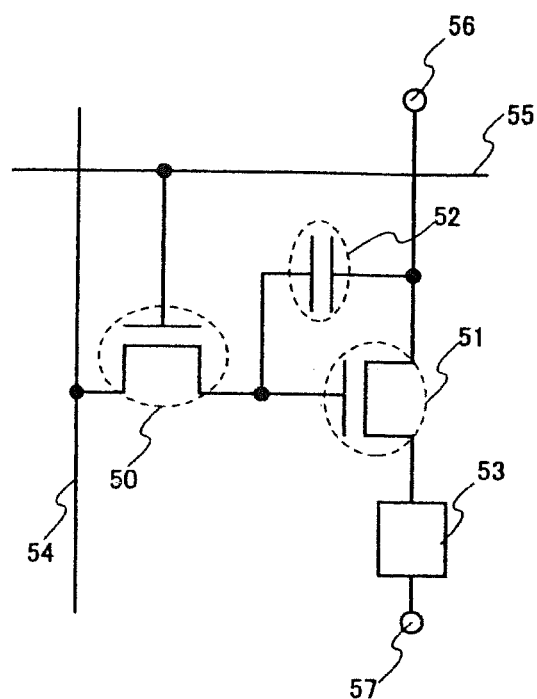
FIG. 25 is a circuit diagram of a voltage input type pixel.
Figure 26A:
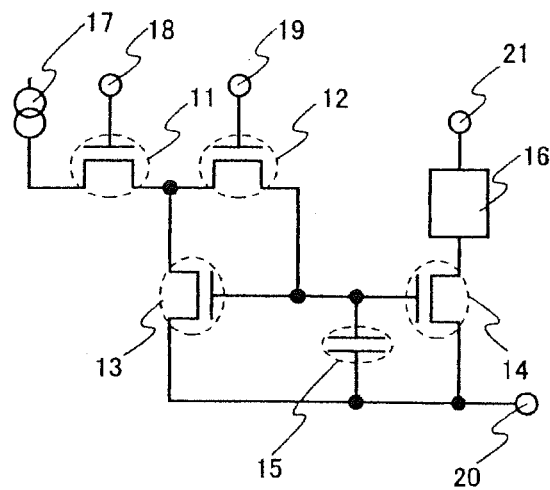
FIGS. 26A and 26B are circuit diagrams of conventional current input type pixels.
Figure 26B:
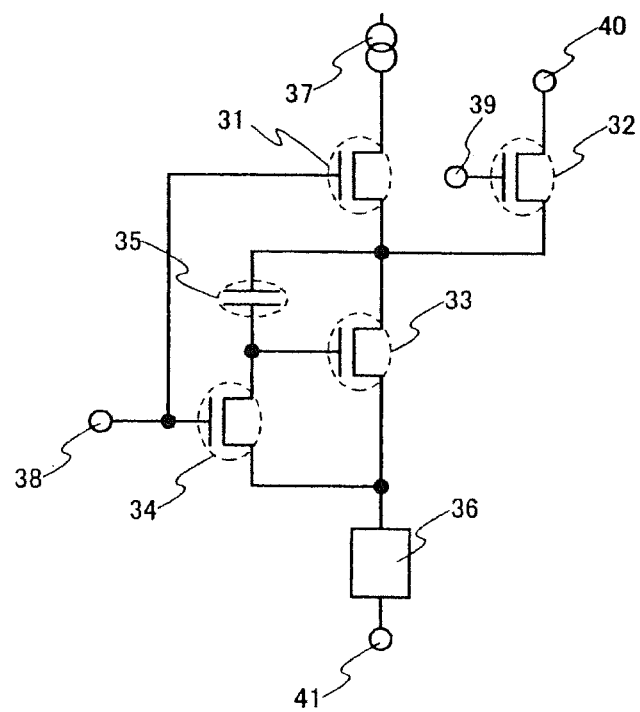

The light emitting device of the present invention also has the advantage of conventional current input type light emitting devices; the fluctuation in luminance of light emitting element between pixels is smaller in the present invention than in voltage input type light emitting devices even when TFT characteristics vary from one pixel to another. In addition, lowering of luminance due to degradation of light emitting element is smaller in the present invention than in the voltage input type pixel of FIG. 25 where the TFT 51 operates in a linear range. Furthermore the present invention can reduce change in luminance of light emitting element regardless of change in organic light emitting layer temperature by the outside temperature and by heat generated from the light emitting panel itself, and can prevent an increase in current consumption accompanying a temperature rise.

In this embodiment mode, one of the source and drain of the transistor Tr4 is connected to the signal line Si and the other is connected to the gate of the transistor Tr1 and to the gate of the transistor Tr2. However, this embodiment mode is not limited thereto. In the pixel of the first structure of the present invention, it is sufficient if the transistor Tr4 is connected to other elements or wiring lines such that the gate of the transistor Tr1 is connected to the drain of Tr1 in a writing period Ta and the gate of the transistor Tr1 is disconnected from the drain of Tr1 in a display period Td.

In short, it is sufficient if Tr3, Tr4, and Tr5 are connected as shown in FIG. 5A during Ta whereas they are connected as shown in FIG. 5B during Td. Gj, Pj, and Rj are three separate wiring lines but may be integrated into one or two wiring lines.

Embodiment Mode 2

Shown in FIG. 3 is one structure of the pixel 101 of the light emitting device of FIG. 2. This embodiment mode gives a description on another structure of this pixel 101.

FIG. 6 shows a detailed structure of the pixel 101 in FIG. 2. The pixel 101 shown in FIG. 6 has a signal line Si (one of S1 to Sx), a first scanning line Gj (one of G1 to Gy), a second scanning line Pj (one of P1 to Py), a third scanning line Rj (one of R1 to Ry), and a power supply line Vi (one of V1 to Vx).

The pixel 101 also has a transistor Tr1, a transistor Tr2, a transistor Tr3, a transistor Tr4, a transistor Tr5, a transistor Tr6, a light emitting element 214, and a storage capacitor 215.

The storage capacitor 215 is provided to hold the gate voltage of the transistors Tr1 and Tr2 more securely, but it is not always necessary.

A gate of the transistor Tr3 is connected to the first scanning line Gj. The transistor Tr3 has a source and a drain one of which is connected to the signal line Si and the other of which is connected to sources of the transistors Tr1 and Tr2.

A gate of the transistor Tr4 is connected to the second scanning line Pj. The transistor Tr4 has a source and a drain one of which is connected to the power supply line Vi and the other of which is connected to the gates of the transistors Tr1 and Tr2.

A gate of the transistor Tr5 is connected to the third scanning line Rj. The transistor Tr5 has a source and a drain one of which is connected to the sources of the transistors Tr1 and Tr2 and the other of which is connected to a pixel electrode of the light emitting element 214.

A gate of the transistor Tr6 is connected to the third scanning line Rj. The transistor Tr6 has a source and a drain one of which is connected to the power supply line and the other of which is connected to a drain of the transistor Tr2.

The gates of the transistors Tr1 and Tr2 are connected to each other. The drain of the transistor Tr1 is connected to the power supply line Vi.

The storage capacitor 215 has two electrodes one of which is connected to the gates of the transistors Tr1 and Tr2 and the other of which is connected to the sources of the transistors Tr1 and Tr2.

The voltage of the power supply line Vi (power supply voltage) is kept at a constant level. The voltage of the opposite electrode is also kept at a constant level.

The transistors Tr1 and Tr2 each may be a n-channel transistor or a p-channel transistor. However, the transistors Tr1 and Tr2 have to have the same polarity. When the anode serves as a pixel electrode and the cathode is used as an opposite electrode, the transistors Tr1 and Tr2 are desirably n-channel transistors. On the other hand, when the anode serves as an opposite electrode and the cathode is used as a pixel electrode, the transistors Tr1 and Tr2 are desirably p-channel transistors.

The transistor Tr3 may be an n-channel transistor or a p-channel transistor and the same applies to the transistors Tr4, Tr5, and Tr6. However, the transistors Tr5 and Tr6 have to have the same polarity since both of them are connected to the third scanning line Rj at their gates. If the gates of the transistors Tr5 and Tr6 are not connected to the same wiring line, Tr5 and Tr6 may have different polarities.

Next, the operation of the light emitting device of this embodiment mode is described. Similar to the pixel shown in FIG. 3, the description on the operation of the light emitting device that has the pixel of FIG. 6 is divided into one for a writing period Ta and one for a display period Td.

For voltages applied to the first to third scanning lines, see the timing chart of FIG. 4. FIGS. 7A and 7B are simplified diagrams showing how the transistors Tr1 and Tr2 of the pixel of FIG. 6 are connected in a writing period Ta and in a display period Td.

First, a writing period Ta is started in pixels on Line One. As the writing period Ta is started, the first scanning line G1 and the second scanning line P1 are selected. This turns the transistors Tr3 and Tr4 ON. Since the third scanning line R1 is not selected, the transistors Tr5 and Tr6 are OFF.

When a video signal is inputted to the signal line driving circuit 102, a signal current Ic flows between the signal lines S1 to Sx and the power supply lines V1 to Vx in an amount according to the video signal inputted.

FIG. 7A is a schematic diagram of the pixel 101 when a signal current Ic flows in the signal line Si during the writing period Ta. 216 represents a terminal for connection with a power supply that gives a voltage to the opposite electrode. 217 represents a constant current source of the signal line driving circuit 102.

The transistor Tr3 is now turned ON and therefore a signal current Ic flows between the drain and source of the transistor Tr1 when the signal current Ic flows in the signal line Si. At this point, the gate of the transistor Tr1 is connected to the drain of Tr1 and therefore the transistor Tr1 operates in a saturation region to satisfy Expression 1. Accordingly, the gate voltage $V_{GS}$ of the transistor Tr1 is determined by the current value Ic.

The gate of the transistor Tr2 is connected to the gate of the transistor Tr1. The source of the transistor Tr2 is connected to the source of the transistor Tr1. Therefore, the gate voltage of the transistor Tr1 is equal to the gate voltage of the transistor Tr2.

In the writing period Ta, the drain of the transistor Tr2 is in a so-called floating state in which the drain receives no voltage from other wiring lines or power supply, etc. Therefore no drain current flows in the transistor Tr2.

After the writing period Ta is ended in the pixels on Line One, the first scanning line G and the second scanning line P1 are no longer selected. At this point, it is desirable if the selection period of the second scanning line P1 is ended earlier than the selection period of the first scanning line G1. This is because electric charges of the storage capacitor 215 leak through Tr4 if the transistor Tr3 is turned OFF first. Subsequently, a writing period Ta is started in pixels on Line Two and the first scanning line G2 and the second scanning line P2 are selected. This turns the transistor Tr3 and the transistor Tr4 ON in each of the pixels on Line Two. Since the third scanning line R2 is not selected, the transistors Tr5 and Tr6 are OFF.

Then a video signal is inputted to the signal line driving circuit 102, and a signal current Ic flows between the signal lines S1 to Sx and the power supply lines V1 to Vx in an amount according to the video signal inputted. A gate voltage of the transistor Tr1 is determined in accordance with the signal current Ic.

After the writing period Ta is ended in the pixels on Line Two, a writing period Ta is started in pixels on Line Three and then in pixels on subsequent lines in order until pixels on Line Y are reached. In each writing period Ta, the operation described above is repeated.

The end of the writing period Ta in the pixels on Line One is followed by the start of a display period Td. As the display period Td is started, the third scanning line R1 is selected. Therefore the transistors Tr5 and Tr6 are turned ON in each of the pixels on Line One. The first scanning line G1 and the second scanning line P1 are not selected and therefore the transistors Tr3 and Tr4 are OFF.

FIG. 7B is a schematic diagram of the pixel in the display period Td. The transistors Tr3 and Tr4 are OFF. Drains of the transistors Tr1 and Tr2 are connected to the power supply line Vi and receive a constant voltage (power supply voltage).

In the transistors Tr1 and Tr2, $V_{GS}$ set in the writing period Ta is held as it is. Therefore the same level of gate voltage as the transistor Tr1 is given to the transistor Tr2. Since the transistor Tr6 is turned ON and the drain of the transistor Tr2 is connected to the power supply line Vi, the drain current of the transistor Tr2 is in proportion to the drain current of the transistor Tr1. If $\mu C_o$ W/L, and Van of Tr1 are equal to $\mu C_o$ W/L, and Van of Tr2, the drain current of the transistor Tr1 and the drain current of the transistor Tr2 are identical with each other and $I_2=I_1=Ic$ is satisfied.

Since the transistor Tr5 is ON, the drain current $I_1$ of the transistor Tr1 and the drain current $I_2$ of the transistor Tr2 both flow into the light emitting element 214 as the current that flows into the light emitting element. Therefore, in the display period Td, a current that is the sum of the drain current $I_1$ and the drain current $I_2$ flows into the light emitting element 214 and the light emitting element 214 emits light at a luminance according to the current it receives.

After the display period Td is started in the pixels on Line One, a display period Td is started in pixels on Line Two. Similar to the case of the pixels on Line One, the third scanning line R2 is selected to turn the transistors Tr5 and Tr6 ON. The first scanning line G2 and the second scanning line P2 are not selected and therefore the transistors Tr3 and Tr4 are OFF. Then the light emitting element 214 emits light at a luminance according to the sum amount of the drain current $I_1$ and drain current $I_2$.

After the display period Td is started in the pixels on Line Two, a display period Td is started in pixels on Line Three and then in pixels on subsequent lines in order until pixels on Line y are reached. In each display period Td, the operation described above is repeated.

When every writing period Ta and every display period Td are ended, one frame period is completed. One image is displayed in one frame period. Then the next frame period is started to start a writing period Ta and the operation described above is repeated.

The light emitting element 214 emits light at a luminance according to the amount of current flowing into the light emitting element. Therefore the gray scale of each pixel is determined by the amount of current that flows into the light emitting element in the display period Td.

In the pixel of the first structure of the present invention, the current flowing into the light emitting element in a display period is the sum of the drain current $I_1$ and the drain current $I_2$, meaning that the current flowing into the light emitting element is not solely dependent on the drain current $I_2$. Accordingly, the amount of current flowing into the light emitting element is less varied from one pixel to another and recognition of fluctuation in luminance can be avoided even when characteristics of the transistors Tr1 and Tr2 are changed and the ratio of the drain current $I_1$ of the transistor Tr1 to the drain current $I_2$ of the transistor Tr2 varies between pixels.

In the pixel of the present invention, the drain current of the transistor Tr1 does not flow into the light emitting element during a writing period Ta. Accordingly, the capacitor of the light emitting element does not influence the length of period which starts with supply of current to the pixel from the signal line driving circuit to cause the flow of drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

The light emitting device of the present invention also has the advantage of conventional current input type light emitting devices; the fluctuation in luminance of light emitting elements between pixels is smaller in the present invention than in voltage input type light emitting devices when TFT characteristics vary from one pixel to another. In addition, lowering of luminance due to degradation of light emitting elements is smaller in the present invention than in the voltage input type pixel of FIG. 25 where the TFT 51 operates in a linear range. Furthermore the present invention can reduce change in luminance of light emitting elements regardless of change in organic light emitting layer temperature by the outside temperature and by heat generated from the light emitting panel itself, and can prevent an increase in current consumption accompanying a temperature rise.

In this embodiment mode, one of the source and drain of the transistor Tr4 is connected to the drain of the transistor Tr1 and the other is connected to the gate of the transistor Tr1 and to the gate of the transistor Tr2. However, this embodiment mode is not limited thereto. In the pixel of the first structure of the present invention, it is sufficient if the transistor Tr4 is connected to other elements or wiring lines such that the gate of the transistor Tr1 is connected to the drain of Tr1 in the writing period Ta and the gate of the transistor Tr1 may be disconnected from the drain of Tr1 in the display period Td.

In short, it is sufficient if Tr3, Tr4, Tr5, and Tr6 are connected as shown in FIG. 7A during Ta whereas they are connected as shown in FIG. 7B during Td. Gj, Pj, and Rj are three separate wiring lines but may be integrated into one or two wiring lines.

The transistor Tr5 is provided to bring the value of the signal current Ic and the value of the drain current $I_1$ of the transistor Tr1 close to each other in a writing period Ta. It is not always necessary that one of the source and drain of the transistor Tr5 is connected to the sources of the transistors Tr1 and Tr2 whereas the other is connected to the pixel electrode of the light emitting element 214. It is sufficient if the transistor Tr5 is connected to other wiring lines or elements such that the source of the transistor Tr2 is connected to the pixel electrode of the light emitting element 214 or to the signal line Si in a writing period Ta.

In short, it is sufficient if all currents that flow in Tr1 during Ta are controlled by a current source and currents that flow in Tr1 and Tr2 during Td flow into the light emitting element.

Embodiment Mode 3

Shown in FIGS. 3 and 6 are structures of the pixel 101 of the light emitting device of FIG. 2. This embodiment mode gives a description on still another structure of this pixel 101. This embodiment mode is obtained by changing the positions of Tr5 and Tr6 in FIG. 6. Alternatively, only one of Tr5 and Tr6 may change its position.

FIG. 8 shows a detailed structure of the pixel 101 shown in FIG. 2. The pixel 101 shown in FIG. 8 has a signal line Si (one of S1 to Sx), a first scanning line Gj (one of G1 to Gy), a second scanning line Pj (one of P1 to Py), a third scanning line Rj (one of R1 to Ry), and a power supply line Vi (one of V1 to Vx).

The pixel 101 also has a transistor Tr1, a transistor Tr2, a transistor Tr3, a transistor Tr4, a transistor Tr5, a transistor Tr6, a light emitting element 224, and a storage capacitor 225. The storage capacitor 225 is provided to hold the gate voltage of the transistors Tr1 and Tr2 more securely, but it is not always necessary.

A gate of the transistor Tr3 is connected to the first scanning line Gj. The transistor Tr3 has a source and a drain one of which is connected to the signal line Si and the other of which is connected to a drain of the transistor Tr1.

A gate of the transistor Tr4 is connected to the second scanning line Pj. The transistor Tr4 has a source and a drain one of which is connected to the power supply line Vi and the other of which is connected to the gate of the transistor Tr1 and to the gate of the transistor Tr2.

A gate of the transistor Tr6 is connected to the third scanning line Rj. The transistor Tr6 has a source and a drain one of which is connected to the source of the transistor Tr2 and the other of which is connected to a pixel electrode of the light emitting element 224.

A gate of the transistor Tr5 is connected to the third scanning line Rj. The transistor Tr5 has a source and a drain one of which is connected to the source of the transistor Tr1 and the other of which is connected to a pixel electrode of the light emitting element 224.

The gates of the transistors Tr1 and Tr2 are connected to each other. The drains of the transistors Tr1 and Tr2 are connected to the power supply line Vi.

The storage capacitor 225 has two electrodes one of which is connected to the gates of the transistors Tr1 and Tr2 and the other of which is connected to the source of the transistor Tr1.

The voltage of the power supply line Vi (power supply voltage) is kept at a constant level. The voltage of the opposite electrode is also kept at a constant level.

The transistors Tr1 and Tr2 each may be an n-channel transistor or a p-channel transistor. However, the transistors Tr1 and Tr2 have to have the same polarity. When the anode serves as a pixel electrode and the cathode is used as an opposite electrode, the transistors Tr1 and Tr2 are desirably n-channel transistors. On the other hand, when the anode serves as an opposite electrode and the cathode is used as a pixel electrode, the transistors Tr1 and Tr2 are desirably p-channel transistors.

The transistor Tr3 may be an n-channel transistor or a p-channel transistor and the same applies to the transistors Tr4, Tr5, and Tr6. However, the transistors Tr5 and Tr6 have to have the same polarity since both of them are connected to the third scanning line Rj at their gates. If the gates of the transistors Tr5 and Tr6 are not connected to the same wiring line, Tr5 and Tr6 may have different polarities.

Next, the operation of the light emitting device of this embodiment mode is described. Similar to the pixel shown in FIGS. 3 and 6, the description on the operation of the light emitting device that has the pixel of FIG. 8 is divided into one for a writing period Ta and one for a display period Td.

For voltages applied to the first to third scanning lines, see the timing chart of FIG. 4. FIGS. 9A and 9B are simplified diagrams showing how the transistors Tr1 and Tr2 of the pixel of FIG. 8 are connected in a writing period Ta and in a display period Td.

First, a writing period Ta is started in pixels on Line One. As the writing period Ta is started, the first scanning line G1 and the second scanning line P1 are selected. This turns the transistors Tr3 and Tr4 ON. Since the third scanning line R1 is not selected, the transistor Tr5 and Tr6 are OFF.

When a video signal is inputted to the signal line driving circuit 102, a signal current Ic flows between the signal lines S1 to Sx and the power supply lines V1 to Vx in an amount according to the video signal inputted.

FIG. 9A is a schematic diagram of the pixel 101 when a signal current Ic flows in the signal line Si during the writing period Ta. 226 represents a terminal for connection with a power supply that gives a voltage to the opposite electrode. 227 represents a constant current source of the signal line driving circuit 102.

The transistor Tr3 is now turned ON and therefore a signal current Ic flows between the drain and source of the transistor Tr1 when the signal current Ic flows in the signal line Si. At this point, the gate of the transistor Tr1 is connected to the drain of Tr1 and therefore the transistor Tr1 operates in a saturation region to satisfy Expression 1. Accordingly, the gate voltage $V_{GS}$ of the transistor Tr1 is determined by the current value Ic.

In the writing period Ta, the source of the transistor Tr2 is in a so-called floating state in which the source receives no voltage from other wiring lines or power supply etc., since the transistor Tr6 is OFF. Therefore no drain current flows in the transistor Tr2.

After the writing period Ta is ended in the pixels on Line One, the first scanning line G1 and the second scanning line P1 are no longer selected. At this point, it is desirable if the selection period of the second scanning line P1 is ended earlier than the selection period of the first scanning line G1. This is because electric charges of the storage capacitor 225 leak through Tr4 if the transistor Tr3 is turned OFF first. Subsequently, a writing period Ta is started in pixels on Line Two and the first scanning line G2 and the second scanning line P2 are selected. This turns the transistor Tr3 and the transistor Tr4 ON in each of the pixels on Line Two. Since the third scanning line R2 is not selected, the transistors Tr5 and Tr6 are OFF.

Then a video signal is inputted to the signal line driving circuit 102, and a signal current Ic flows between the signal lines S1 to Sx and the power supply lines V1 to Vx in an amount according to the video signal inputted. A gate voltage of the transistor Tr1 is determined in accordance with the signal current Ic.

After the writing period Ta is ended in the pixels on Line Two, a writing period Ta is started in pixels on Line Three and then in pixels on subsequent lines in order until pixels on Line y are reached. In each writing period Ta, the operation described above is repeated.

The end of the writing period Ta in the pixels on Line One is followed by the start of a display period Td. As the display period Td is started, the third scanning line R1 is selected. Therefore the transistors Tr5 and Tr6 are turned ON in each of the pixels on Line One. The first scanning line G1 and the second scanning line P1 are not selected and therefore the transistors Tr3 and Tr4 are OFF.

FIG. 9B is a schematic diagram of the pixel in the display period Td. The transistors Tr3 and Tr4 are OFF. The sources of the transistors Tr1 and Tr2 are connected to the power supply line Vi and receive a constant voltage (power supply voltage).

In the transistor Tr1, $V_{GS}$ set in the writing period Ta is held as it is. The gate of the transistor Tr2 is connected to the gate of the transistor Tr1. The source of the transistor Tr2 is connected to the source of the transistor Tr1. Therefore the gate voltage of the transistor Tr1 is equal to the gate voltage of the transistor Tr2. Since the drain of the transistor Tr2 is connected to the power supply line Vi, the drain current $I_2$ of the transistor Tr2 is in proportion to the drain current of the transistor Tr1. If $\mu C_o$ W/L, and $V_{TH}$ of Tr1 are equal to $\mu C_o$ W/L, and $V_{TH}$ of Tr2, the drain current of the transistor Tr1 and the drain current of the transistor Tr2 are identical with each other and $I_2=I_1=Ic$ is satisfied.

Since the transistor Tr5 is ON, the drain current $I_1$ of the transistor Tr1 and the drain current $I_2$ of the transistor Tr2 both flow into the light emitting element 224. Therefore, in the display period Td, a current that is the sum of the drain current $I_1$ and drain current $I_2$ flows into the light emitting element 224 and the light emitting element 224 emits light at a luminance according to the current it receives.

After the display period Td is started in the pixels on Line One, a display period Td is started in pixels on Line Two. Similar to the case of the pixels on Line One, the third scanning line R2 is selected to turn the transistors Tr5 and Tr6 ON. The first scanning line G2 and the second scanning line P2 are not selected and therefore the transistors Tr3 and Tr4 are OFF.

Then the light emitting element 214 emits light at a luminance according to the sum amount of the drain current $I_1$ and drain current $I_2$.

After the display period Td is started in the pixels on Line Two, a display period Td is started in pixels on Line Three and then in pixels on subsequent lines in order until pixels on Line y are reached. In each display period Td, the operation described above is repeated.

When every writing period Ta and every display period Td are ended, one frame period is completed. One image is displayed in one frame period. Then the next frame period is started to start a writing period Ta and the operation described above is repeated.

The light emitting element 224 emits light at a luminance according to the amount of current flowing into the light emitting element. Therefore the gray scale of each pixel is determined by the amount of current that flows into the light emitting element in the display period Td.

In the pixel of the first structure of the present invention, the current flowing into the light emitting element in a display period is the sum of the drain current $I_1$ and drain current $I_2$, meaning that the current flowing into the light emitting element is not solely dependent on the drain current $I_2$. Accordingly, the amount of current flowing into the light emitting element is less varied from one pixel to another and recognition of fluctuation in luminance can be avoided even when characteristics of the transistors Tr1 and Tr2 are changed and the ratio of the drain current $I_1$ of the transistor Tr1 to the drain current $I_2$ of the transistor Tr2 varies between pixels.

In the pixel of the present invention, the drain current of the transistor Tr1 does not flow into the light emitting element during a writing period Ta. Accordingly, the capacitor of the light emitting element does not influence the length of period which starts with supply of current to the pixel from the signal line driving circuit to cause the flow of drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

The light emitting device of the present invention also has the advantage of conventional current input type light emitting devices; the fluctuation in luminance of light emitting elements between pixels is smaller in the present invention than in voltage input type light emitting devices when TFT characteristics vary from one pixel to another. In addition, lowering of luminance due to degradation of light emitting elements is smaller in the present invention than in the voltage input type pixel of FIG. 25 where the TFT 51 operates in a linear range. Furthermore the present invention can reduce change in luminance of light emitting elements regardless of change in organic light emitting layer temperature by the outside temperature and by heat generated from the light emitting panel itself, and can prevent an increase in current consumption accompanying a temperature rise.

In this embodiment mode, one of the source and drain of the transistor Tr4 is connected to the drain of the transistor Tr1 and the other is connected to the gate of the transistor Tr1 and to the gate of the transistor Tr2. However, this embodiment mode is not limited thereto. In the pixel of the first structure of the present invention, it is sufficient if the transistor Tr4 is connected to other elements or wiring lines such that the gate of the transistor Tr1 is connected to the drain of Tr1 in the writing period Ta and the gate of the transistor Tr1 may be disconnected from the drain of Tr1 in the display period Td.

In short, it is sufficient if Tr3, Tr4, Tr5, and Tr6 are connected as shown in FIG. 9A during Ta whereas they are connected as shown in FIG. 9B during Td. Gj, Pj, and Rj are three separate wiring lines but may be integrated into one or two wiring lines.

In short, it is sufficient if all currents that flow in Tr1 during Ta are controlled by a current source and currents that flow in Tr1 and Tr2 during Td flow into the light emitting element.

Embodiment Mode 4

This embodiment mode describes the structure of a pixel of a light emitting device having a second structure of the present invention.

Figure 37A:
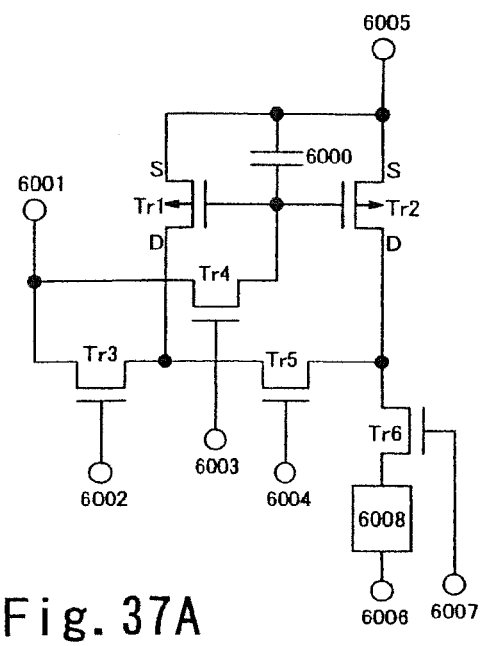
FIGS. 37A to 37D are schematic diagrams of a pixel being driven.

FIG. 37A is a circuit diagram of the pixel of this embodiment mode. The pixel shown in FIGS. 37A to 37D has transistors Tr1, Tr2, Tr3, Tr4, Tr5, and Tr6, a light emitting element 6008, and a storage capacitor 6000. The storage capacitor 6000 is provided to hold the gate voltage of the transistors Tr1 and Tr2 more securely, but it is not always necessary.

A gate of the transistor Tr3 is connected to a terminal 6002. The transistor Tr3 has a source and a drain one of which is connected to a terminal 6001 and the other of which is connected to a drain of the transistor Tr1.

A gate of the transistor Tr4 is connected to a terminal 6003. The transistor Tr4 has a source and a drain one of which is connected to the terminal 6001 and the other of which is connected to the gates of the transistors Tr1 and Tr2.

A gate of the transistor Tr5 is connected to a terminal 6004. The transistor Tr5 has a source and a drain one of which is connected to the drain of the transistor Tr1 and the other of which is connected to a drain of the transistor Tr2.

A gate of the transistor Tr6 is connected to a terminal 6007. The transistor Tr6 has a source and a drain one of which is connected to the drain of the transistor Tr2 and the other of which is connected to a pixel electrode of the light emitting element 6008.

The gates of the transistors Tr1 and Tr2 are connected to each other. Sources of the transistors Tr1 and Tr2 are both connected to a terminal 6005.

The storage capacitor 6000 has two electrodes one of which is connected to the gates of the transistors Tr1 and Tr2 and the other of which is connected to the sources of the transistors Tr1 and Tr2.

An opposite electrode of the light emitting element 6008 is connected to a terminal 6006. Given voltages are applied to the terminals 6005 and 6006 from a power supply, respectively, and the voltage difference between the terminals is kept constant.

In FIG. 37A, Tr1 and Tr2 are both p-channel TFTs. The transistors Tr1 and Tr2 have to have the same polarity. When the anode serves as a pixel electrode and the cathode is used as an opposite electrode, the transistors Tr1 and Tr2 are desirably p-channel transistors. On the other hand, when the anode serves as an opposite electrode and the cathode is used as a pixel electrode, the transistors Tr1 and Tr2 are desirably n-channel transistors.

The transistor Tr3 may be an n-channel transistor or a p-channel transistor, and the same applies to the transistors Tr4 to Tr6. The polarities of the transistors Tr3 to Tr6 may be determined by taking into account the voltages applied to the terminals.

Next, a description is given on the operation of the light emitting device of this embodiment mode. The description on the operation of the light emitting device that has the pixel shown in FIG. 37A is divided into one for a writing period Ta and one for a display period Td.

Figure 37B:
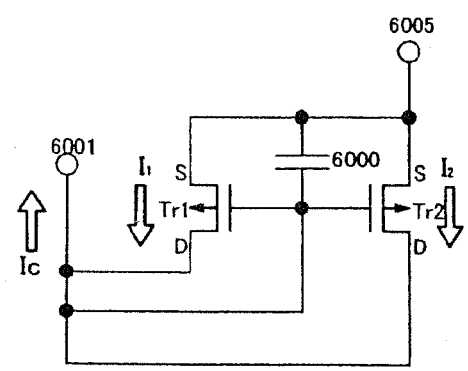

FIG. 37B is a simplified diagram showing how the transistors Tr1 and Tr2 of the pixel of FIG. 37A are connected at the beginning of a writing period Ta. At the beginning of the writing period Ta, Tr3 to Tr5 are turned ON and Tr6 is turned OFF. Then a signal current Ic flows between the terminal 6001 and the terminal 6005 in an amount according to a video signal inputted to the terminal 6001, respectively.

The signal current Ic causes a drain current $I_1$ to flow between the source and drain of Tr1 and a drain current $I_2$ to flow between the source and drain of Tr2. In other words, the signal current Ic corresponds to the sum of the drain current $I_1$ and drain current $I_2$. At this point, the gate of the transistor Tr1 is connected to the drain of Tr1 and therefore Tr1 operates in a saturation region to satisfy Expression 1. Accordingly, the gate voltage $V_{GS}$ of the transistor Tr1 is determined by the current $I_1$.

The gate of the transistor Tr2 is connected to the gate of the transistor Tr1. The source of the transistor Tr2 is connected to the source of the transistor Tr1. Therefore, the gate voltage of the transistor Tr1 is equal to the gate voltage of the transistor Tr2.

Although Tr1 and Tr2 have the same gate voltage, $I_1$ and $I_2$ are not always equal to each other if $\mu C_o$ W/L, and $V_{TH}$ of Tr1 are different from $\mu C$. W/L, and $V_{TH}$ of Tr2.

Figure 37C:
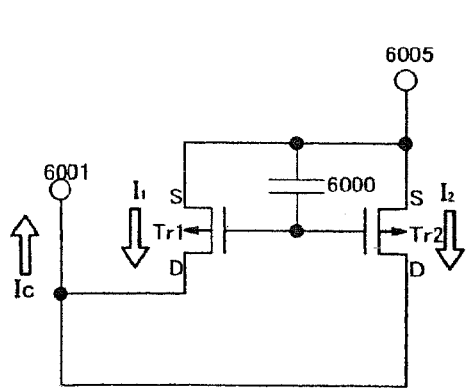

Desirably, Tr4 is turned OFF before the writing period Ta is ended. FIG. 37C is a simplified diagram showing how the transistors Tr1 and Tr2 are connected when Tr4 is turned OFF. This is because electric charges of the storage capacitor 6000 leak through Tr4 if the transistor Tr3 is turned OFF first.

The end of the writing period Ta is followed by the start of a display period Td. As the display period Td is started, Tr3 to Tr5 are turned OFF and Tr6 is turned ON.

Figure 37D:
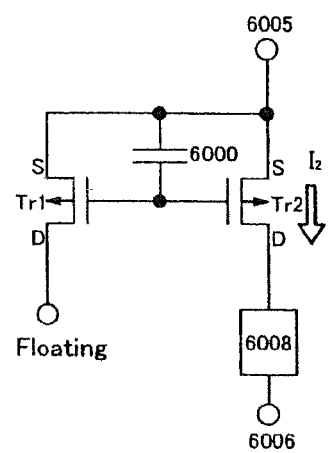

FIG. 37D is a schematic diagram of the pixel during the display period Td. In the transistor Tr2, $V_{GS}$ set in the writing period Ta is held as it is by the storage capacitor 6000. Since Tr6 is ON, the drain current $I_2$ of Tr2 is supplied to the light emitting element 6008. The light emitting element 6008 emits light at a luminance according to the amount of current $I_2$ that the light emitting element receives. In other words, the light emitting element 6008 emits light at a luminance according to the amount of current that flows into the light emitting element and therefore the gray scale of each pixel is determined by the amount of current flowing into the light emitting element in a display period Td.

When every writing period Ta and every display period Td are ended, one frame period is completed. One image is displayed in one frame period. Then the next frame period is started to start a writing period Ta and the operation described above is repeated.

In the pixel of the second structure of the present invention, the amount of current $I_2$ supplied from the driving unit to the light emitting element may not be kept at a desired value if characteristics of the transistors Tr1 and Tr2 are changed. However, two transistors, namely, Tr1 and Tr2, are used together to convert current into voltage and therefore the converted voltage can be averaged. Since the current $I_2$ supplied from the driving unit to the light emitting element is in an amount according to the averaged voltage, fluctuation in amount of current supplied to the light emitting element due to a characteristic change can be reduced to about half the fluctuation of the pixel shown in FIG. 27A. Therefore the fluctuation in luminance between pixels can be reduced in the present invention. Furthermore, the current supplied to the pixel is larger than the current $I_2$ and therefore time required to write the current can be shortened.

In the pixel of the present invention, the signal current does not flow into the light emitting element during a writing period Ta. Accordingly, the capacitor of the light emitting element does not influence the length of period which starts with supply of current to the pixel from the signal line driving circuit to cause the flow of drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

The light emitting device of the present invention also has the advantage of conventional current input type light emitting devices; the fluctuation in luminance of light emitting element between pixels is smaller in the present invention than in voltage input type light emitting devices even when TFT characteristics vary from one pixel to another. In addition, lowering of luminance due to degradation of light emitting element is smaller in the present invention than in the voltage input type pixel of FIG. 25 where the TFT 51 operates in a linear range. Furthermore the present invention can reduce change in luminance of light emitting element regardless of change in organic light emitting layer temperature by the outside temperature and by heat generated from the light emitting panel itself, and can prevent an increase in current consumption accompanying a temperature rise.

Note that connection of the transistors Tr3, Tr4, Tr5, and Tr6 is not limited to the one shown in FIG. 37A. It is sufficient if Tr3, Tr4, Tr5, and Tr6 are connected to ensure that Tr1 and Tr2 are connected as shown in FIGS. 37B to 37D in the respective periods.

To be specific, at the beginning of a writing period, the sources of Tr1 and Tr2 are both connected to the terminal 6005 whereas the gate and drain of Tr1 and Tr2 are both connected to the terminal 6001 as shown in FIG. 37B. One of the two electrodes of the storage capacitor is connected to the terminal 6005 and the other is connected to the gates of Tr1 and Tr2. Before the writing period is ended, the gates of Tr1 and Tr2 are both connected to each other, the sources of Tr1 and Tr2 are both connected to the terminal 6005, and the drains of Tr1 and Tr2 are connected to the terminal 6001 as shown in FIG. 37C. One of the two electrodes of the storage capacitor is connected to the terminal 6005 and the other is connected to the gate of Tr2. This enables the storage capacitor 6000 to hold electric charges. Note that the gates of Tr1 and Tr2 are not necessarily connected to each other as long as the electric charges of the storage capacitor are held. If the gates of Tr1 and Tr2 are not connected to each other, the gate of Tr1 may be connected to the drain of Tr1.

In a display period, the gates of Tr1 and Tr2 are connected to each other, the sources of Tr1 and Tr2 are both connected to the terminal 6005, the drain or source of Tr1 is set to the floating state, and the drain of Tr2 is connected to the pixel electrode of the light emitting element as shown in FIG. 37D. One of the two electrodes of the storage capacitor is connected to the terminal 6005 and the other is connected to the gate of Tr2. The gates of Tr1 and Tr2 may not be connected to each other and, in this case, the gate of Tr1 may be connected to the drain of Tr1.

For instance, one of the source and drain of Tr3 has to be connected to the terminal 6001, but the other does not need to be connected to the drain of Tr1 and may be connected to the drain of Tr2. One of the source and drain of Tr4 has to be connected to the gates of Tr1 and Tr2, but the other does not need to be connected to the terminal 6001 and may be connected to the drain of Tr1 or the drain of Tr2. One of the source and drain of Tr5 has to be connected to the drain of Tr2, but the other does not need to be connected to the drain of Tr1 and may be connected to the terminal 6001.

Embodiment Mode 5

This embodiment mode describes the structure of a pixel of a light emitting device having a second structure of the present invention.

Figure 38A:
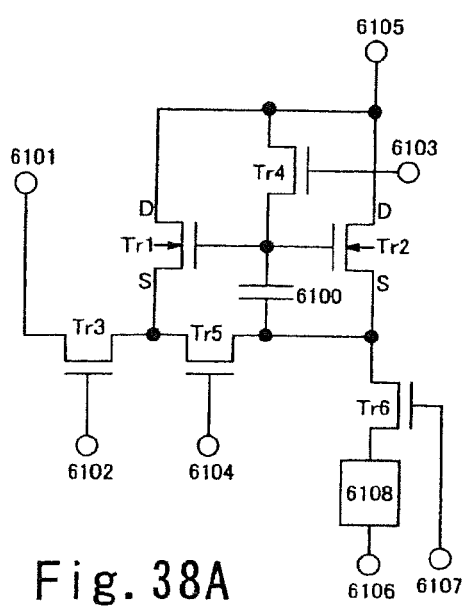
FIGS. 38A to 38D are schematic diagrams of a pixel being driven.

FIG. 38A is a circuit diagram of the pixel of this embodiment mode. The pixel shown in FIGS. 38A to 38D has transistors Tr1, Tr2, Tr3, Tr4, Tr5, and Tr6, a light emitting element 6108, and a storage capacitor 6100. The storage capacitor 6100 is provided to hold the gate voltage of Tr1 and Tr2 more securely, but it is not always necessary.

A gate of the transistor Tr3 is connected to a terminal 6102. The transistor Tr3 has a source and a drain one of which is connected to a terminal 6101 and the other of which is connected to a source of the transistor Tr1.

A gate of the transistor Tr4 is connected to a terminal 6103. The transistor Tr4 has a source and a drain one of which is connected to the terminal 6105 and the other of which is connected to gates of the transistors Tr1 and Tr2.

A gate of the transistor Tr5 is connected to a terminal 6104. The transistor Tr5 has a source and a drain one of which is connected to the source of the transistor Tr1 and the other of which is connected to the source of the transistor Tr2.

A gate of the transistor Tr6 is connected to a terminal 6107. The transistor Tr6 has a source and a drain one of which is connected to the source of the transistor Tr2 and the other of which is connected to a pixel electrode of the light emitting element 6108.

The gates of the transistors Tr1 and Tr2 are connected to each other. The drains of the transistors Tr1 and Tr2 are both connected to a terminal 6105.

The storage capacitor 6100 has two electrodes one of which is connected to the gates of the transistors Tr1 and Tr2 and the other of which is connected to the sources of the transistors Tr1 and Tr2.

An opposite electrode of the light emitting element 6108 is connected to a terminal 6106. Given voltages are applied to the terminals 6105 and 6106 from a power supply, and the voltage difference between the terminals is kept constant.

In FIG. 38A, Tr1 and Tr2 are both n-channel TFTs. The transistors Tr1 and Tr2 have to have the same polarity. When the anode serves as a pixel electrode and the cathode is used as an opposite electrode, the transistors Tr1 and Tr2 are desirably p-channel transistors. On the other hand, when the anode serves as an opposite electrode and the cathode is used as a pixel electrode, the transistors Tr1 and Tr2 are desirably n-channel transistors.

The transistor Tr3 may be an n-channel transistor or a p-channel transistor, and the same applies to the transistors Tr4 to Tr6. The polarities of the transistors Tr3 to Tr6 are determined by taking into account the voltages applied to the terminals.

Next, a description is given on the operation of the light emitting device of this embodiment mode. The description on the operation of the light emitting device that has the pixel shown in FIG. 38A is divided into one for a writing period Ta and one for a display period Td.

Figure 38B:
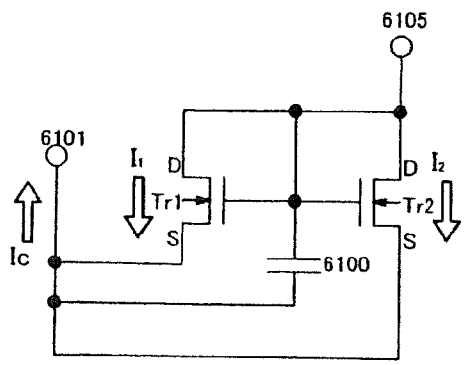

FIG. 38B is a simplified diagram showing how the transistors Tr1 and Tr2 of the pixel of FIG. 38A are connected at the beginning of a writing period Ta. At the beginning of the writing period Ta, Tr3 to Tr5 are turned ON and Tr6 is turned OFF. Then a signal current Ic flows between the terminal 6101 and the terminal 6105 in an amount according to a video signal inputted to the terminal 6101.

The signal current Ic causes a drain current $I_1$ to flow between the source and drain of Tr1 and a drain current $I_2$ between the source and drain of Tr2. In other words, the signal current Ic corresponds to the sum of the drain current $I_1$ and the drain current $I_2$. At this point, the gate of the transistor Tr1 is connected to the drain of Tr1 and therefore Tr1 operates in a saturation region to satisfy Expression 1. Accordingly, the gate voltage $V_{GS}$ of the transistor Tr1 is determined by the current $I_1$.

The gate of the transistor Tr2 is connected to the gate of the transistor Tr1. The source of the transistor Tr2 is connected to the source of the transistor Tr1. Therefore, the gate voltage of the transistor Tr1 is equal to the gate voltage of the transistor Tr2.

Although Tr1 and Tr2 have the same gate voltage, $I_1$ and $I_2$ are not always equal to each other if the values of $\mu C_o$ and W/L of Tr1 are different from that of $\mu C_o$ and W/L of Tr2.

Figure 38C:
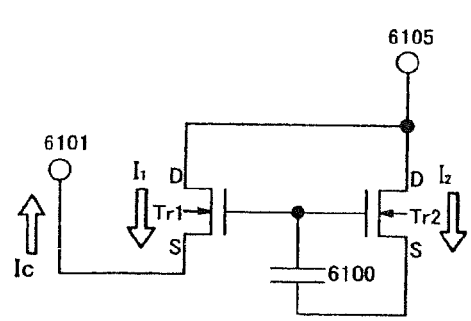

Desirably, Tr4 is turned OFF before the writing period Ta is ended. FIG. 38C is a simplified diagram showing how the transistors Tr1 and Tr2 are connected when Tr4 is turned OFF. This is because electric charges of the storage capacitor 6100 leak through Tr4 if the transistor Tr3 is turned OFF first.

The end of the writing period Ta is followed by the start of a display period Td. As the display period Td is started, Tr3 to Tr5 are turned OFF and Tr6 is turned ON.

Figure 38D:
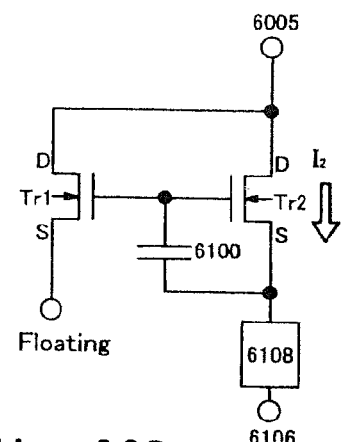

FIG. 38D is a schematic diagram of the pixel during the display period Td. In the transistor Tr2, $V_{GS}$ set in the writing period Ta is held as it is by the storage capacitor 6100. Since Tr6 is ON, the drain current $I_2$ of Tr2 is supplied to the light emitting element 6108. The light emitting element 6108 emits light at a luminance according to the amount of the current $I_2$ that the light emitting element receives. The light emitting element 6108 emits light at a luminance according to the amount of current that flows into the light emitting element and therefore the gray scale of each pixel is determined by the amount of current flowing into the light emitting element in the display period Td.

When every writing period Ta and every display period Td are ended, one frame period is completed. One image is displayed in one frame period. Then the next frame period is started to start a writing period Ta and the operation described above is repeated.

In the pixel of the second structure of the present invention, the amount of the current $I_2$ supplied from the driving unit to the light emitting element may not be kept at a desired value if characteristics of the transistors Tr1 and Tr2 are changed. However, two transistors, namely, Tr1 and Tr2, are used to convert a current into voltage and therefore the converted voltage can be averaged. Since the current $I_2$ supplied from the driving unit to the light emitting element is in an amount according to the averaged voltage, fluctuation in an amount of current supplied to the light emitting element due to a characteristic change can be reduced to about half the fluctuation of the pixel shown in FIG. 27A. Therefore the fluctuation in luminance between pixels can be reduced in the present invention. Furthermore, the current supplied to the pixel is larger than the current $I_2$ and therefore time required to write the current can be shortened.

In the pixel of the present invention, the signal current Ic does not flow into the light emitting element during a writing period Ta. Accordingly, the capacitor of the light emitting element does not influence the length of period which starts with supply of current to the pixel from the signal line driving circuit to cause the flow of the drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

The light emitting device of the present invention also has the advantage of conventional current input type light emitting devices; the fluctuation in luminance of light emitting elements between pixels is smaller in the present invention than in voltage input type light emitting devices when TFT characteristics vary from one pixel to another. In addition, lowering of luminance due to degradation of light emitting elements is smaller in the present invention than in the voltage input type pixel of FIG. 25 where the TFT 51 operates in a linear range. Furthermore the present invention can reduce change in luminance of light emitting elements regardless of change in organic light emitting layer temperature by the outside temperature and by heat generated from the light by the outside temperature and by heat generated from the light emitting panel itself, and can prevent an increase in current consumption accompanying a temperature rise.

Connection of the transistors Tr3, Tr4, Tr5, and Tr6 is not limited to the one shown in FIG. 38A. It is sufficient if Tr3, Tr4, and Tr5 are connected to ensure that Tr1 and Tr2 are connected as shown in FIGS. 38B to 38D in the respective periods.

To be specific, at the beginning of a writing period, the sources of Tr1 and Tr2 are both connected to the terminal 6101 whereas the gate and drain of Tr1 and Tr2 are connected to the terminal 6105 as shown in FIG. 38B. One of the two electrodes of the storage capacitor is connected to the terminal 6101 and the other is connected to the gates of Tr1 and Tr2. Before the writing period is ended, the gates of Tr1 and Tr2 are connected to each other, and the drains of Tr1 and Tr2 are connected to the terminal 6105 as shown in FIG. 38C. One of the two electrodes of the storage capacitor is connected to the source of Tr2 and the other is connected to the gate of Tr2. This enables the storage capacitor 6100 to hold electric charges. The gates of Tr1 and Tr2 are not necessarily connected to each other as long as the electric charges of the storage capacitor are held. If the gates of Tr1 and Tr2 are not connected to each other, the gate of Tr1 may be connected to the drain of Tr1.

In a display period, the gates of Tr1 and Tr2 are connected to each other, the drains of Tr1 and Tr2 are connected to the terminal 6105, the source or drain of Tr1 is set to the floating state, and the source of Tr2 is connected to the pixel electrode of the light emitting element as shown in FIG. 38D. One of the two electrodes of the storage capacitor is connected to the source of Tr2 and the other is connected to the gate of Tr2. The gates of Tr1 and Tr2 may not be connected to each other and, in this case, the gate of Tr1 may be connected to the drain of Tr1.

For instance, one of the source and drain of Tr3 has to be connected to the terminal 6101, but the other does not need to be connected to the source of Tr1 and may be connected to the source of Tr2. One of the source and drain of Tr5 has to be connected to the drain of Tr2, but the other does not need to be connected to the drain of Tr1 and may be connected to the terminal 6101.

Embodiment Mode 6

Cases where a video signal is an analog signal have been described in Embodiment Modes 1 through 5. The light emitting device of the present invention may also be driven by a digital video signal.

In a time gray scale driving method using a digital video signal (digital driving method), a writing period Ta and a display period Td are repeated in one frame period to display one image.

If an image is to be displayed by n-bit video signals, for example, one frame period has at least n writing periods and n display periods. The n writing periods (Ta1 to Tan) and n display periods (Td1 to Tdn) are for n bits of the video signals, respectively.

A writing period Tam (m is an arbitrary number ranging from 1 to n) is followed by a display period for the same bit number, a display period Tdm, in this case. One writing period Ta and one display period Td together make a sub-frame period SF. The writing period Tam and display period Tdm that are for the m-th bit constitute a sub-frame period SFm.

The lengths of the sub-frame periods SF1 to SFn are set to satisfy $SF1:SF2: \ldots :SFn = 2^0:2^1: \ldots :2^{n-1}$.

Whether or not a light emitting element is to emit light is determined in each sub-frame period by the bit of the digital video signal inputted. The gray scale of a pixel can be controlled by controlling the sum of lengths of display periods in which the light emitting element emits light in one frame period.

A sub-frame period that has a long display period may be divided into several periods in order to improve the quality of image display. Specifics on how a sub-frame period is divided are disclosed in Japanese Patent Application No. 2000-267164.

Time gray scale may be combined with area ratio gray scale.

In the light emitting device of the present invention, transistors used in a pixel may be ones formed of single crystal silicon or may be thin film transistors formed of polysilicon or amorphous silicon.

Embodiments of the present invention will be described below.

Embodiment 1

Shown in FIGS. 3, 6, and 8 are structures of the pixel 101 of the light emitting device of FIG. 2. This embodiment gives a description on still another structure of this pixel 101.

FIG. 10 shows a detailed structure of the pixel 101 in FIG. 2. The pixel 101 shown in FIG. 10 has a signal line Si (one of S1 to Sx), a first scanning line Gj (one of G1 to Gy), a second scanning line Pj (one of P1 to Py), a third scanning line Rj (one of R1 to Ry), and a power supply line Vi (one of V1 to Vx).

The pixel 101 also has a transistor Tr1, a transistor Tr2, a transistor Tr3, a transistor Tr4, a transistor Tr5, a light emitting element 234, and a storage capacitor 235. The storage capacitor 235 is provided to hold the voltage between a gate and source of the transistors Tr1 and Tr2 (gate voltage) more securely, but it is not always necessary.

A gate of the transistor Tr3 is connected to the first scanning line Gj. The transistor Tr3 has a source and a drain one of which is connected to the signal line Si and the other of which is connected to a drain of the transistor Tr1.

A gate of the transistor Tr4 is connected to the second scanning line Pj. The transistor Tr4 has a source and a drain one of which is connected to the drain of the transistor Tr1 and the other of which is connected to the gate of the transistor Tr1 and to the gate of the transistor Tr2.

A gate of the transistor Tr5 is connected to the third scanning line Rj. The transistor Tr5 has a source and a drain one of which is connected to the drain of the transistor Tr1 and the other of which is connected to a drain of the transistor Tr2.

The gates of the transistors Tr1 and Tr2 are connected to each other. Sources of the transistors Tr1 and Tr2 are both connected to the power supply line Vi. The drain of the transistor Tr2 is connected to a pixel electrode of the light emitting element 234.

The storage capacitor 235 has two electrodes one of which is connected to the gates of the transistors Tr1 and Tr2 and the other of which is connected to the power supply line Vi.

The light emitting element 234 has an anode and a cathode. In this specification, a cathode is called an opposite electrode if an anode serves as a pixel electrode and, if a cathode serves as a pixel electrode, an anode is called an opposite electrode.

The voltage of the power supply line Vi (power supply voltage) is kept at a constant level. The voltage of the opposite electrode is also kept at a constant level.

The transistors Tr1 and Tr2 each may be an n-channel transistor or a p-channel transistor. However, the transistors Tr1 and Tr2 have to have the same polarity. When the anode serves as a pixel electrode and the cathode is used as an opposite electrode, the transistors Tr1 and Tr2 are desirably p-channel transistors. On the other hand, when the anode serves as an opposite electrode and the cathode is used as a pixel electrode, the transistors Tr1 and Tr2 are desirably n-channel transistors.

The transistor Tr3 to Tr5 each may be an n-channel transistor or a p-channel transistor. Gj, Pj, and Rj are three separate wiring lines but may be integrated into one or two wiring lines.

Similar to the pixel shown in FIG. 3, the description on the operation of the light emitting device that has the pixel of FIG. 10 is divided into one for a writing period Ta and one for a display period Td. The pixel of FIG. 10 during a writing period Ta and a display period Td operates in the same way as the pixel of FIG. 3, which are described in Embodiment Mode 1 with reference to FIG. 4 and FIGS. 5A and 5B. Accordingly, the description thereof is omitted here.

Embodiment 2

This embodiment describes the structure of the pixel in the light emitting device of Embodiment Mode 1 when the gate of the transistor Tr5 is connected to the first scanning line.

FIG. 11 shows a detailed structure of the pixel 101 in FIG. 2. The pixel 101 shown in FIG. 11 has a signal line Si (one of S1 to Sx), a first scanning line Gj (one of G1 to Gy), a second scanning line Pj (one of P1 to Py), and a power supply line Vi (one of V1 to Vx).

The pixel 101 also has a transistor Tr1, a transistor Tr2, a transistor Tr3, a transistor Tr4, a transistor Tr5, a light emitting element 244, and a storage capacitor 245. The storage capacitor 245 is provided to hold the voltage between a gate and source of the transistors Tr1 and Tr2 (gate voltage) more securely, but it is not always necessary.

A gate of the transistor Tr3 is connected to the first scanning line Gj. The transistor Tr3 has a source and a drain one of which is connected to the signal line Si and the other of which is connected to a drain of the transistor Tr1.

A gate of the transistor Tr4 is connected to the second scanning line Pj. The transistor Tr4 has a source and a drain one of which is connected to the drain of the transistor Tr1 and the other of which is connected to the gate of the transistor Tr1 and to the gate of the transistor Tr2.

A gate of the transistor Tr5 is connected to the first scanning line Gj. The transistor Tr5 has a source and a drain one of which is connected to the drain of the transistor Tr1 and the other of which is connected to a drain of the transistor Tr2.

The gates of the transistors Tr1 and Tr2 are connected to each other. The sources of the transistors Tr1 and Tr2 are both connected to the power supply line Vi. The drain of the transistor Tr2 is connected to a pixel electrode of the light emitting element 244.

The storage capacitor 245 has two electrodes one of which is connected to the gates of the transistors Tr1 and Tr2 and the other of which is connected to the power supply line Vi.

The voltage of the power supply line Vi (power supply voltage) is kept at a constant level. The voltage of the opposite electrode is also kept at a constant level.

In this embodiment, the transistors Tr1 and Tr2 are p-channel transistors. The transistors Tr1 and Tr2 may be n-channel transistors instead. However, the transistors Tr1 and Tr2 have to have the same polarity.

When the anode serves as a pixel electrode and the cathode is used as an opposite electrode, the transistors Tr1 and Tr2 are desirably p-channel transistors. On the other hand, when the anode serves as an opposite electrode and the cathode is used as a pixel electrode, the transistors Tr1 and Tr2 are desirably n-channel transistors.

The gate of the transistor Tr3 is connected to the gate of the transistor Tr5 in this embodiment. Therefore the transistors Tr3 and Tr5 have different polarities.

In this embodiment, the transistors Tr3 and Tr4 are both n-channel transistors. The transistors Tr3 and Tr4 may be p-channel transistors instead. However, the transistors Tr3 and Tr4 have to have the same polarity. The gates of the transistors Tr3 and Tr4 are connected to different wiring lines in this embodiment so that the transistor Tr4 is turned OFF first and then Tr3 is turned OFF as a writing period is ended. By turning the transistor Tr4 OFF earlier than Tr3, leak of electric charges from the storage capacitor 245 through the transistor Tr4 can be prevented.

Similar to the pixel shown in FIG. 3, the description on the operation of the light emitting device that has the pixel of FIG. 11 is divided into one for a writing period Ta and one for a display period Td. The pixel of FIG. 11 during a writing period Ta and a display period Td operates in the same way as the pixel of FIG. 3, which are described in Embodiment Mode 1 with reference to FIGS. 5A and 5B. Accordingly, the description thereof is omitted here.

In the light emitting device of this embodiment, each pixel has one less wiring line than the pixel in the light emitting device of Embodiment Mode 1. Therefore this embodiment can raise the yield in the manufacturing process. The aperture ratio is also improved and, therefore, if the light emitting element emits light toward the substrate on which the wiring lines and the like are formed, the screen is brighter while consuming the same amount of current.

Embodiment 3

This embodiment describes the structure of the pixel in the light emitting device of Embodiment Mode 1 when the gates of the transistors Tr3, Tr4, and Tr5 are connected to the same scanning line.

FIG. 12 shows a detailed structure of the pixel 101 in FIG. 2. The pixel 101 shown in FIG. 12 has a signal line Si (one of S1 to Sx), a scanning line Gj (one of G1 to Gy), and a power supply line Vi (one of V1 to Vx).

The pixel 101 also has a transistor Tr1, a transistor Tr2, a transistor Tr3, a transistor Tr4, a transistor Tr5, a light emitting element 254, and a storage capacitor 255. The storage capacitor 255 is provided to hold the voltage between a gate and source of the transistors Tr1 and Tr2 (gate voltage) more securely, but it is not always necessary.

The gate of the transistor Tr3 is connected to the scanning line Gj. The transistor Tr3 has a source and a drain one of which is connected to the signal line Si and the other of which is connected to a drain of the transistor Tr1.

The gate of the transistor Tr4 is connected to the scanning line Gj. The transistor Tr4 has a source and a drain one of which is connected to the drain of the transistor Tr1 and the other of which is connected to the gate of the transistor Tr1 and to the gate of the transistor Tr2.

A gate of the transistor Tr5 is connected to the scanning line Gj. The transistor Tr5 has a source and a drain one of which is connected to the drain of the transistor Tr1 and the other of which is connected to a drain of the transistor Tr2.

The gates of the transistors Tr1 and Tr2 are connected to each other. Sources of the transistors Tr1 and Tr2 are both connected to the power supply line Vi. The drain of the transistor Tr2 is connected to a pixel electrode of the light emitting element 254.

The storage capacitor 255 has two electrodes one of which is connected to the gates of the transistors Tr1 and Tr2 and the other of which is connected to the power supply line Vi.

The voltage of the power supply line Vi (power supply voltage) is kept at a constant level. The voltage of the opposite electrode is also kept at a constant level.

In this embodiment, the transistors Tr1 and Tr2 are p-channel transistors. The transistors Tr1 and Tr2 may be n-channel transistors instead. However, the transistors Tr1 and Tr2 have to have the same polarity.

When the anode serves as a pixel electrode and the cathode is used as an opposite electrode, the transistors Tr1 and Tr2 are desirably p-channel transistors. On the other hand, when the anode serves as an opposite electrode and the cathode is used as a pixel electrode, the transistors Tr1 and Tr2 are desirably n-channel transistors.

In this embodiment, the transistors Tr3 and Tr4 are both n-channel transistors and the transistor Tr5 is a p-channel transistor. The transistor Tr3 to Tr5 each may be an n-channel transistor or a p-channel transistor. However, the transistors Tr3 and Tr4 have to have the same polarity and the polarity of the transistor Tr5 has to be reverse to the polarity of the transistors Tr3 and Tr4.

Similar to the pixel shown in FIG. 3, the description on the operation of the light emitting device that has the pixel of FIG. 12 is divided into one for a writing period Ta and one for a display period Td. The pixel of FIG. 10 during the writing period Ta and the display period Td operates in the same way as the pixel of FIG. 3, which are described in Embodiment Mode 1 with reference to FIGS. 5A and 5B. Accordingly, the description thereof is omitted here.

In this embodiment, one of the source and drain of the transistor Tr4 is connected to the drain of the transistor Tr1 and the other is connected to the gates of the transistors Tr1 and Tr2. However, the present invention is not limited thereto. It is sufficient in the pixel of the present invention if the transistor Tr4 is connected to other elements or wiring lines such that the gate of the transistor Tr1 is connected to the drain of Tr1 in a writing period Ta whereas the gate of the transistor Tr1 is disconnected from the drain of Tr1 in a display period Td. In short, it is sufficient if Tr3, Tr4, and Tr5 are connected as shown in FIG. 5A during Ta and are connected as shown in FIG. 5B during Td.

In the light emitting device of this embodiment, each pixel has two less wiring lines than the pixel in the light emitting device of Embodiment Mode 1. Further, each pixel has one less wiring line than the pixel in the light emitting device of Embodiment 2. Therefore this embodiment can raise the yield in the manufacturing process. The aperture ratio is also improved and, therefore, if the light emitting element emits light toward the substrate on which the wiring lines and the like are formed, the screen is brighter while consuming the same amount of current.

Embodiment 4

An example of a method of manufacturing the light emitting device in accordance with the present invention will be described with a reference of FIGS. 13 to 17. In this embodiment, a method of manufacturing the light emitting device having pixels as shown in FIG. 3. Note that, transistors Tr3, Tr5, and a transistor arranged in the periphery of a pixel portion will be representatively explained in detail. Although transistors Tr1, Tr2, and Tr4 are not illustrated particularly, it is possible that they are manufactured in accordance with the manufacturing method on this embodiment. Furthermore, in addition to the light emitting device shown in FIG. 3, the light emitting device of the present invention can be manufactured by using the manufacturing method as shown in this embodiment. With respect to the driver circuit, TFTs of CMOS circuit is shown as a basic unit for brief description.

First, as shown in FIG. 13A, a base film 5002 formed of an insulating film such as a silicon oxide film, a silicon nitride film or a silicon oxynitride film is formed on a substrate 5001 formed of glass such as barium borosilicate glass or alumino borosilicate glass represented by #7059 glass and #1737 glass of Coning Corporation. For example, a silicon oxynitride film 5002a formed from $SiH_4$, $NH_3$ and $N_2O$ by the plasma CVD method and having a thickness of from 10 to 200 nm (preferably 50 to 100 nm) is formed. Similarly, a hydrogenerated silicon oxynitride film formed from $SiH_4$ and $N_2O$ and having a thickness of from 50 to 200 nm (preferably 100 to 150 nm) is layered thereon. In this embodiment, the base film 5002 has a two-layer structure, but may also be formed as a single layer film of one of the above insulating films, or a laminate film having more than two layers of the above insulating films.

Island-like semiconductor layers 5003 to 5006 are formed from a crystalline semiconductor film obtained by conducting laser crystallization method or a known thermal crystallization method on a semiconductor film having an amorphous structure. These island-like semiconductor layers 5003 to 5006 each has a thickness of from 25 to 80 nm (preferably 30 to 60 nm). No limitation is put on the material of the crystalline semiconductor film, but the crystalline semiconductor film is preferably formed from silicon, a silicon germanium (SiGe) alloy, etc.

When the crystalline semiconductor film is to be manufactured by the laser crystallization method, an excimer laser, a YAG laser and an $YVO_4$ laser of a pulse oscillation type or continuous light emitting type are used. When these lasers are used, it is preferable to use a method in which a laser beam radiated from a laser oscillator is converged into a linear shape by an optical system and then is irradiated to the semiconductor film. A crystallization condition is suitably selected by an operator. When the excimer laser is used, pulse oscillation frequency is set to 300 Hz, and laser energy density is set to from 100 to 400 $mJ/cm^2$ (typically 200 to 300 $mJ/cm^2$). When the YAG laser is used, pulse oscillation frequency is preferably set to from 30 to 300 kHz by using its second harmonic, and laser energy density is preferably set to from 300 to 600 $mJ/cm^2$ (typically 350 to 500 $mJ/cm^2$). The laser beam converged into a linear shape and having a width of from 100 to 1000 μm, e.g. 400 μm, is irradiated to the entire substrate surface. At this time, overlapping ratio of the linear laser beam is set to from 50 to 90%.

Note that, a gas laser or solid state laser of continuous oscillation type or pulse oscillation type can be used. The gas laser such as an excimer laser, Ar laser, Kr laser and the solid state laser such as YAG laser, $YVO_4$ laser, YLF laser, $YAlO_3$ laser, glass laser, ruby laser, alexandrite laser, Ti: sapphire laser can be used as the laser beam. Also, crystals such as YAG laser, $YVO_4$ laser YLF laser, $YAlO_3$ laser wherein Cr, Nd, Er, Ho, Ce, Co, Ti or Tm is doped can be used as the solid state laser. A basic wave of the lasers is different depending on the materials of doping, therefore a laser beam having a basic wave of approximately 1 μm is obtained. A harmonic corresponding to the basic wave can be obtained by the using non-linear optical elements.

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an Nd:$YVO_4$ laser (basic wave of 1064 nm) is applied. Specifically, laser beams emitted from the continuous oscillation type $YVO_4$ laser with 10 W output is converted into a harmonic by using the non-linear optical elements. Also, a method of emitting a harmonic by applying crystal of $YVO_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 $MW/cm^2$ (preferably 01. to 10 $MW/cm^2$) is required. The semiconductor film is moved at approximately 10 to 2000 cm/s rate relatively corresponding to the laser beams so as to irradiate the semiconductor film.

Next, a gate insulating film 5007 covering the island-like semiconductor layers 5003 to 5006 is formed. The gate insulating film 5007 is formed from an insulating film containing silicon and having a thickness of from 40 to 150 nm by using the plasma CVD method or a sputtering method. In this embodiment, the gate insulating film 5007 is formed from a silicon oxynitride film with a thickness of 120 nm. However, the gate insulating film is not limited to such a silicon oxynitride film, but it may be an insulating film containing other silicon and having a single layer or a laminated layer structure. For example, when a silicon oxide film is used, TEOS (Tetraethyl Orthosilicate) and $O_2$ are mixed by the plasma CVD method, the reaction pressure is set to 40 Pa, the substrate temperature is set to from 300 to 400° C., and the high frequency (13.56 MHz) power density is set to from 0.5 to 0.8 $W/cm^2$ for electric discharge. Thus, the silicon oxide film can be formed by discharge. The silicon oxide film manufactured in this way can then obtain preferable characteristics as the gate insulating film by thermal annealing at from 400 to 500° C.

A first conductive film 5008 and a second conductive film 5009 for forming a gate electrode are formed on the gate insulating film 5007. In this embodiment, the first conductive film 5008 having a thickness of from 50 to 100 nm is formed from Ta, and the second conductive film 5009 having a thickness of from 100 to 300 nm is formed from W.

The Ta film is formed by a sputtering method, and the target of Ta is sputtered by Ar. In this case, when suitable amounts of Xe and Kr are added to Ar, internal stress of the Ta film is released, and pealing off this film can be prevented. Resistivity of the Ta film of a phase is about 20 μΩcm, and this Ta film can be used for the gate electrode. However, resistivity of the Ta film of β phase is about 180 μΩcm, and is not suitable for the gate electrode. When tantalum nitride having a crystal structure close to that of the α phase of Ta and having a thickness of about 10 to 50 nm is formed in advance as the base for the Ta film to form the Ta film of the α phase, the Ta film of a phase can be easily obtained.

The W film is formed by the sputtering method with W as a target. Further, the W film can be also formed by a thermal CVD method using tungsten hexafluoride ($WF_6$). In any case, it is necessary to reduce resistance to use this film as the gate electrode. It is desirable to set resistivity of the W film to be equal to or smaller than 20 μΩcm. When crystal grains of the W film are increased in size, resistivity of the W film can be reduced. However, when there are many impurity elements such as oxygen, etc. within the W film, crystallization is prevented and resistivity is increased. Accordingly, in the case of the sputtering method, a W-target of 99.9999% or 99.99% in purity is used, and the W film is formed by taking a sufficient care of not mixing impurities from a gaseous phase into the W film time when the film is to be formed. Thus, a resistivity of from 9 to 20 μΩcm can be realized.

In this embodiment, the first conductive film 5008 is formed from Ta, and the second conductive film 5009 is formed from W. However, the present invention is not limited to this case. Each of these conductive films may also be formed from an element selected from Ta, W, Ti, Mo, Al and Cu, or an alloy material or a compound material having these elements as principal components. Further, a semiconductor film represented by a polysilicon film doped with an impurity element such as phosphorus may also be used. Examples of combinations other than those shown in this embodiment include: a combination in which the first conductive film 5008 is formed from tantalum nitride (TaN), and the second conductive film 5009 is formed from W; a combination in which the first conductive film 5008 is formed from tantalum nitride (TaN), and the second conductive film 5009 is formed from Al; and a combination in which the first conductive film 5008 is formed from tantalum nitride (TaN), and the second conductive film 5009 is formed from Cu.

Next, a mask 5010 is formed from a resist, and first etching processing for forming an electrode and wiring is performed. In this embodiment, an ICP (Inductively Coupled Plasma) etching method is used, and $CF_4$ and $Cl_2$ are mixed with a gas for etching. RF (13.56 MHz) power of 500 W is applied to the electrode of coil type at a pressure of 1 Pa so that plasma is generated. RF (13.56 MHz) of 100 W power is also applied to a substrate side (sample stage), and a substantially negative self bias voltage is applied. When $CF_4$ and $Cl_2$ are mixed, the W film and the Ta film are etched to the same extent.

Under the above etching condition, end portions of a first conductive layer and a second conductive layer are formed into a tapered shape by effects of the bias voltage applied to the substrate side by making the shape of the mask formed from the resist into an appropriate shape. The angle of a taper portion is set to from 15 to 450. It is preferable to increase an etching time by a ratio of about 10 to 20% so as to perform the etching without leaving the residue on the gate insulating film. Since a selection ratio of a silicon oxynitride film to the W film ranges from 2 to 4 (typically 3), an exposed face of the silicon oxynitride film is etched by about 20 to 50 nm by over-etching processing. Thus, conductive layers 5011 to 5016 of a first shape (first conductive layers 5011a to 5016a and second conductive layers 5011b to 5016b) formed of the first and second conductive layers are formed by the first etching processing. A region that is not covered with the conductive layers 5011 to 5016 of the first shape is etched by about 20 to 50 nm in the gate insulating film 5007, so that a thinned region is formed (FIG. 13B).

Then, an impurity element for giving an n-type conductivity is added by performing first doping processing. A doping method may be either an ion doping method or an ion implantation method. The ion doping method is carried out under the condition that a dose is set to from $1 \times 10^{13}$ to $5 \times 10^{14}$ atoms/$cm^2$, and an acceleration voltage is set to from 60 to 100 keV. An element belonging to group 15, typically, phosphorus (P) or arsenic (As) is used as the impurity element for giving the n-type conductivity. However, phosphorus (P) is used here. In this case, the conductive layers 5011 to 5014 serve as masks with respect to the impurity element for giving the n-type conductivity, and first impurity regions 5017 to 5024 are formed in a self-aligning manner. The impurity element for giving the n-type conductivity is added to the first impurity regions 5017 to 5024 in a concentration range from $1 \times 10^{20}$ to $1 \times 10^{21}$ atoms/$cm^3$ (FIG. 13B).

Second etching processing is next performed without removing the resist mask as shown in FIG. 13C. A W film is etched selectively by using $CF_4$, $Cl_2$ and $O_2$ as the etching gas. The conductive layers 5026 to 5031 of a second shape (first conductive layers 5026a to 5031a and second conductive layers 5026b to 5031b) are formed by the second etching processing. A region of the gate insulating film 5007, which is not covered with the conductive layers 5026 to 5031 of the second shape, is further etched by about 20 to 50 nm so that a thinned region is formed.

An etching reaction in the etching of the W film or the Ta film using the mixed gas of $CF_4$ and $Cl_2$ can be assumed from the vapor pressure of a radical or ion species generated and a reaction product. When the vapor pressures of a fluoride and a chloride of W and Ta are compared, the vapor pressure of $WF_6$ as a fluoride of W is extremely high, and vapor pressures of other $WCl_5$, $TaF_5$ and $TaCl_5$ are approximately equal to each other. Accordingly, both the W film and the Ta film are etched using the mixed gas of $CF_4$ and $Cl_2$. However, when a suitable amount of $O_2$ is added to this mixed gas, $CF_4$ and $O_2$ react and become CO and F so that a large amount of F-radicals or F-ions is generated. As a result, the etching speed of the W film whose fluoride has a high vapor pressure is increased. In contrast to this, the increase in etching speed is relatively small for the Ta film when F is increased. Since Ta is easily oxidized in comparison with W, the surface of the Ta film is oxidized by adding $O_2$. Since no oxide of Ta reacts with fluorine or chloride, the etching speed of the Ta film is further reduced. Accordingly, it is possible to make a difference in etching speed between the W film and the Ta film so that the etching speed of the W film can be set to be higher than that of the Ta film.

As shown in FIG. 14A, second doping processing is then performed. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 keV, and the dose is set to $1 \times 10^{13}$ atoms/$cm^2$. Thus, a new impurity region is formed inside the first impurity region formed in the island-like semiconductor layer in FIG. 13B. In the doping, the conductive layers 5026 to 5029 of the second shape are used as masks with respect to the impurity element, and the doping is performed such that the impurity element is also added to regions underside the first conductive layers 5026a to 5029a. Thus, third impurity regions 5032 to 5035 are formed. The third impurity regions 5032 to 5035 contain phosphorus (P) with a gentle concentration gradient that conforms with the thickness gradient in the tapered portions of the first conductive layers 5026a to 5029a. In the semiconductor layers that overlap the tapered portions of the first conductive layers 5026a to 5029a, the impurity concentration is slightly lower around the center than at the edges of the tapered portions of the first conductive layers 5026a to 5029a. However, the difference is very slight and almost the same impurity concentration is kept throughout the semiconductor layers.

Third etching treatment is then carried out as shown in FIG. 14B. $CHF_6$ is used as etching gas, and reactive ion etching (RIE) is employed. Through the third etching treatment, the tapered portions of the first conductive layers 5026a to 5029a are partially etched to reduce the regions where the first conductive layers overlap the semiconductor layers. Thus formed are third shape conductive layers 5037 to 5042 (first conductive layers 5037a to 5042a and second conductive layers 5037b to 5042b). At this point, regions of the gate insulating film 5007 that are not covered with the third shape conductive layers 5037 to 5042 are further etched and thinned by about 20 to 50 nm.

Third impurity regions 5032 to 5035 are formed through the third etching treatment. The third impurity regions 5032a to 5035a that overlap the first conductive layers 5037a to 5040a, respectively, and second impurity regions 5032b to 5036b each formed between a first impurity region and a third impurity region.

As shown in FIG. 14C, fourth impurity regions 5043 to 5054 having the opposite conductivity type to the first conductivity type are formed in the island-like semiconductor layers 5004 and 5006 for forming p-channel type TFTs. The third shape conductive layers 5038b and 5040b are used as masks against the impurity element and impurity regions are formed in a self-aligning manner. At this point, the island-like semiconductor layers 5003 and 5005 for forming n-channel type TFTs and the wiring portions 5041 and 5042 are entirely covered with a resist mask 5200. The impurity regions 5043 to 5054 have already been doped with phosphorus in different concentrations. The impurity regions 5043 to 5054 are doped with diborane ($B_2H_6$) through ion doping and its impurity concentrations are set to form $2\times10^{20}$ to $2\times10^{21}$ atoms/$cm^3$ in the respective impurity regions.

Through the steps above, the impurity regions are formed in the respective island-like semiconductor layers. The third shape conductive layers 5037 to 5040 overlapping the island-like semiconductor layers function as gate electrodes. Reference numeral 5042 functions as island-like first scanning line. Reference numeral 5041 functions as wirings witch connect an island-like third scanning line and the third shape conductive layer 5040.

After resist mask 5200 is removed, a step of activating the impurity elements added to the island-like semiconductor layers is performed to control the conductivity type. This process is performed by a thermal annealing method using a furnace for furnace annealing. Further, a laser annealing method or a rapid thermal annealing method (RTA method) can be applied. In the thermal annealing method, this process is performed at a temperature of from 400 to 700° C., typically from 500 to 600° C. within a nitrogen atmosphere in which oxygen concentration is equal to or smaller than 1 ppm and is preferably equal to or smaller than 0.1 ppm. In this embodiment, heat treatment is performed for four hours at a temperature of 500° C. When a wiring material used in the third shape conductive layers 5037 to 5042 is weak against heat, it is preferable to perform activation after an interlayer insulating film (having silicon as a principal component) is formed in order to protect wiring, etc. When the laser annealing method is employed, the laser used in the crystallization can be used. When activation is performed, the moving speed is set as well as the crystallization processing, and the energy density of about 0.01 to 100 MW/$cm^2$ (preferably 0.01 to 10 MW/$cm^2$) is required.

Further, the heat treatment is performed for 1 to 12 hours at a temperature of from 300 to 450° C. within an atmosphere including 3 to 100% of hydrogen so that the island-like semiconductor layer is hydrogenated. This step is to terminate a dangling bond of the semiconductor layer by hydrogen thermally excited. Plasma hydrogenation (using hydrogen excited by plasma) may also be performed as another measure for hydrogenation.

Figure 15A:
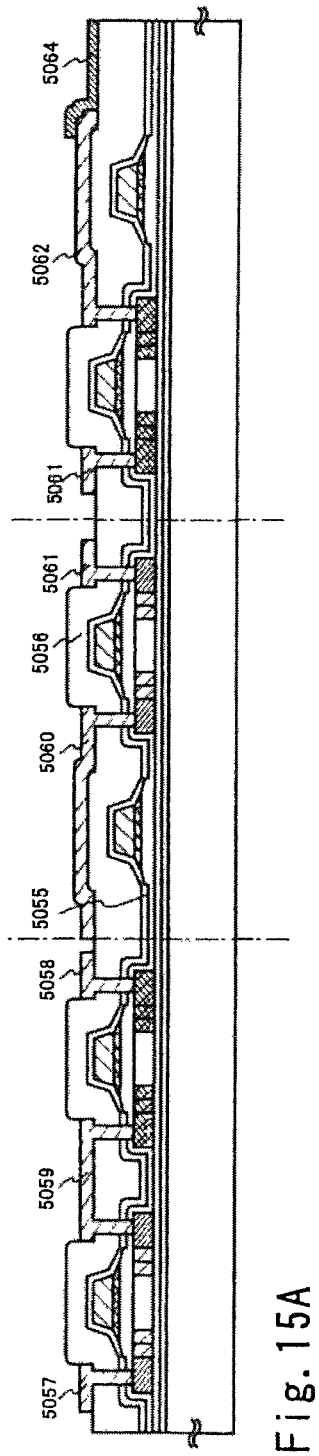
FIGS. 15A and 15B are diagrams showing a method of manufacturing a light emitting device in accordance with the present invention.

Next, as shown in FIG. 15A, a first interlayer insulating film 5055 is formed from a silicon oxynitride film with a thickness of 100 to 200 nm. The second interlayer insulating film 5056 from an organic insulating material is formed on the first interlayer insulating film. Thereafter, contact holes are formed through the first interlayer insulating film 5055, the second interlayer insulating film 5056 and the gate insulating film 5007. Each wirings 5057 to 5062 are patterned and formed. Thereafter, a pixel electrode 5064 coming in contact with the connecting wiring 5062 is patterned and formed.

A film having an organic resin as a material is used as the second interlayer insulating film 5056. Polyimide, polyamide, acrylic, BCB (benzocyclobutene), etc. can be used as this organic resin. In particular, since the second interlayer insulating film 5056 is provided mainly for planarization, acrylic excellent in leveling the film is preferable. In this embodiment, an acrylic film having a thickness that can sufficiently level a level difference caused by the TFT is formed. The film thickness thereof is preferably set to from 1 to 5 μm (is further preferably set to from 2 to 4 μm).

In the formation of the contact holes, contact holes reaching n-type impurity regions 5017, 5018, 5021 and 5022 or p-type impurity regions 5043, 5048, 5049 and 5054, a contact hole reaching wiring 5042 (not illustrated), a contact hole reaching an electric current supply line (not illustrated), and contact holes reaching gate electrodes (not illustrated) are formed.

Further, a laminate film of a three-layer structure is patterned in a desired shape and is used as wirings (including a connecting wiring and signal line) 5057 to 5062. In this three-layer structure, a Ti film with a thickness of 100 nm, an aluminum film containing Ti with a thickness of 300 nm, and a Ti film with a thickness of 150 nm are continuously formed by the sputtering method. Of course, another conductive film may also be used.

In this embodiment, an ITO film of 110 nm in thickness is formed as a pixel electrode 5064, and is patterned. Contact is made by arranging the pixel electrode 5064 such that this pixel electrode 5064 comes in contact with the connecting electrode 5062 and is overlapped with this connecting wiring 5062. Further, a transparent conductive film provided by mixing 2 to 20% of zinc oxide (ZnO) with indium oxide may also be used. This pixel electrode 5064 becomes an anode of the light emitting element (FIG. 15A).

Figure 16:
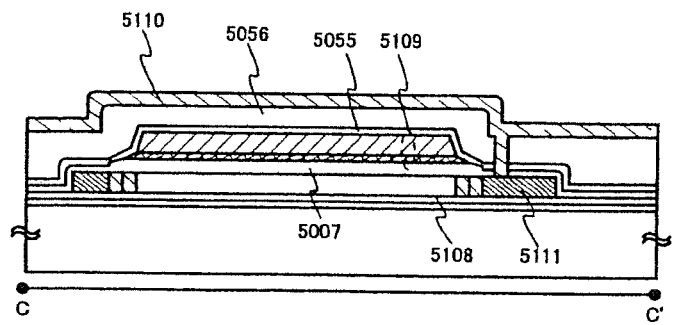
FIG. 16 is a diagram showing a method of manufacturing a light emitting device in accordance with the present invention.
Figure 17:
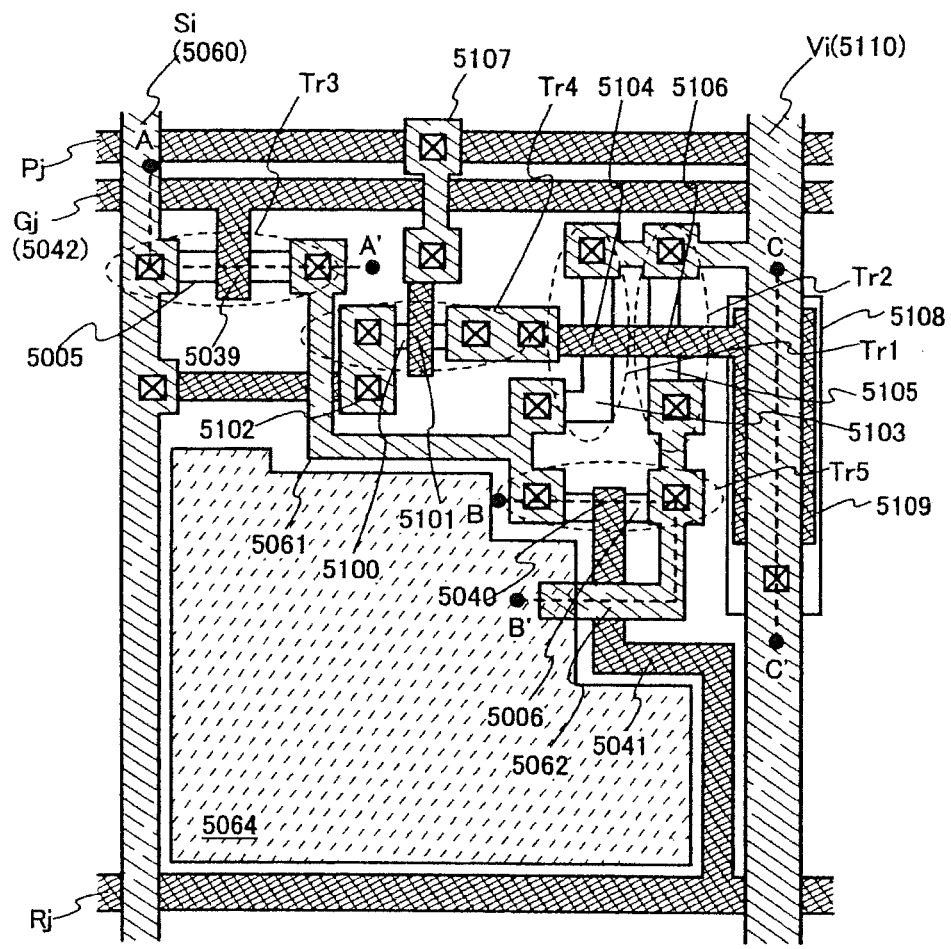
FIG. 17 is a top view of a pixel in a light emitting device of the present invention.

FIG. 17 shows a top view of the pixels in the point which ends up to the step as shown in FIG. 15A. Incidentally, the explanation about the insulating film and the interlayer insulating film is omitted in order to clarify the position of the wirings and the semiconductor layers. A sectional view taken along a line A-A' in FIG. 17 corresponds to the portion taken along a line A-A' in FIG. 15A. A sectional view taken along a line B-B' in FIG. 17 corresponds to the potion taken along a line B-B' in FIG. 15A. Further, a sectional view taken along a line C-C' in FIG. 17 is shown in FIG. 16.

A transistor Tr3 comprises a semiconductor layer 5005 and a gate electrode 5039 which is connected to a first scanning line Gj (5042). The impurity region 5021 formed on the semiconductor layer 5005 (not illustrated in FIG. 17 in particular) is connected to a signal line Si (5060), and the impurity region 5022 (not illustrated in FIG. 17 in particular) is connected to wirings 5061.

A transistor Tr4 has a semiconductor layer 5100 and a gate electrode 5101. Two impurity regions formed on the semiconductor layer 5100 (not illustrated in FIG. 17 in particular) are connected to a wiring 5102 and the signal line Si 5060, respectively. Further, the gate electrode 5101 is connected to a wiring 5107, and the wiring 5107 is connected to a second scanning line Pj.

A transistor Tr1 has a semiconductor layer 5103 and a gate electrode 5104. Two impurity regions formed on the semiconductor layer 5103 (not illustrated in FIG. 17 in particular) are connected to a power supply line Vi (5110) and a wiring 5061, respectively. Further, the gate electrode 5104 is connected to a capacitive electrode 5109.

A transistor Tr2 has a semiconductor layer 5105 and a gate electrode 5106. Two impurity regions formed on the semiconductor layer 5105 (not illustrated in FIG. 17 in particular) are connected to the power supply line Vi (5110) and a wiring 5062, respectively. Further, the gate electrode 5106 is connected to the capacitive electrode 5109.

A transistor Tr5 has a semiconductor layer 5006 and a gate electrode 5040. Two impurity regions formed on the semiconductor layer 5006 (not illustrated in FIG. 17 in particular) are connected to the wiring 5061 and the wiring 5062, respectively. Further, the gate electrode 5040 is connected to a third scanning line Rj through the wiring 5041.

The wiring 5062 is connected to the pixel electrode 5064.

Reference numeral 5108 is a semiconductor layer for capacitance formed by adding impurities on the semiconductor layer. The semiconductor layer for capacitance is overlapped with the capacitive electrode 5109 through the gate insulating film 5007 (not illustrated in FIG. 17 particularly). The capacitive electrode 5109 is overlapped with the power supply line Vi (5110) through the first interlayer insulating film 5055 and the second interlayer insulating film 5056. Further, the power supply line Vi (5110) is connected with a impurity region 5111 comprised on the semiconductor layer 5108 for capacitance via a contact hole formed on the first interlayer insulating film 5055 and the second interlayer insulating film 5056.

Figure 15B:
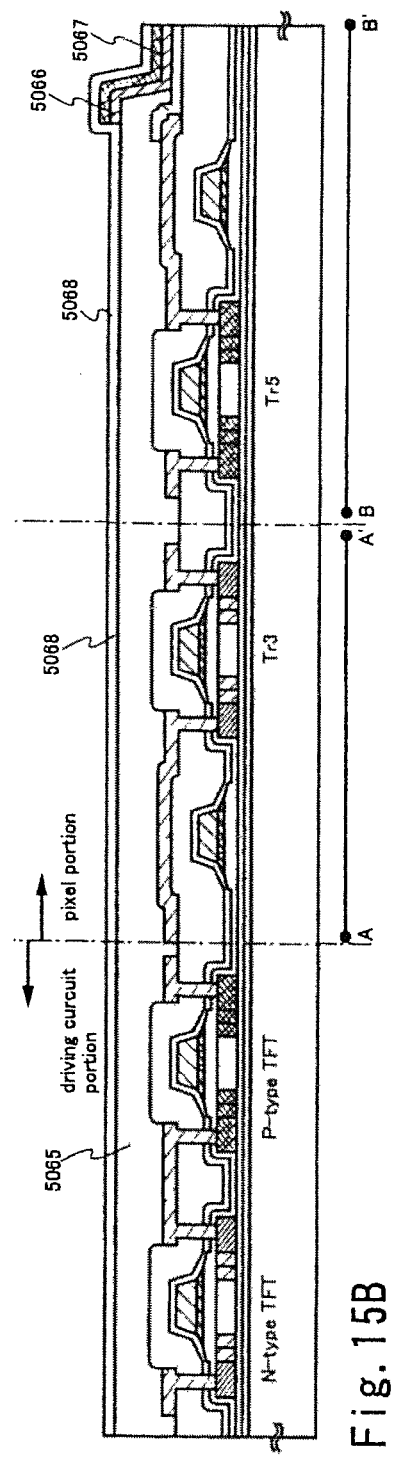

As shown in FIG. 15B, an insulating film (a silicon oxide film in this embodiment) containing silicon and having a thickness of 500 nm is next formed. A third interlayer insulating film 5065 functions as a bank is formed in which an opening is formed in a position corresponding to the pixel electrode 5064. When the opening is formed, a side wall of the opening can easily be tapered by using the wet etching method. When the side wall of the opening is not gentle enough, deterioration of an organic light emitting layer caused by a level difference becomes a notable problem.

Next, an organic light emitting layer 5066 and a cathode (MgAg electrode) 5067 are continuously formed by using the vacuum evaporation method without exposing to the atmosphere. The organic light emitting layer 5066 has a thickness of from 80 to 200 nm (typically from 100 to 120 nm), and the cathode 5067 has a thickness of from 180 to 300 nm (typically from 200 to 250 nm).

In this process, the organic light emitting layer is sequentially formed with respect to a pixel corresponding to red, a pixel corresponding to green and a pixel corresponding to blue. In this case, since the organic light emitting layer has an insufficient resistance against a solution, the organic light emitting layer must be formed separately for each color instead of using a photolithography technique. Therefore, it is preferable to cover a portion except for desired pixels using a metal mask so that the organic light emitting layer is formed selectively only in a required portion.

Namely, a mask for covering all portions except for the pixel corresponding to red is first set, and the organic light emitting layer for emitting red light are selectively formed by using this mask. Next, a mask for covering all portions except for the pixel corresponding to green is set, and the organic light emitting layer for emitting green light are selectively formed by using this mask. Next, a mask for covering all portions except for the pixel corresponding to blue is similarly set, and the organic light emitting layer for emitting blue light are selectively formed by using this mask. Here, different masks are used, but instead the same single mask may be used repeatedly.

Here, a system for forming three kinds of light emitting element corresponding to RGB is used. However, a system in which an light emitting element for emitting white light and a color filter are combined, a system in which the light emitting element for emitting blue or blue green light is combined with a fluorescent substance (a fluorescent color converting medium: CCM), a system for overlapping the light emitting elements respectively corresponding to R, G, and B with the cathodes (opposite electrodes) by utilizing a transparent electrode, etc. may be used.

A known material can be used as the organic light emitting layer 5066. An organic material is preferably used as the known material in consideration of a driving voltage. For example, a four-layer structure consisting of a hole injection layer, a hole transportation layer, a light emitting layer and an electron injection layer is preferably used for the organic light emitting layer.

Next, the cathode 5067 is formed by using metal mask. This embodiment uses MgAg for the cathode 5067 but it is not limited thereto. Other known materials may be used for the cathode 5067.

Finally, a passivation film 5068 formed of silicon nitride film and having a thickness of 300 nm is formed. By forming the passivation film 5068, the passivation film 5068 plays a role of protecting the organic light emitting layer 5066 from moisture or the like. Thus, reliability of the light emitting element can be further improved.

Accordingly, the light emitting device having a structure shown in FIG. 15B is completed.

The light emitting device in this embodiment has very high reliability and improved operating characteristics by arranging the TFTs of the optimal structures in a driving circuit portion in addition to the pixel portion. Further, in a crystallization process, crystallinity can be also improved by adding a metal catalyst such as Ni. Thus, a driving frequency of the signal line driving circuit can be set to 10 MHz or more.

First, the TFT having a structure for reducing hot carrier injection so as not to reduce an operating speed as much as possible is used as an n-channel type TFT of a CMOS circuit forming the driving circuit portion. Here, the driving circuit includes a shift register, a buffer, a level shifter, a latch in line sequential driving, a transmission gate in dot sequential driving, etc.

In the case of this embodiment, an active layer of the n-channel type TFT includes a source region (source), a drain region (drain), an overlapping LDD region ($L_{OV}$ region) that is overlapped with the gate electrode through the gate insulating film, an offset LDD region ($L_{OFF}$ region) that is not overlapped with the gate electrode through the gate insulating film, and channel forming region.

Deterioration by the hot carrier injection m the p-channel type TFT of the CMOS circuit is almost negligible. Therefore, it is not necessary to particularly form the LDD region in this p-channel type TFT. However, similar to the n-channel type TFT, the LDD region can be formed in the p-channel type TFT as a hot carrier countermeasure.

Further, when the CMOS circuit for bi-directionally flowing an electric current through a channel forming region, i.e., the CMOS circuit in which roles of the source and drain regions are exchanged is used in the driving circuit, it is preferable for the n-channel type TFT that constitutes the CMOS circuit to form LDD regions such that the channel forming region is sandwiched between the LDD regions. As an example of this, a transmission gate used in the dot sequential driving is given. When a CMOS circuit required to reduce an OFF-state current value as much as possible is used in the driving circuit, the n-channel type TFT forming the CMOS circuit preferably has a $L_{OV}$ region. The transmission gate used in the dot sequential driving can be given also as an example as such.

In practice, the device reaching the state of FIG. 15B is packaged (enclosed) using a protective film that is highly airtight and allows little gas to transmit (such as a laminate film and a UV-curable resin film) or a light-transmissive sealing material, so as to further avoid exposure to the outside air. A space inside the seal may be set to an inert atmosphere or a hygroscopic substance (barium oxide, for example) may be placed there to improve the reliability of the light emitting element.

After securing the airtightness through packaging or other processing, a connector (flexible printed circuit: FPC) is attached for connecting an external signal terminal with a terminal led out from the elements or circuits formed on the substrate. The device in a state that can be shipped is called display device in this specification.

Furthermore, in accordance with the processes shown in this embodiment, the number of photomasks can be reduced that is need for manufacturing the light emitting device. As a result, the processes can be reduced, and this contributes to a reduction in the manufacturing costs and an increase in throughput.

The method of manufacturing the light emitting device of the present invention is not limited to the method of manufacturing the light emitting device described in this embodiment. Therefore, the light emitting device of the present invention can be fabricated by known method.

This embodiment can be executed by freely combining with Embodiments 1 to 3.

Embodiment 5

In this embodiment, the configuration of a driving circuit of a light emitting device according to the present invention driven by an analog driving method (a signal line driving circuit and a scanning line driving circuit) will be explained.

Figure 18A:
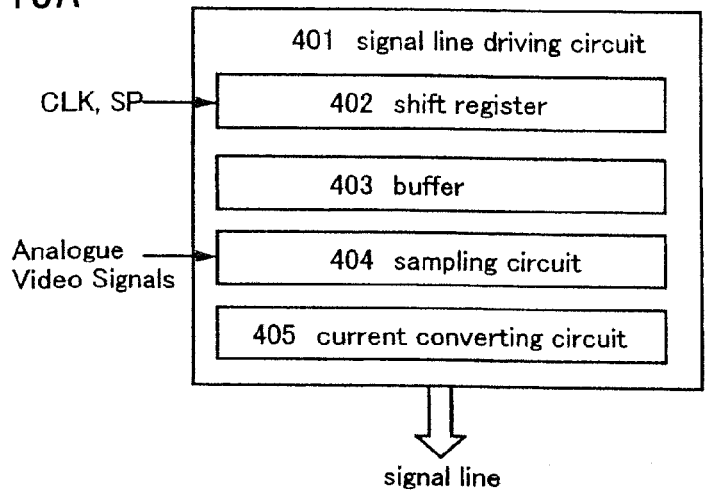
FIGS. 18A and 18B are detailed diagrams of a signal line driving circuit in an analog driving method.

FIG. 18A is a block diagram of a signal line driving circuit 401 of this embodiment. Reference numeral 402 is a shift register, reference numeral 403 is a buffer, reference numeral 404 is a sampling circuit, and reference numeral 405 is a current converting circuit. To the shift register 402, a clock signal (CLK), and a start pulse signal (SP) are inputted. In the case the clock signal (CLK) and the start pulse signal (SP) are inputted to the shift resistor 402, a timing signal is produced.

The produced timing signal is amplified or buffer-amplified by the buffer 403 so as to be inputted to the sampling circuit 404. Moreover, the timing signal can be amplified by providing a level shifter instead of the buffer. Furthermore, both the buffer and the level shifter can be provided.

Figure 18B:
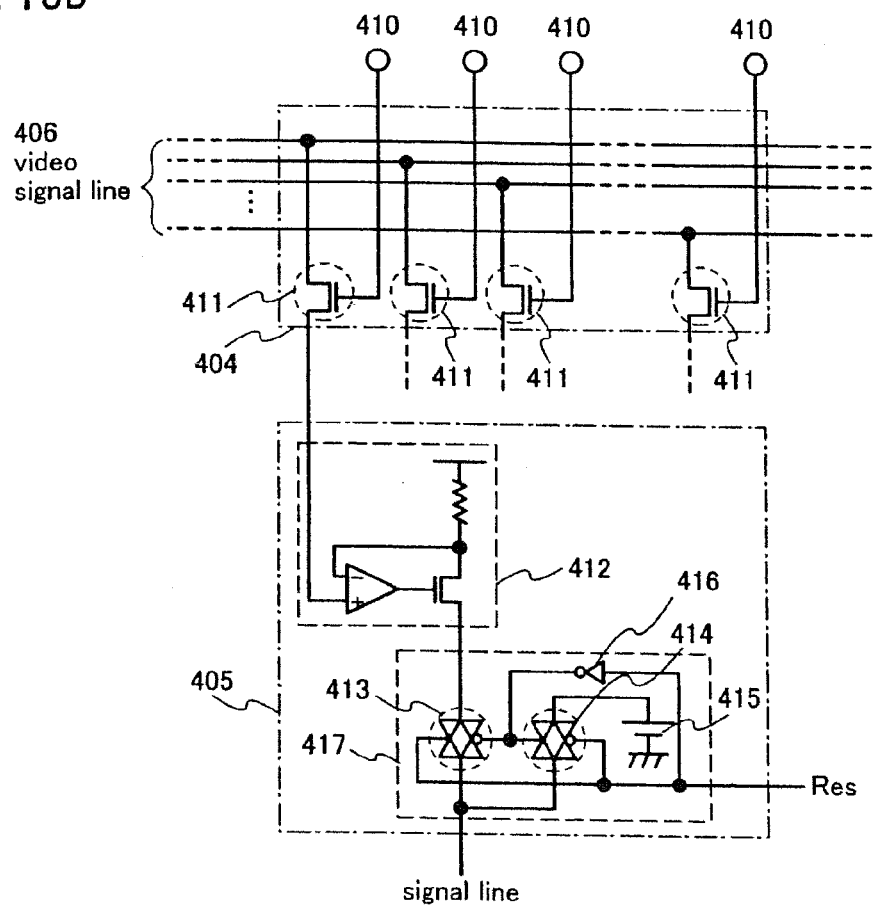

FIG. 18B shows a specific configuration of the sampling circuit 404 and the current converting circuit 405. The sampling circuit 404 is connected with the buffer 403 at the terminal 410.

The sampling circuit 404 is provided with a plurality of switches 411. Furthermore, an analog video signal is inputted from the video signal line 406 to the sampling circuit 404. The switches 411 sample the analog video signal synchronously with the timing signal so as to input the same to the current converting circuit 405 in the later stage. Although FIG. 18B shows only the configuration of the current converting circuit 405 connected with one of the switches 411 of the sampling circuit 404, the current converting circuit 405 as shown in FIG. 18B is connected in the later stage of each switches 411.

Although only one transistor is used for the switches 411 in this embodiment, any switch capable of sampling the analog video signal synchronously with the timing signal can be adopted as the switch 411, and thus it is not limited to the configuration of this embodiment.

The sampled analog video signal is inputted to a current output circuit 412 of the current converting circuit 405. The current output circuit 412 outputs a current (signal current) of a value corresponding to the voltage of the inputted video signal. Although a current output circuit is provided using an amplifier and a transistor in FIG. 18, the present invention is not limited to the configuration, and any circuit capable of outputting the current of a value corresponding to the voltage of the inputted signal can be adopted.

The signal current is inputted to a reset circuit 417 of the current converting circuit 405. The reset circuit 417 has two analog switches 413, 414, an inverter 416, and a power source 415.

A reset signal (Res) is inputted to the analog switch 414, and a reset signal (Res) inverted by the inverter 416 is inputted to the analog switch 413. Then, the analog switch 413 and the analog switch 414 are operated synchronously each with the inverted reset signal and the reset signal such that when one is on, the other is off.

In the case the analog switch 413 is on, the signal current is inputted to the corresponding signal line. In contrast, in the case the analog switch 414 is on, the potential of the power source 415 is provided to the signal line so that the signal line is reset. It is preferable that the voltage of the power source 415 is at substantially same height as the voltage of the power source line provided to the pixel. And the current supplied to the signal line when the signal line is reset is preferably close to 0 as much as possible.

It is preferable that the signal line is reset in the retrace line period. However, it is possible to reset in a period other than the retrace line period as needed as long as it is not a period showing an image.

Incidentally, other circuits that can select the signal line, such as a decoder circuit, may be used instead of the shift register.

Next, a configuration of the scanning line driving circuit will be described.

Figure 19:
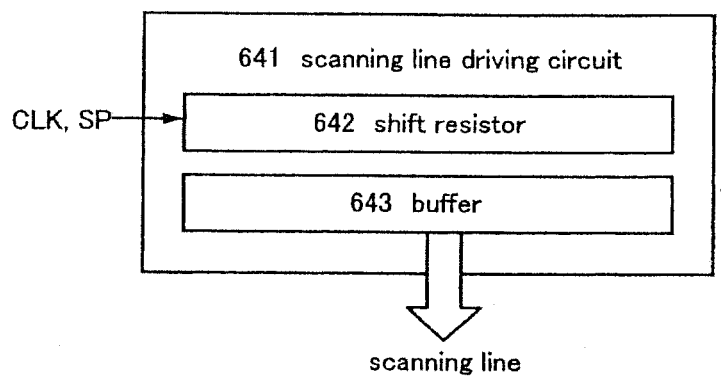
FIG. 19 is a block diagram of a scanning line driving circuit.

FIG. 19 is a block diagram showing a configuration of a scanning line driving circuit 641. The scanning line driving circuit 641 has a shift register 642 and a buffer 643. Further, the scanning line driving circuit 641 may also have a level shifter, depending upon the circumstances.

In the scanning line driving circuit 641, when the clock signal (CLK) and the start pulse signal (SP) are inputted to the shift register 642, a timing signal is produced. The timing signal is buffer-amplified at the buffer 643, thereby the timing signal is provided to a scanning line.

A gate for transistor of a pixel of one line is connected to the scanning line. The one line portion of pixel transistor must all be placed in an ON state simultaneously. A circuit in which a large electric current is capable of flowing is therefore used in buffer 643.

Note that other circuits that can select the scanning line such as the decoder circuit, may be used instead of the shift register.

Note that, the voltage of the first to third scanning lines may be controlled by a plurality of the scanning line driving circuits that corresponds to the respective scanning lines. Also, the voltage of some or all scanning lines may be controlled by one scanning line driving circuit.

The configuration of the signal line driving circuit and the scanning line driving circuit for driving the light emitting device of the present invention is not limited to that shown in this embodiment. The configuration of this embodiment can be executed freely as a combination with the Embodiments 1 to 4.

Embodiment 6

In this embodiment, the configuration of a signal line driving circuit of a light emitting device driven by a digital driving method of the present invention. A configuration of the scanning line driving circuit can be same as the configuration of that in Embodiment 5, a specific explanation is therefore omitted in this embodiment.

Figure 20:
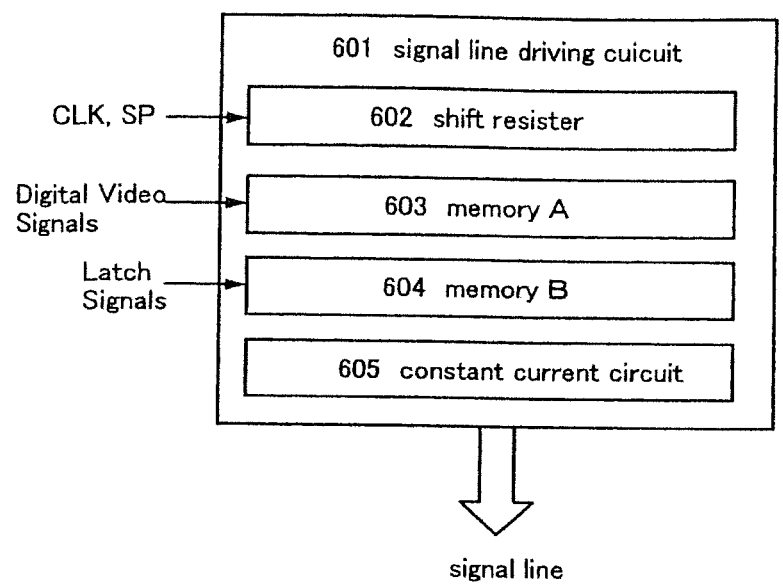
FIG. 20 is a block diagram of a signal line driving circuit in a digital driving method.

FIG. 20 is a block diagram showing the configuration of a signal line driving circuit 601. Reference numeral 602 is a shift registor, reference numeral 603 is a memory circuit A, reference numeral 604 is a memory circuit B, and reference numeral 605 is a constant current circuit.

To the shift register 602, a clock signal CLK and a start pulse signal SP are inputted. Moreover, to the memory circuit A 603, digital video signals are inputted. And to the memory circuit B 604, latch signals are inputted. A signal current Ic outputted from the constant current circuit 605 is inputted to the signal line.

Figure 21:
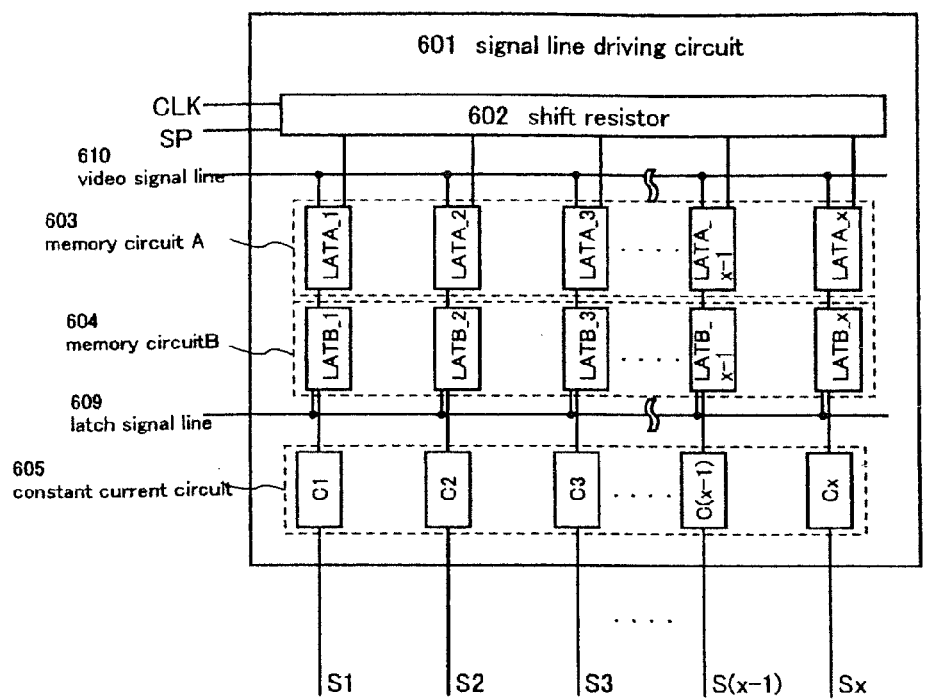
FIG. 21 is a detailed diagram of a signal line driving circuit in a digital driving method.

FIG. 21 shows a further detailed configuration of the signal line driving circuit 601.

According to the input of the clock signal CLK and the start pulse signal SP from a predetermined wiring to the shift register 602, a timing signal is produced. The timing signal is inputted each to a plurality of latches A (LATA-1 to LATA-x) of the memory circuit A 603. At the time, it is also possible to input the timing signal produced by the shift register 602 to a plurality of the latches A (LATA-1 to LATA-x) of the memory circuit A 603 after buffer amplification by a buffer, or the like.

In the case the timing signal is inputted to the memory circuit A 603, a digital video signal for one bit to be inputted to the video signal line 610 is written successively to each of the plurality of the latches A (LATA-1 to LATA-x) synchronously with the timing signal so as to be stored.

Although the digital video signal is inputted successively to the plurality of the latches A (LATA-1 to LATA-x) of the memory circuit A 603 at the time of taking the digital video signal to the memory circuit A 603 in this embodiment, the present invention is not limited to this configuration. It is also possible to execute the so-called divided drive of driving latches of a plurality of stages of the memory circuit A 603 into several stages, and inputting a digital video signal simultaneously for each group. The number of the groups at the time is called the division number. For example, in the case latches are divided into groups for 4 stages, it is called the four division divided drive.

The time needed for finishing each writing operation of a digital video signal to the latches of all the stages of the memory circuit A 603 is called the line period. In the real situation, the period with the horizontal retrace line period added to the line period may be referred to as the line period.

In the case one line period is finished, a latch signal is supplied to a plurality of latches B (LATB.1 to LATB.x) of the memory circuit B 604 via the latch signal line 609. At the moment, the digital video signals stored in the plurality of the latches A (LATA.1 to LATA.x) of the memory circuit A 603 are written and stored in the plurality of the latches B (LATB.1 to LATB.x) of the memory circuit B 604 all together.

A digital video signal for the next one bit is written in the memory circuit A 603 after sending out the digital video signals to the memory circuit B 604, based on the timing signal from the shift register 602 successively.

In the second one line period, the digital video signals written and stored in the memory circuit B 604 are inputted to the constant current circuit 605.

The constant current circuit 605 has a plurality of current setting circuits (C1 to Cx). In the case a digital video signal is inputted to each of the current setting circuits (C1 to Cx), based on the information of 1 or 0 of the digital video signal, either supply of a constant current Ic in the signal line, or application of a potential of the power source lines V1 to Vx to the signal line, is selected.

Figure 22:
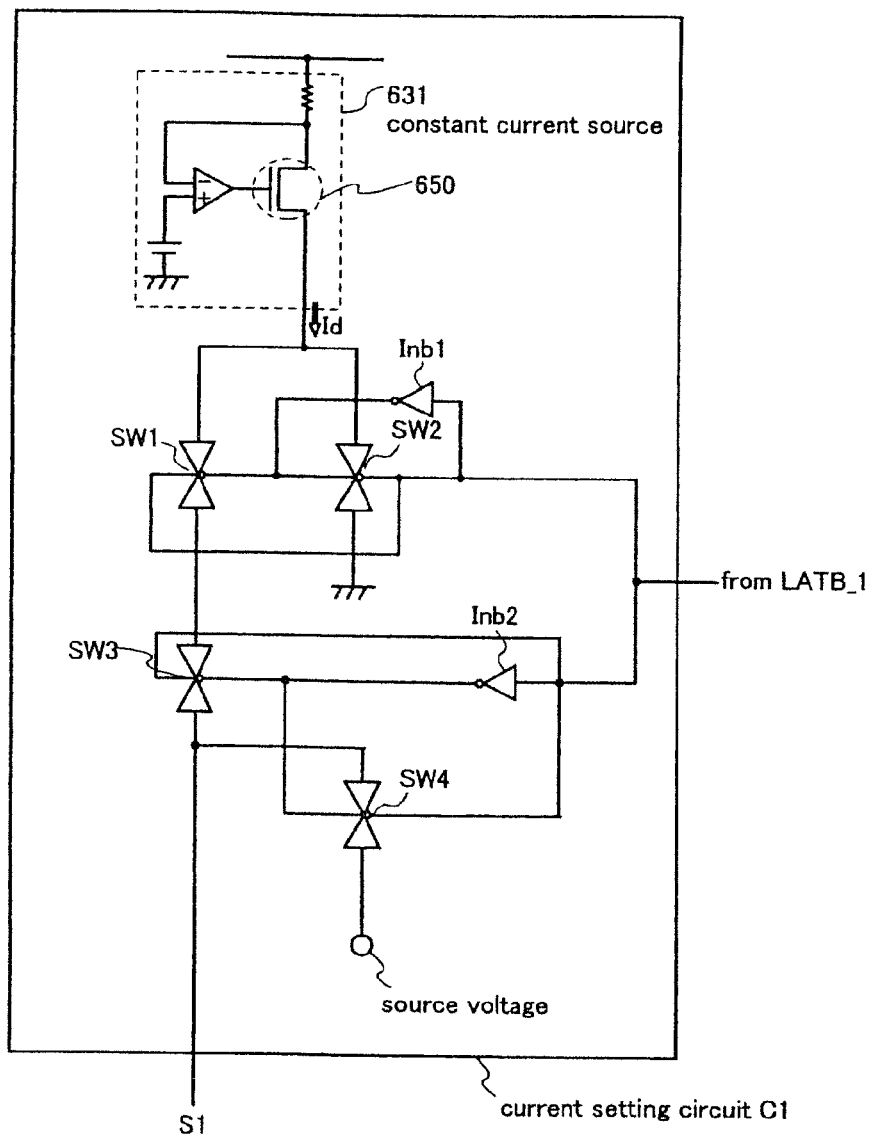
FIG. 22 is a circuit diagram of a current setting circuit in a digital driving method.

FIG. 22 shows an example of a specific configuration of the current setting circuit C1. The current setting circuits C2 to Cx have the same configuration.

The current setting circuit C1 has a constant current source 631, four transmission gates SW1 to SW4, and two inverters Inb1, Inb2. The polarity of the transistor 650 of the constant current source 631 is same as the polarity of the transistors Tr1 and Tr2 of the pixel.

According to the digital video signal outputted from the LATB.1 of the memory circuit B 604, the switching operation of SW1 to SW4 is controlled. The digital video signals inputted to SW1 and SW3 and the digital video signals inputted to SW2 and SW4 are inverted by Inb1, Inb2. Therefore, in the case SW1 and SW3 are on, SW2 and SW4 are off, and in the case SW1 and SW3 are off, SW2 and SW4 are on.

In the case SWL and SW3 are on, a current Ic of a predetermined value except 0 is inputted from the constant current source 631 to the signal line S1 via SW1 and SW3.

In contrast, in the case SW2 and SW4 are on, the current Id from the constant current source 631 is provided to the ground via SW2. Moreover, the power source potential from the power source lines V1 to Vx is provided to the signal line S1 via SW4 so as to be Ic≈0.

With reference to FIG. 21, the above-mentioned operation is executed simultaneously in a one line period for all the current setting circuits (C1 to Cx) of the constant current circuit 605. Therefore, the value of the signal current Ic inputted to all the signal lines is selected by the digital video signals.

The driving circuit used in the present invention is not limited to the configuration shown in this embodiment. The constant current circuit shown in this embodiment is not limited to the configuration shown in FIG. 22. The constant current circuit used in the present invention can have any configuration as long as either one of the binary of the signal current Ic can be selected by the digital video signal, and the signal current of the selected value can be provided to the signal line.

Note that the other circuits that can select the signal lines such as a decoder circuit, for example, may be used instead of the shift register.

The configuration of this embodiment can be executed by freely combining with Embodiments 1 to 4.

Embodiment 7

In this embodiment, an external light emitting quantum efficiency can be remarkably improved by using an organic light emitting material by which phosphorescence from a triplet exciton can be employed for emitting a light. As a result, the power consumption of the light emitting element can be reduced, the lifetime of the light emitting element can be elongated and the weight of the light emitting element can be lightened.

The following is a report where the external light emitting quantum efficiency is improved by using the triplet exciton (T. Tsutsui, C. Adachi, S. Saito, Photochemical processes in Organized Molecular Systems, ed. K. Honda, (Elsevier Sci. Pub., Tokyo, 1991) p. 437).

The molecular formula of an organic light emitting material (coumarin pigment) reported by the above article is represented as follows.
(Chemical Formula 1)
(M. A. Baldo, D. F. O'Brien, Y. You, A. Shoustikov, S. Sibley, M. E. Thompson, S. R. Forrest, Nature 395 (1998) p. 151)

The molecular formula of an organic light emitting material (Pt complex) reported by the above article is represented as follows.
(Chemical Formula 2)
(M. A. Baldo, S. Lamansky, P. E. Burrows, M. E. Thompson, S. R. Forrest, Appl. Phys. Lett., 75 (1999) p. 4.)
(T. Tsutsui, M.-J. Yang, M. Yahiro, K. Nakamura, T. Watanabe, T. Tsuji, Y. Fukuda, T. Wakimoto, S. Mayaguchi, Jpn, Appl. Phys., 38 (12B) (1999) L1502.)

The molecular formula of an organic light emitting material (Ir complex) reported by the above article is represented as follows.
(Chemical Formula 3)

As described above, if phosphorescence from a triplet exciton can be put to practical use, it can realize the external light emitting quantum efficiency three to four times as high as that in the case of using fluorescence from a singlet exciton in principle.

The configuration of this embodiment can be executed by freely combining with Embodiments 1 to 6.

Embodiment 8

Figure 23A:
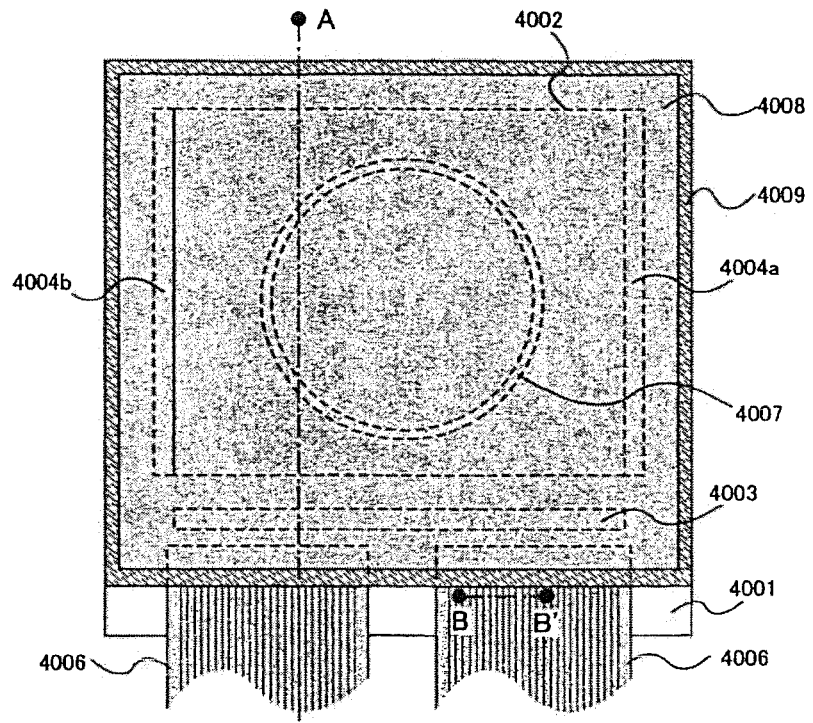
FIGS. 23A to 23C are an exterior view and sectional views of a light emitting device of the present invention.
Figure 23B:
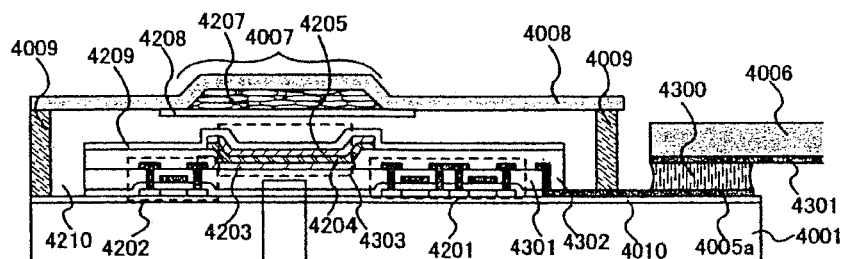
Figure 23C:
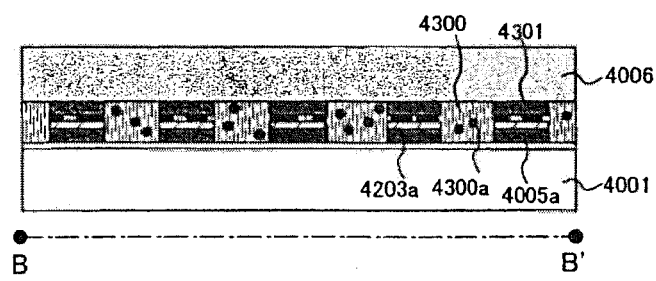

This embodiment deals with the fabrication of the light emitting device according to the invention with reference to FIGS. 23A to 23C.

FIG. 23A is a top view of the light emitting device that is fabricated by sealing a element substrate on witch a thin film transistor is formed thereof by a sealing material. FIG. 23B is a sectional view of taking along a line A-A' in FIG. 23A. FIG. 23C is a sectional view of taking along a line B-B' in FIG. 23A.

The sealing member 4009 is so provided as to surround a pixel unit 4002, signal line driving circuit 4003, and first and second scanning line driving circuits 4004a, 4004b formed on the substrate 4001. Further, a sealing member 4008 is provided on the pixel unit 4002, on the signal line driving circuit 4003 and on the first and second scanning line driving circuits 4004a, 4004b. Accordingly, the pixel unit 4002, signal line driving circuit 4003, and first and second scanning line driving circuits 4004a, 4004b are sealed with a filler material 4210 being surrounded by the substrate 4001, sealing member 4009 and sealing member 4008.

Plural TFTs are possessed by the pixel unit 4002, by the signal line driving circuit 4003 and by the first and second scanning line deriving circuits 4004a, 4004b formed on the substrate 4001. FIG. 23(B) representatively illustrates driver TFTs (here, an n-channel type TFT and a p-channel type TFT) 4201 formed on the base film 4010 and included in the signal line driving circuit 4003, and a transistor Tr5 4202 included in the pixel unit 4002.

In this embodiment, the driver TFT 4201 is a p-channel type TFT or an n-channel type TFT fabricated by a known method, and the transistor Tr5 4202 is a p-channel type TFT fabricated by a known method.

An interlayer insulating film (flattened film) 4301 is formed on the driver TFT 4201 and on the transistor Tr5 4202, and on which is formed a pixel electrode (anode) 4203 electrically connected to the transistor Tr5 4202. As the pixel electrode 4203, there is used a transparent conductive film having a large work function. As the transparent conductive film, there can be used a compound of indium oxide and tin oxide, a compound of indium oxide and zinc oxide, zinc oxide, tin oxide or indium oxide. It is also allowable to add gallium to the transparent conductive film.

An insulating film 4302 is formed on the pixel electrode 4203. An opening is formed in the insulating film 4302 on the pixel electrode 4203. An organic light emitting layer 4204 is formed in the opening on the pixel electrode 4203. The organic light emitting layer 4204 may be made of a known organic light emitting material or an inorganic light emitting material. Further, the organic light emitting material may be either a low-molecular (monomeric) material or a high molecular (polymeric) material.

The organic light emitting layer 4204 may be formed by a known deposition technology or a coating technology. Further, the organic light emitting layer may have a laminated-layer structure of a hole-injection layer, a hole-transporting layer, a light emitting layer, and an electron-transporting layer or an electron injection layer, or may have a single-layer structure.

On the organic light emitting layer 4204 is formed a cathode 4205 comprising a conductive film (typically, a conductive film comprising chiefly aluminum, copper or silver, or a laminated-layer film thereof with other conductive films) having light-shielding property. It is desired that water and oxygen are removed as much as possible from the interface between the cathode 4205 and the organic light emitting layer 4204. It is therefore necessary to make such a contrivance that the organic light emitting layer 4204 is formed in a nitrogen or a rare gas atmosphere, and the cathode 4205 is formed while being kept away from oxygen and water. In this embodiment, the film is formed as described above by using a film-forming device of the multi-chamber type (cluster tool type). A predetermined voltage is given to the cathode 4205.

There is thus formed an light emitting element 4303 comprising the pixel electrode (anode) 4203, light emitting layer 4204 and cathode 4205. A protection film 4209 is formed on the insulating film 4302 so as to cover the light emitting element 4303. The protection film 4209 is effective in preventing oxygen and water from entering into the light emitting element 4303.

Reference numeral 4005a is a detour wiring connected to the power supply wiring, and is electrically connected to the source region of the transistor Tr5 4202. The detour wiring 4005*a* is electrically connected to the FPC wiring 4301 possessed by the FPC 4006 passing through between the sealing member 4009 and the substrate 4001 and via an anisotropic conductive film 4300.

As the sealing member 4008, there can be used a glass member, a metal member (representatively, a stainless steel member), a ceramic member or a plastic member (inclusive of a plastic film). As the plastic member, there can be used an FRP (Fiberglass-Reinforced Plastic) plate, a PVF (polyvinyl fluoride) film, a Mylar film, a polyester film, or an acrylic resin film. It is also allowable to use a sheet of a structure in which an aluminum foil is sandwiched by the PVF films or the Mylar films.

When light emitted from the light emitting element is directed toward the cover member, however, the cover member must be transparent. In this case, use is made of a transparent material such as glass plate, a plastic plate, a polyester film or an acrylic film.

As the filler material 4210, there can be used an ultraviolet-ray curable resin or a thermosetting resin in addition to the inert gas such as nitrogen or argon. Namely, there can be used a PVC (polyvinyl chloride), an acrylic resin, a polyimide, an epoxy resin, a silicone resin, a PVB (polyvinyl butyral) or an EVA (ethylenevinyl acetate). In this embodiment, nitrogen is used as the filler material.

In order to have the filler material 4210 exposed to a hygroscopic material (preferably, barium oxide) or a material capable of adsorbing oxygen, further, a recessed portion 4007 is formed in the sealing member 4008 on the side of the substrate 4001, and the hygroscopic material or the material 4207 capable of adsorbing oxygen is disposed therein. The hygroscopic material or the material 4207 capable of adsorbing oxygen is held in the recessed portion 4007 by a recessed portion-covering member 4208, so that the hygroscopic material or the material 4207 capable of adsorbing oxygen will not scatter. The recessed portion-covering member 4208 is of the form of a fine mesh which permits the air or water to pass through but does not permit the passage of the hygroscopic material or the material 4207 that adsorbs oxygen. Provision of the hygroscopic material or the material 4207 capable of adsorbing oxygen suppresses the deterioration of the light emitting element 4303.

Referring to FIG. 23C, the conductive film 4203*a* is formed to come in contact onto the detour wiring 4005*a* simultaneously with the formation of the pixel electrode 4203.

The anisotropic film 4300 has an conductive filler 4300*a*. Upon thermally adhering the substrate 4001 and the FPC 4006 together, the conductive film 4203*a* on the substrate 4001 and the wiring 4301 for FPC on the FPC 4006 are electrically connected together through the conductive filler 4300*a*.

The configuration of this embodiment can be executed by freely combining with Embodiments 1 to 7.

Embodiment 9

Organic light emitting materials used for light emitting elements are roughly divided into low molecular weight materials and high molecular weight materials. A light emitting device of the present invention can use either low molecular weight organic light emitting materials or high molecular weight organic light emitting materials.

Low molecular weight organic light emitting materials are formed into films by evaporation. Therefore low molecular weight organic light emitting materials are easy to form a laminate structure and easy to increase the efficiency by layering films of different functions such as a hole transporting layer and an electron transporting layer.

Typical examples of low molecular weight organic light emitting material include an aluminum complex with quinolinol as a ligand ($Alq_3$) and a triphenyl amine derivative (TPD).

On the other hand, high molecular weight organic light emitting materials have higher physical strength than that of low molecular weight and elements formed of high molecular weight organic light emitting materials are highly durable. High molecular weight organic light emitting materials can be formed into films by application, and therefore manufacturing the elements from them is relatively easy.

The structure of a light emitting element formed of a high molecular weight organic light emitting material is basically the same as the structure of a light emitting element formed of a low molecular weight organic light emitting material, and is composed of a cathode, an organic light emitting layer, and an anode. However, it is difficult to form from a high molecular weight organic light emitting material an organic light emitting layer having a laminate structure as one formed of a low molecular weight organic light emitting material.

The most popular of known laminate structures for an organic light emitting layer formed of a high molecular weight organic light emitting material is the two-layer structure. Specifically, the two layer structure is a light emitting layer and hole transporting layer that are sandwiched between a cathode and an anode. Ca may be used as a cathode material in a light emitting element formed of a high molecular weight organic light emitting material.

The color of light emitted from an element is determined by the material of its light emitting layer. Accordingly, a light emitting element that emits light of desired color can be obtained by selecting an appropriate light emitting layer material. Typical examples of high molecular weight organic light emitting material that can be used to form a light emitting layer include polyparaphenylene vinylene-based materials, polyparaphenylene-based materials, polythiophene-based materials, and polyfluorene-based materials.

Examples of the polyparaphenylenevinylenes include poly(paraphenylenevinylene) [PPV] derivatives such as poly(2,5-dialkoxy-1,4-phenylenevinylene) [RO—PPV], poly(2-(2'-ethyl-hexoxy)-5-methoxy-1,4-phenylenevinylene) [MEH-PPV], and poly(2-dialkoxyphenyl-1,4-phenylenevinylene) [ROPh-PPV].

Examples of the polyparaphenylenes include polyparaphenylene [PPP] derivatives such as poly(2,5-dialkoxy-1,4-phenylene) [RO—PPP], and poly(2,5-dihexoxy-1,4-phenylene).

Examples of the polythiophenes include polythiophene [PT] derivatives such as poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)thiophene] [POPT], and poly[3-(4-octylphenyl)-2,2-bithiophene] [PTOPT].

Examples of the polyfluorenes include polyfluorene [PF] derivatives such as poly(9,9-dialkylfluorene) [PDAF], and poly(9,9-dioctylfluorene) [PDOF].

Injection of holes from the anode can be improved if a film of high molecular weight organic light emitting material capable of transporting holes is sandwiched between the anode and a light emitting layer that is formed of a high molecular weight organic light emitting material. Generally, the hole transporting material together with an acceptor material is dissolved into water, and the obtained solution is applied by spin coating. Since the hole transporting material is insoluble in an organic solvent, a film of the hole transporting material can form a laminate with a light emitting layer formed of a high molecular weight organic material.

Examples of the hole transporting high molecular weight organic light emitting material include a mixture of PEDOT and camphor sulfonic acid (CSA) that is an acceptor material, and a mixture of polyaniline (PANI) and polystyrene sulfonic acid (PSS) that is an acceptor material.

The structure of this embodiment may be combined with any one of the structures of Embodiments 1 through 8.

Embodiment 10

A light emitting device using a light emitting element is self-luminous and therefore is superior in visibility in bright surroundings compared to liquid crystal display devices and has wider viewing angle. Accordingly, it can be used for display portions of various electric equipments.

Given as embodiments of electric equipment employing a light emitting device formed by the present invention is applied are: a video camera; a digital camera; a goggle type display (head mounted display); a navigation system; an audio reproducing device (car audio, an audio component, and the like); a laptop computer; a game machine; a portable information terminal (a mobile computer, a cellular phone, a portable game machine, an electronic book, etc.); and an image reproducing device equipped with a recording medium (specifically, a device equipped with a display device which can reproduce a recording medium such as a digital versatile disk (DVD), and can display the image). The light emitting device having a light emitting element is desirable particularly for a portable information terminal since its screen is often viewed obliquely and is required to have a wide viewing angle. Specific examples of the electric equipment are shown in FIGS. 24A to 24H.

Figure 24A:
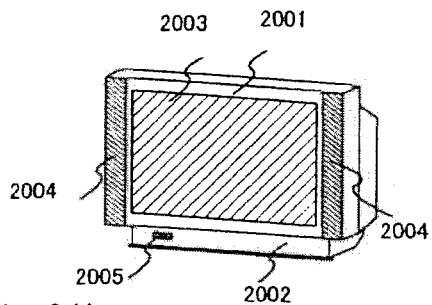
FIGS. 24A to 24H are diagrams showing electronic equipment using a light emitting device of the present invention.

FIG. 24A shows a display device, which comprises a casing 2001, a supporting base 2002, a display portion 2003, speaker portions 2004, a video input terminal 2005, etc. The light emitting device formed by the present invention is applied can be used for the display portion 2003. The light emitting device is self-luminous and does not need a backlight, so that it can make a thinner display portion than liquid display devices can. The term display device includes every display device for displaying information such as one for a personal computer, one for receiving TV broadcasting, and one for advertisement.

Figure 24B:
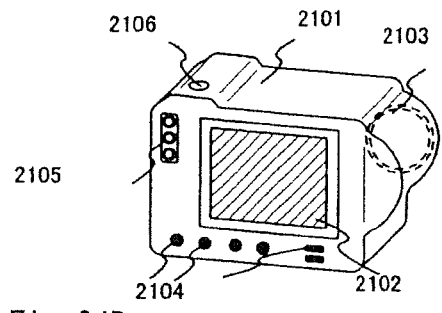

FIG. 24B shows a digital still camera, which comprises a main body 2101, a display portion 2102, an image receiving portion 2103, operation keys 2104, an external connection port 2105, a shutter 2106, etc. The light emitting device formed by the present invention is applied can be used for the display portion 2102.

Figure 24C:
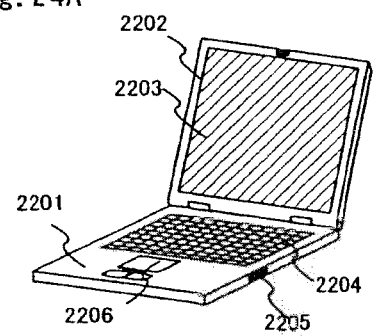

FIG. 24C shows a laptop computer, which comprises a main body 2201, a casing 2202, a display portion 2203, a keyboard 2204, an external connection port 2205, a pointing mouse 2206, etc. The light emitting device formed by the present invention is applied can be used for the display portion 2203.

Figure 24D:
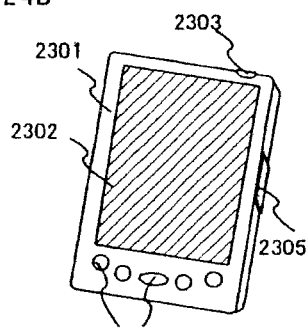

FIG. 24D shows a mobile computer, which comprises a main body 2301, a display portion 2302, a switch 2303, operation keys 2304, an infrared ray port 2305, etc. The light emitting device formed by the present invention is applied can be used for the display portion 2302.

Figure 24E:
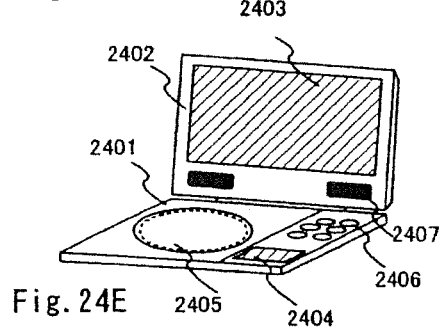

FIG. 24E shows a portable image reproducing device equipped with a recording medium (a DVD player, to be specific). The device comprises a main body 2401, a casing 2402, a display portion A 2403, a display portion B 2404, a recording medium (DVD or the like) reading portion 2405, operation keys 2406, speaker portions 2407, etc. The display portion A 2403 mainly displays image information whereas the display portion B 2404 mainly displays text information. The light emitting device formed by the present invention is applied can be used for the display portions A 2403 and B 2404. The term image reproducing device equipped with a recording medium includes domestic game machines.

Figure 24F:
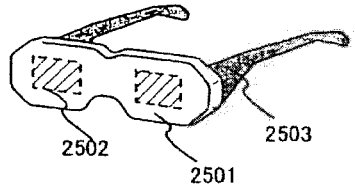

FIG. 24F shows a goggle type display (head mounted display), which comprises a main body 2501, display portions 2502, and arm portions 2503. The light emitting device formed by the present invention is applied can be used for the display portions 2502.

Figure 24G:
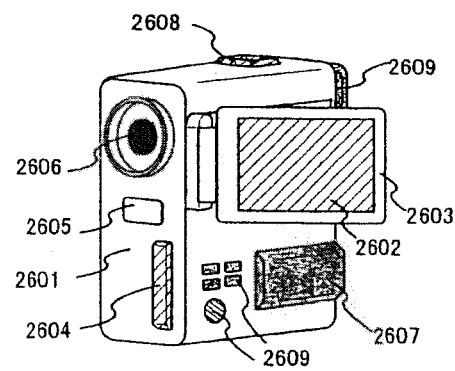

FIG. 24G shows a video camera, which comprises a main body 2601, a display portion 2602, a casing 2603, an external connection port 2604, a remote control receiving portion 2605, an image receiving portion 2606, a battery 2607, an audio input portion 2608, operation keys 2609, eyepiece portion 2610 etc. The light emitting device formed by the present invention is applied can be used for the display portion 2602.

Figure 24H:
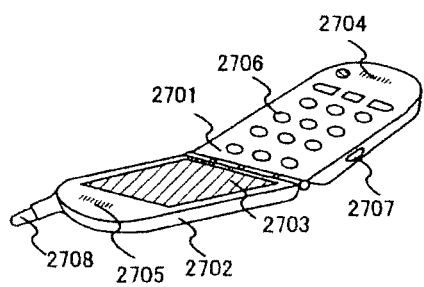

FIG. 24H shows a cellular phone, which comprises a main body 2701, a casing 2702, a display portion 2703, an audio input portion 2704, an audio output portion 2705, operation keys 2706, an external connection port 2707, an antenna 2708, etc. The light emitting device formed by the present invention is applied can be used for the display portion 2703. If the display portion 2703 displays white characters on a black background, power consumption of the cellular phone can be reduced.

If the luminance of light emitted from organic light emitting materials is increased in future, the light emitting device can be used also in a front or rear projector in which light bearing outputted image information is magnified by a lens or the like to be projected on a screen.

The electric equipment given in the above often displays information distributed through electronic communication lines such as Internet and CATV (cable television), especially, animation information with increasing frequency. The light emitting device having a light emitting element is suitable for displaying animation information since organic materials have fast response speed.

In the light emitting device, portions that emit light consume power. Therefore, it is desirable to display information such that as small portions as possible emits light. Accordingly, if the light emitting device is used for a display portion that mainly displays text information such as a portable information terminal, in particular, a cellular phone, and an audio reproducing device, it is desirable to assign light emitting portions to display text information while portions that do not emit light serve as the background.

As described above, the application range of the light emitting device to which the present invention is applied is very wide and electric equipment of every field can employ the device. The electric equipments in this embodiment may use the light emitting device formed in Embodiments 1 to 9 to the display portion thereof.

Embodiment 11

This embodiment gives a description on the structure of the pixel 101 of the light emitting device shown in FIG. 2.

Figure 28:
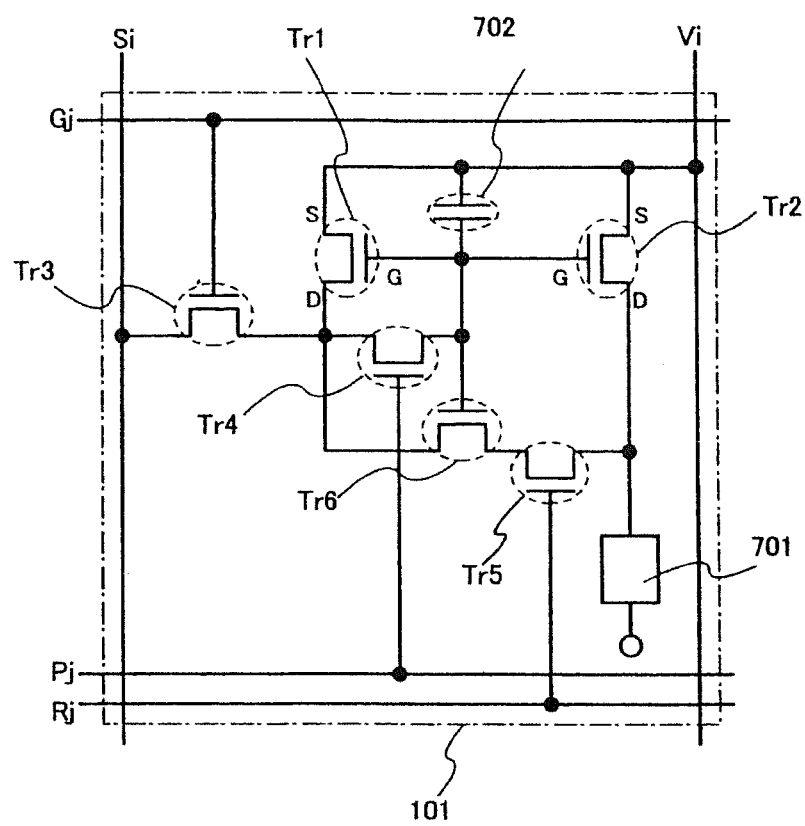
FIG. 28 is a circuit diagram of a pixel in a light emitting device of the present invention.

FIG. 28 shows a detailed structure of the pixel 101 in FIG. 2. The pixel 101 shown in FIG. 28 has a signal line Si (one of S1 to Sx), a first scanning line Gj (one of G1 to Gy), a second scanning line Pj (one of P1 to Py), a third scanning line Rj (one of R1 to Ry), and a power supply line Vi (one of V1 to Vx).

The pixel 101 also has a transistor Tr1, a transistor Tr2, a transistor Tr3, a transistor Tr4, a transistor Tr5, a transistor Tr6, a light emitting element 701, and a storage capacitor 702. The storage capacitor 702 is provided to hold the voltage between a gate and source of the transistors Tr1 and Tr2 (gate voltage) more securely, but it is not always necessary.

A gate of the transistor Tr3 is connected to the first scanning line Gj. The transistor Tr3 has a source and a drain one of which is connected to the signal line Si and the other of which is connected to a drain of the transistor Tr1.

A gate of the transistor Tr4 is connected to the second scanning line Pj. The transistor Tr4 has a source and a drain one of which is connected to the drain of the transistor Tr1 and the other of which is connected to the gate of the transistor Tr1 and to the gate of the transistor Tr2.

A gate of the transistor Tr6 is connected to the gates of the transistors Tr1 and Tr2. The transistor Tr6 has a source and a drain one of which is connected to a drain of the transistor Tr1 and the other of which is connected to the source or the drain of the transistor Tr5.

A gate of the transistor Tr5 is connected to the third scanning line Rj. The transistor Tr5 has a source and a drain one of which is connected to the drain of the transistor Tr2 and the other of which is connected to a source or a drain of the transistor Tr6.

The gates of the transistors Tr1, Tr2, and Tr6 are connected to each other. Sources of the transistors Tr1 and Tr2 are both connected to the power supply line Vi. The drain of the transistor Tr2 is connected to a pixel electrode of the light emitting element 701.

The storage capacitor 702 has two electrodes one of which is connected to the gates of the transistors Tr1 and Tr2 and the other of which is connected to the power supply line Vi.

The voltage of the power supply line Vi (power supply voltage) is kept at a constant level. The voltage of the opposite electrode is also kept at a constant level.

The transistors Tr1, Tr2, and Tr6 each may be an n-channel transistor or a p-channel transistor. However, the transistors Tr1, Tr2, and Tr6 have to have the same polarity. When the anode serves as a pixel electrode and the cathode is used as an opposite electrode, the transistors Tr1 and Tr2 are desirably p-channel transistors. On the other hand, when the anode serves as an opposite electrode and the cathode is used as a pixel electrode, the transistors Tr1 and Tr2 are desirably n-channel transistors.

The transistors Tr3, Tr4 and Tr5 each may be an n-channel transistor or a p-channel transistor.

Next, the operation of the light emitting device of this embodiment is described. Similar to the pixel shown in FIG. 3, the description on the operation of the light emitting device that has the pixel of FIG. 28 is divided into one for a writing period Ta and one for a display period Td.

Figure 29A:
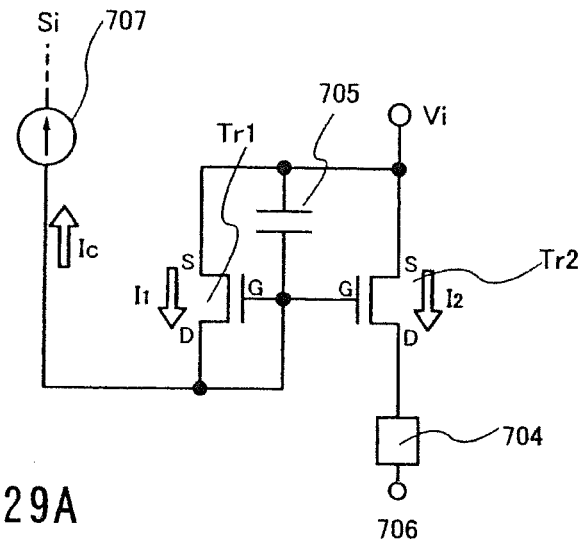
FIGS. 29A and 29B are schematic diagrams of a pixel being driven.
Figure 29B:
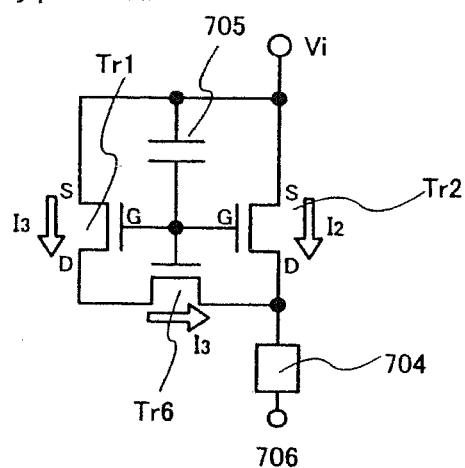

For voltages applied to the first to third scanning lines, see the timing chart of FIG. 4. FIGS. 29A and 29B are simplified diagrams showing how the transistors Tr1 and Tr2 of the pixel of FIG. 28 are connected in a writing period Ta and in a display period Td.

As the writing period Ta is started, the first scanning line G and the second scanning line P are selected. This turns the transistors Tr3 and Tr4 ON. Since the third scanning line R is not selected, the transistor Tr5 is OFF.

When a video signal is inputted to the signal line driving circuit 102, a signal current Ic flows between the signal lines S1 to Sx and the power supply lines V1 to Vx in an amount according to the video signal inputted.

FIG. 29A is a schematic diagram of the pixel 101 when the signal current Ic according to the video signal flows in the signal line Si during the writing period Ta. 706 represents a terminal for connection with a power supply that gives a voltage to the opposite electrode. 707 represents a constant current source of the signal line driving circuit 102.

The transistor Tr3 is now turned ON and therefore the signal current Ic flows between the drain and source of the transistor Tr1 when the signal current Ic according to the video signal flows in the signal line Si. At this point, the gate of the transistor Tr1 is connected to the drain of Tr1 and therefore the transistor Tr1 operates in a saturation region to satisfy Expression 1. Accordingly, the gate voltage $V_{GS}$ of the transistor Tr1 is determined by the current value Ic.

The gate of the transistor Tr2 is connected to the gate of the transistor Tr1. The source of the transistor Tr2 is connected to the source of the transistor Tr1. Therefore, the gate voltage of the transistor Tr1 is equal to the gate voltage of the transistor Tr2. This means that the drain current of the transistor Tr2 is in proportion with the drain current of the transistor Tr1. If $\mu C_o W/L$, and $V_{TH}$ of Tr1 are equal to $\mu C_o W/L$, and $V_{TH}$ of Tr2, the drain current of the transistor Tr1 and the drain current of the transistor Tr2 are identical with each other and $I_2$=Ic is satisfied.

Then the drain current $I_2$ of the transistor Tr2 flows into the light emitting element 704. The amount of current flowing into the light emitting element is set in accordance with the signal current Ic that is determined by the constant current source 707. The light emitting element 704 emits light at a luminance according to the amount of the current it receives. When a current flowing into the light emitting element is very close to 0 or if the light emitting element receives a current flowing in the reverse bias direction, the light emitting element 704 does not emit light.

After the writing period Ta is ended, the first scanning line G and the second scanning line P are no longer selected. At this point, it is desirable if the selection period of the second scanning line P is ended earlier than the selection period of the first scanning line G. This is because electric charges of the storage capacitor 705 leak through Tr4 if the transistor Tr3 is turned OFF first.

The end of the writing period Ta is followed by the start of a display period Td. As the display period Td is started, the third scanning line R is selected and the transistor Tr5 is turned ON. The first scanning line G and the second scanning line P are not selected and therefore the transistors Tr3 and Tr4 are OFF.

FIG. 29B is a schematic diagram of the pixel in the display period Td. The transistors Tr3 and Tr4 are OFF. Sources of the transistors Tr1 and Tr2 are connected to the power supply line Vi and receive a constant voltage (power supply voltage).

In the transistors Tr1 and Tr2, $V_{GS}$ set in the writing period Ta is held as it is. Furthermore, the gate of the transistor Tr6 is connected to the gates of the transistors Tr1 and Tr2. Therefore the drain current of the transistor Tr1 and the drain current of the transistor Tr6 are kept at the same amount. From Expression 1, the drain current of the transistor Tr1 is influenced by the channel length and channel width of the transistor Tr6.

If it is assumed that the gate voltage, mobility, gate capacitance per unit area, threshold, and channel width of the transistor Tr1 are identical with those of the transistor Tr6, the following Expression 2 is obtained from Expression 1. In Expression 2, the channel length of the transistor Tr1 is given as L1, the channel length of the transistor Tr6 is given as L6, and the drain current of Tr1 and Tr6 is given as $I_3$.

$$I3 = I_1 \times L1/(L1+L6) \qquad \text{[Expression 2]}$$

On the other hand, the drain current $I_2$ of the transistor Tr2 is still kept at the amount set in accordance with the signal current Ic.

Since the transistor Tr5 is ON, the drain current $I_3$ of the transistors Tr1 and Tr6 and the drain current $I_2$ of the transistor Tr2 both flow into the light emitting element 704. The light emitting element 704 thus emits light at a luminance according to the sum amount of the drain current $I_3$ and the drain current $I_2$.

The light emitting element 704 emits light at a luminance according to the amount of current flowing into the light emitting element. Therefore the gray scale of each pixel is determined by the amount of current that flows into the light emitting element in a display period Td. Although the light emitting element also emits light during a writing period Ta at a luminance according to the amount of drain current $I_1$, the influence of this light on gray scale is considered small enough to be ignored in an actual display panel. This is because, in the case of a VGA level display panel, for example, its pixel portion has 480 lines of pixels and a writing period Ta for one line of pixels is as short as ¹⁄₄₈₀ of one frame period. Of course the amount of signal current Ic may be corrected taking into account the influence of current flowing into the light emitting element during a writing period Ta on gray scale.

In the pixel of the present invention, the current flowing into the light emitting element in a display period is the sum of drain current $I_2$ and drain current $I_3$, meaning that the light emitting element is not solely dependent on the drain current $I_2$. Accordingly, the amount of current flowing into the light emitting element is less varied from one pixel to another and recognition of fluctuation in luminance can be avoided even when characteristics of the transistors Tr1 and Tr2 are changed and the ratio of the drain current $I_2$ of the transistor Tr2 to the signal current Ic varies between pixels.

In the pixel of the present invention, the drain current of the transistor Tr1 does not flow into the light emitting element during a writing period Ta. Accordingly, the capacitance of the light emitting element does not influence the length of period which starts with supply of current to the pixel from the signal line driving circuit to cause the flow of drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

The light emitting device of the present invention also has the advantage of conventional current input type light emitting devices; the fluctuation in luminance of light emitting element between pixels is smaller in the present invention than in voltage input type light emitting devices even when TFT characteristics vary from one pixel to another. In addition, lowering of luminance due to degradation of light emitting element is smaller in the present invention than in the voltage input type pixel of FIG. 25 where the TFT 51 operates in a linear range. Furthermore the present invention can reduce change in luminance of light emitting element regardless of change in organic light emitting layer temperature by the outside temperature and by heat generated from the light emitting panel itself, and can prevent an increase in current consumption accompanying a temperature rise.

Moreover, the ratio of current flowing into the light emitting element to the signal current Ic is smaller in the pixel of this embodiment than in the pixels shown in FIGS. 3, 5A, 5B, 7A, 7B, 9A, 9B, 10, and 11 because the drain current of the transistor Tr1 of this embodiment in a writing period is larger than the drain current of Tr1 in a display period. As a result, the signal current Ic can be set largeR and the influence of noise is lessened.

In this embodiment, one of the source and drain of the transistor Tr4 is connected to the drain of the transistor Tr1 and the other is connected to the gate of the transistor Tr1 and to the gate of the transistor Tr2. However, this embodiment is not limited thereto. In the pixel of the present invention, it is sufficient if the transistor Tr4 is connected to other elements or wiring lines such that the gate of the transistor Tr1 is connected to the drain of Tr1 in a writing period Ta and the gate of the transistor Tr1 is disconnected from the drain of Tr1 in a display period Td.

In this embodiment, one of the source and drain of the transistor Tr5 is connected to the drain of the transistor Tr2 and the other is connected to the source or drain of the transistor Tr6. However, this embodiment is not limited thereto. In the pixel of the present invention, it is sufficient if the transistor Tr5 is connected to other elements or wiring lines such that the drain of the transistor Tr1 is disconnected from the pixel electrode in a writing period Ta and the drain of the transistor Tr1 is connected to the pixel electrode in a display period Td. For example, one of the source and drain of the transistor Tr5 may be connected to the drain of Tr1 whereas the other is connected to the source or drain of Tr6.

In short, it is sufficient if Tr3, Tr4, and Tr5 are connected as shown in FIG. 29A during Ta whereas they are connected as shown in FIG. 29B during Td. Gj, Pj, and Rj are three separate wiring lines but may be integrated into one or two wiring lines.

Further, it is sufficient if all currents that flow in Tr1 during Ta are controlled by the current source and currents that flow in Tr1 and Tr2 during Td flow into the light emitting element.

The structure of this embodiment may be combined with any one of the structures of Embodiments 4 through 10.

Embodiment 12

This embodiment gives a description on the structure of the pixel 101 of the light emitting device shown in FIG. 2.

Figure 30:
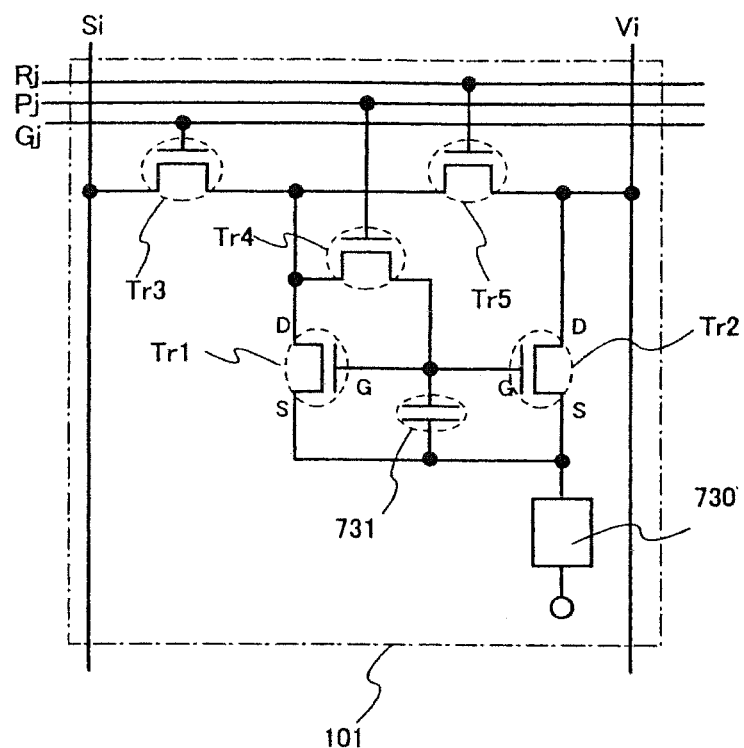
FIG. 30 is a circuit diagram of a pixel in a light emitting device of the present invention.

FIG. 30 shows a detailed structure of the pixel 101 in FIG. 2. The pixel 101 shown in FIG. 30 has a signal line Si (one of S1 to Sx), a first scanning line Gj (one of G1 to Gy), a second scanning line Pj (one of P1 to Py), a third scanning line Rj (one of R1 to Ry), and a power supply line Vi (one of V to Vx).

The pixel 101 also has a transistor Tr1, a transistor Tr2, a transistor Tr3, a transistor Tr4, a transistor Tr5, a light emitting element 730, and a storage capacitor 731. The storage capacitor 731 is provided to hold the voltage between a gate and source of the transistors Tr1 and Tr2 (gate voltage) more securely, but it is not always necessary.

A gate of the transistor Tr3 is connected to the first scanning line Gj. The transistor Tr3 has a source and a drain one of which is connected to the signal line Si and the other of which is connected to a drain of the transistor Tr1.

A gate of the transistor Tr4 is connected to the second scanning line Pj. The transistor Tr4 has a source and a drain one of which is connected to the drain of the transistor Tr1 and the other of which is connected to the gate of the transistor Tr1 and to the gate of the transistor Tr2.

A gate of the transistor Tr5 is connected to the third scanning line Rj. The transistor Tr5 has a source and a drain one of which is connected to a drain of the transistor Tr2 and the power supply line Vi, and the other of which is connected to the drain of the transistor Tr1.

The gates of the transistors Tr1 and Tr2 are connected to each other. Sources of the transistors Tr1 and Tr2 are both connected to a pixel electrode of the light emitting element 730.

The storage capacitor 731 has two electrodes one of which is connected to the gates of the transistors Tr1 and Tr2 and the other of which is connected to a pixel electrode of the light emitting element 730.

The voltage of the power supply line Vi (power supply voltage) is kept at a constant level. The voltage of the opposite electrode is also kept at a constant level.

The transistors Tr1 and Tr2 each may be an n-channel transistor or a p-channel transistor. However, the transistors Tr1 and Tr2 have to have the same polarity. When the anode serves as a pixel electrode and the cathode is used as an opposite electrode, the transistors Tr1 and Tr2 are desirably n-channel transistors. On the other hand, when the anode serves as an opposite electrode and the cathode is used as a pixel electrode, the transistors Tr1 and Tr2 are desirably p-channel transistors.

The transistors Tr3, Tr4, and Tr5 each may be an n-channel transistor or a p-channel transistor.

Figure 31A:
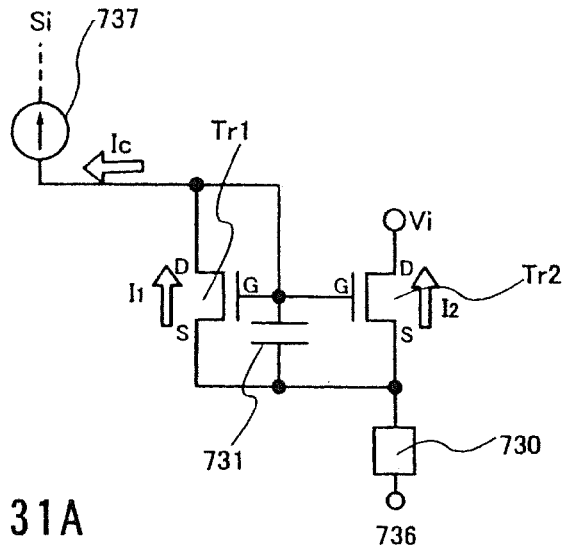
FIGS. 31A and 31B are schematic diagrams of a pixel being driven.
Figure 31B:
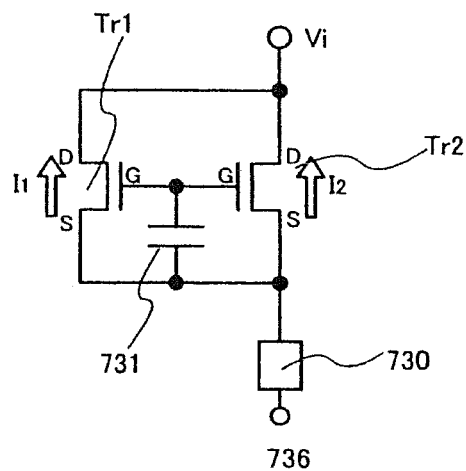

Similar to the pixel shown in FIG. 3, the description on the operation of the light emitting device that has the pixel of FIG. 30 is divided into one for a writing period Ta and one for a display period Td. For voltages applied to the first to third scanning lines, see the timing chart of FIG. 4. FIGS. 31A and 31B are simplified diagrams showing how the transistors Tr1 and Tr2 of the pixel of FIG. 30 are connected in the writing period Ta and in the display period Td.

As the writing period Ta is started, the first scanning line G and the second scanning line P are selected. This turns the transistors Tr3 and Tr4 ON. Since the third scanning line R is not selected, the transistor Tr5 is OFF.

When a video signal is inputted to the signal line driving circuit 102, a signal current Ic flows between the signal lines S1 to Sx and the power supply lines V1 to Vx in an amount according to the video signal inputted.

FIG. 311A is a schematic diagram of the pixel 101 when the signal current Ic according to the video signal flows in the signal line Si during the writing period Ta. 736 represents a terminal for connection with a power supply that gives a voltage to the opposite electrode. 737 represents a constant current source of the signal line driving circuit 102.

The transistor Tr3 is now turned ON and therefore a signal current Ic flows between the drain and source of the transistor Tr1 when the signal current Ic according to the video signal flows in the signal line Si. At this point, the gate of the transistor Tr1 is connected to the drain of Tr1 and therefore the transistor Tr1 operates in a saturation region to satisfy Expression 1. Accordingly, the gate voltage $V_{GS}$ of the transistor Tr1 is determined by the current value Ic.

The gate of the transistor Tr2 is connected to the gate of the transistor Tr1. The source of the transistor Tr2 is connected to the source of the transistor Tr1. Therefore, the gate voltage of the transistor Tr1 is equal to the gate voltage of the transistor Tr2. This means that the drain current of the transistor Tr2 is in proportion with the drain current of the transistor Tr1. If $\mu C_o$ W/L, and $V_{TH}$ of Tr1 are equal to $\mu C_o$ W/L, and $V_{TH}$ of Tr2, the drain current of the transistor Tr1 and the drain current of the transistor Tr2 are identical with each other and $I_2$=Ic is satisfied.

Then the drain current $I_2$ of the transistor Tr2 flows into the light emitting element 730. The amount of current flowing into the light emitting element is set in accordance with the signal current Ic that is determined by the constant current source 737. The light emitting element 730 emits light at a luminance according to the amount of the current it receives. When a current flowing into the light emitting element is very close to 0 or if the light emitting element receives a current flowing in the reverse bias direction, the light emitting element 730 does not emit light.

After the writing period Ta is ended, the first scanning line G and the second scanning line P are no longer selected. At this point, it is desirable if the selection period of the second scanning line P is ended earlier than the selection period of the first scanning line G. This is because electric charges of the storage capacitor 731 leak through Tr4 if the transistor Tr3 is turned OFF first.

The end of the writing period Ta is followed by the start of a display period Td. As the display period Td is started, the third scanning line R is selected and the transistor Tr5 is turned ON. The first scanning line G and the second scanning line P are not selected and therefore the transistors Tr3 and Tr4 are OFF.

FIG. 31B is a schematic diagram of the pixel in the display period Td. The transistors Tr3 and Tr4 are OFF. Sources of the transistors Tr1 and Tr2 are connected to a pixel electrode of the light emitting element 730.

In the transistors Tr1 and Tr2, $V_{GS}$ set in the writing period Ta is held as it is. The gate of the transistor Tr2 is connected to the gate of the transistor Tr1. The source of the transistor Tr2 is connected to the source of the transistor Tr1. Therefore the gate voltage of the transistor Tr1 is equal to the gate voltage of the transistor Tr2. Since the drain of the transistor Tr1 and the drain of the transistor Tr2 are connected to the power supply line Vi, the drain current $I_2$ of the transistor Tr2 is in proportion to the drain current $I_1$ of the transistor Tr1. If $\mu C_o$ W/L, and $V_{TH}$ of Tr1 are equal to $\mu C_o$ W/L, and $V_{TH}$ of Tr2, the drain current of the transistor Tr1 and the drain current of the transistor Tr2 are identical with each other and $I_2$=$I_1$=Ic is satisfied.

Since the transistor Tr5 is ON, the drain current $I_1$ of the transistor Tr1 and the drain current $I_2$ of the transistor Tr2 both flow into the light emitting element 730 as a current of the light emitting element. In a display period Td, the light emitting element 730 thus receive the sum of drain current $I_1$ and drain current $I_2$ and emits light at a luminance according to the sum amount of the current flowing into the light emitting element.

The start of the display period Td in the pixels on Line One is followed by the start of a display period Td in the pixels on Line Two. Then, similar to the case of the pixels on Line One, the third scanning line R2 is selected and the transistors Tr5 and Tr6 are turned ON. The first scanning line G2 and the second scanning line P2 are not selected and therefore the transistors Tr3 and Tr4 are OFF. The light emitting element 730 emits light at a luminance according to the sum amount of the drain current $I_1$ and the drain current $I_2$.

After the display period Td is started in the pixels on Line Two, a display period Td is started in pixels on Line Three and then in pixels on subsequent lines in order until pixels on Line Y are reached. In each display period Td, the operation described above is repeated.

When every writing period Ta and every display period Td are ended, one frame period is completed. One image is displayed in one frame period. Then the next frame period is started to start a writing period Ta and the operation described above is repeated.

The light emitting element 730 emits light at a luminance according to the amount of current flowing into the light emitting element. Therefore the gray scale of each pixel is determined by the amount of current that flows into the light emitting element in a display period Td.

The light emitting element 730 emits light at a luminance according to the amount of current flowing into the light emitting element. Therefore the gray scale of each pixel is determined by the amount of current that flows into the light emitting element in a display period Td.

In the pixel of the present invention, the current flowing into the light emitting element in a display period is the sum of drain current $I_2$ and drain current $I_3$, meaning that the light emitting element is not solely dependent on the drain current $I_2$. Accordingly, the amount of current flowing into the light emitting element is less varied from one pixel to another and recognition of fluctuation in luminance can be avoided even when characteristics of the transistors Tr1 and Tr2 are changed and the ratio of the drain current $I_2$ of the transistor Tr2 to the signal current Ic varies between pixels.

In the pixel of the present invention, the drain current of the transistor Tr1 does not flow into the light emitting element during the writing period Ta. Accordingly, the capacitor of the light emitting element does not influence the length of period which starts with supply of current to the pixel from the signal line driving circuit to cause the flow of drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

The light emitting device of the present invention also has the advantage of conventional current input type light emitting devices; the fluctuation in luminance of light emitting element between pixels is smaller in the present invention than in voltage input type light emitting devices even when TFT characteristics vary from one pixel to another. In addition, lowering of luminance due to degradation of light emitting element is smaller in the present invention than in the voltage input type pixel of FIG. 25 where the TFT 51 operates in a linear range. Furthermore the present invention can reduce change in luminance of light emitting element regardless of change in organic light emitting layer temperature by the outside temperature and by heat generated from the light emitting panel itself, and can prevent an increase in current consumption accompanying a temperature rise.

In this embodiment, one of the source and drain of the transistor Tr4 is connected to the drain of the transistor Tr1 and the other is connected to the gate of the transistor Tr1 and to the gate of the transistor Tr2. However, this embodiment is not limited thereto. In the pixel of the present invention, it is sufficient if the transistor Tr4 is connected to other elements or wiring lines such that the gate of the transistor Tr1 is connected to the drain of Tr1 in a writing period Ta and the gate of the transistor Tr1 is disconnected from the drain of Tr1 in a display period Td.

In this embodiment, one of the source and drain of the transistor Tr5 is connected to the drain of the transistor Tr2 and the other is connected to the source or drain of the transistor Tr3. However, this embodiment is not limited thereto. In short, it is sufficient if Tr3, Tr4, and Tr5 are connected as shown in FIG. 31A during Ta whereas they are connected as shown in FIG. 31B during Td. Gj, Pj, and Rj are three separate wiring lines but may be integrated into one or two wiring lines.

Further, it is sufficient if all currents that flow in Tr1 during Ta are controlled by the current source and currents that flow in Tr1 and Tr2 during Td flow into the light emitting element.

The structure of this embodiment may be combined with any one of the structures of Embodiments 4 through 11.

Embodiment 13

This embodiment gives a description on the structure of the pixel 101 of the light emitting device shown in FIG. 2.

Figure 32:
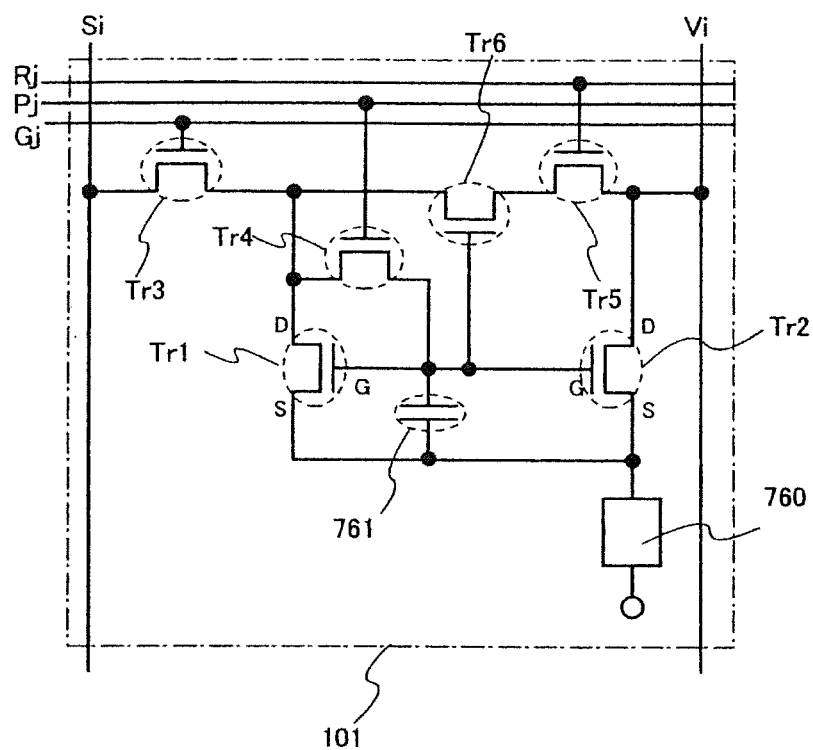
FIG. 32 is a circuit diagram of a pixel in a light emitting device of the present invention.

FIG. 32 shows a detailed structure of the pixel 101 in FIG. 2. The pixel 101 shown in FIG. 32 has a signal line Si (one of S1 to Sx), a first scanning line Gj (one of G1 to Gy), a second scanning line Pj (one of P1 to Py), a third scanning line Rj (one of R1 to Ry), and a power supply line Vi (one of V1 to Vx).

The pixel 101 also has a transistor Tr1, a transistor Tr2, a transistor Tr3, a transistor Tr4, a transistor Tr5, a transistor Tr6, a light emitting element 760, and a storage capacitor 761. The storage capacitor 761 is provided to hold the voltage between a gate and source of the transistors Tr1 and Tr2 (gate voltage) more securely, but it is not always necessary.

A gate of the transistor Tr3 is connected to the first scanning line Gj. The transistor Tr3 has a source and a drain one of which is connected to the signal line Si and the other of which is connected to a drain of the transistor Tr1.

A gate of the transistor Tr4 is connected to the second scanning line Pj. The transistor Tr4 has a source and a drain one of which is connected to the drain of the transistor Tr1 and the other of which is connected to the gate of the transistor Tr1 and to the gate of the transistor Tr2.

A gate of the transistor Tr5 is connected to the third scanning line Rj. The transistor Tr5 has a source and a drain one of which is connected to a drain of the transistor Tr2 and the power supply line Vi, and the other of which is connected to the source or drain of the transistor Tr6.

A gate of the transistor Tr6 is connected to the gates of the transistor Tr1 and Tr2. The transistor Tr6 has a source and a drain one of which is connected to the drain of the transistor Tr1 and the other of which is connected to a source or a drain of the transistor Tr5.

The gates of the transistors Tr1 and Tr2 are connected to each other. Sources of the transistors Tr1 and Tr2 are both connected to a pixel electrode of the light emitting element 760.

The storage capacitor 761 has two electrodes one of which is connected to the gates of the transistors Tr1 and Tr2 and the other of which is connected to a pixel electrode of the light emitting element 760.

The voltage of the power supply line Vi (power supply voltage) is kept at a constant level. The voltage of the opposite electrode is also kept at a constant level.

The transistors Tr1 and Tr2 each may be an n-channel transistor or a p-channel transistor. However, the transistors Tr1 and Tr2 have to have the same polarity. When the anode serves as a pixel electrode and the cathode is used as an opposite electrode, the transistors Tr1 and Tr2 are desirably n-channel transistors. On the other hand, when the anode serves as an opposite electrode and the cathode is used as a pixel electrode, the transistors Tr1 and Tr2 are desirably p-channel transistors.

The transistors Tr3 to Tr6 each may bean an n-channel transistor or a p-channel transistor.

Figure 33A:
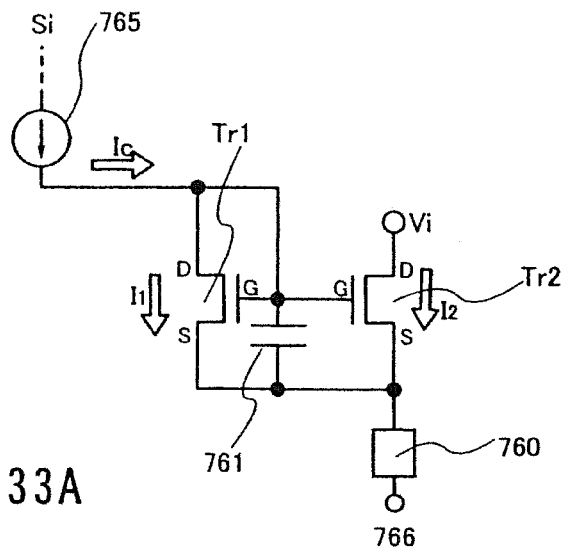
FIGS. 33A and 33B are schematic diagrams of a pixel being driven.
Figure 33B:
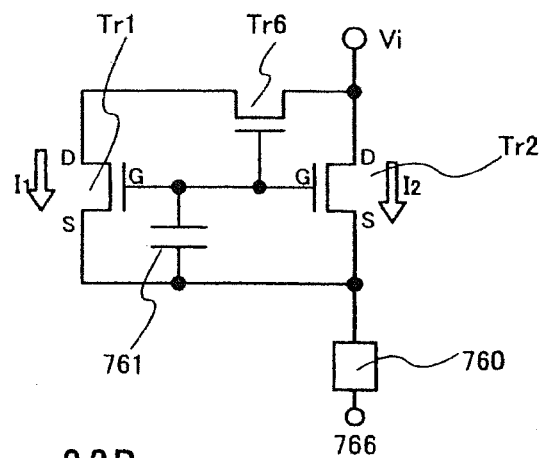

Similar to the pixel shown in FIG. 3, the description on the operation of the light emitting device that has the pixel of FIG. 32 is divided into one for a writing period Ta and one for a display period Td. For voltages applied to the first to third scanning lines, see the timing chart of FIG. 4. FIGS. 33A and 33B are simplified diagrams showing how the transistors Tr1 and Tr2 of the pixel of FIG. 32 are connected in a writing period Ta and in a display period Td.

As the writing period Ta is started, the first scanning line G and the second scanning line P are selected. This turns the transistors Tr3 and Tr4 ON. Since the third scanning line R is not selected, the transistor Tr5 is OFF.

When a video signal is inputted to the signal line driving circuit 102, a signal current Ic flows between the signal lines S1 to Sx and the power supply lines V1 to Vx in an amount according to the video signal inputted.

FIG. 33A is a schematic diagram of the pixel 101 when the signal current Ic according to the video signal flows in the signal line Si during the writing period Ta. 766 represents a terminal for connection with a power supply that gives a voltage to the opposite electrode. 765 represents a constant current source of the signal line driving circuit 102.

The transistor Tr3 is now turned ON and therefore the signal current Ic flows between the drain and source of the transistor Tr1 when the signal current Ic according to the video signal flows in the signal line Si. At this point, the gate of the transistor Tr1 is connected to the drain of Tr1 and therefore the transistor Tr1 operates in a saturation region to satisfy Expression 1. Accordingly, the gate voltage $V_{GS}$ of the transistor Tr1 is determined by the current value Ic.

The gate of the transistor Tr2 is connected to the gate of the transistor Tr1. The source of the transistor Tr2 is connected to the source of the transistor Tr1. Therefore, the gate voltage of the transistor Tr1 is equal to the gate voltage of the transistor Tr2. This means that the drain current of the transistor Tr2 is in proportion with the drain current of the transistor Tr1. If $\mu C_o W/L$, and $V_{TH}$ of Tr1 are equal to $\mu C_o W/L$, and $V_{TH}$ of Tr2, the drain current of the transistor Tr1 and the drain current of the transistor Tr2 are identical with each other and $I_2=Ic$ is satisfied.

Then the drain current $I_2$ of the transistor Tr2 flows into the light emitting element 760. The amount of current flowing into the light emitting element is set in accordance with the signal current Ic that is determined by the constant current source 765. The light emitting element 760 emits light at a luminance according to the amount of the current it receives. When a current flowing into the light emitting element is very close to 0 or if the light emitting element receives a current flowing in the reverse bias direction, the light emitting element 760 does not emit light.

After the writing period Ta is ended, the first scanning line G and the second scanning line P are no longer selected. At this point, it is desirable if the selection period of the second scanning line P is ended earlier than the selection period of the first scanning line G. This is because electric charges of the storage capacitor 761 leak through Tr4 if the transistor Tr3 is turned OFF first.

The end of the writing period Ta is followed by the start of a display period Td. After the display period Td is started, the third scanning line R is selected and the transistor Tr5 is turned ON. The first scanning line G and the second scanning line P are not selected and therefore the transistors Tr3 and Tr4 are OFF.

FIG. 33B is a schematic diagram of the pixel in the display period Td. The transistors Tr3 and Tr4 are OFF. Sources of the transistors Tr1 and Tr2 are connected to a pixel electrode of the light emitting element 760.

In the transistors Tr1 and Tr2, $V_{GS}$ set in the writing period Ta is held as it is. Furthermore, the gate of the transistor Tr6 is connected to the gates of the transistors Tr1 and Tr2. Therefore the drain current of the transistor Tr1 and the drain current of the transistor Tr6 are kept at the same amount. From Expression 1, the drain current of the transistor Tr1 is influenced by the channel length and channel width of the transistor Tr6.

As described above, if it is assumed that the gate voltage, mobility, gate capacitance per unit area, threshold, and channel width of the transistor Tr1 are identical with those of the transistor Tr6, Expression 2 is obtained from Expression 1.

On the other hand, the drain current $I_2$ of the transistor Tr2 is still kept at the amount set in accordance with the signal current Ic.

Since the transistor Tr5 is ON, the drain current $I_3$ of the transistors Tr1 and Tr6 and the drain current $I_2$ of the transistor Tr2 both flow into the light emitting element 760. The light emitting element 760 thus emits light at a luminance according to the sum amount of drain current $I_3$ and the drain current $I_2$.

The start of the display period Td in the pixels on Line One is followed by the start of a display period Td in the pixels on Line Two. Then, similar to the case of the pixels on Line One, the third scanning line R2 is selected and the transistors Tr5 and Tr6 are turned ON. The first scanning line G2 and the second scanning line P2 are not selected and therefore the transistors Tr3 and Tr4 are OFF. The light emitting element 760 emits light at a luminance according to the sum amount of the drain current $I_2$ and the drain current $I_3$.

After the display period Td is started in the pixels on Line Two, a display period Td is started in pixels on Line Three and then in pixels on subsequent lines in order until pixels on Line Y are reached. In each display period Td, the operation described above is repeated.

When every writing period Ta and every display period Td are ended, one frame period is completed. One image is displayed in one frame period. Then the next frame period is started to start a writing period Ta and the operation described above is repeated.

The light emitting element 760 emits light at a luminance according to the amount of current flowing into the light emitting element. Therefore the gray scale of each pixel is determined by the amount of current that flows into the light emitting element in a display period Td.

In the pixel of the present invention, the current flowing into the light emitting element in a display period is the sum of drain current $I_1$ and drain current $I_2$, meaning that the light emitting element is not solely dependent on the drain current $I_2$. Accordingly, the amount of current flowing into the light emitting element is less varied from one pixel to another and recognition of fluctuation in luminance can be avoided even when characteristics of the transistors Tr1 and Tr2 are changed and the ratio of the drain current $I_2$ of the transistor Tr2 to the signal current Ic varies between pixels.

In the pixel of the present invention, the drain current of the transistor Tr1 does not flow into the light emitting element during a writing period Ta. Accordingly, the capacitance of the light emitting element does not influence the length of period which starts with supply of current to the pixel from the signal line driving circuit to cause the flow of drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

The light emitting device of the present invention also has the advantage of conventional current input type light emitting devices; the fluctuation in luminance of light emitting element between pixels is smaller in the present invention than in voltage input type light emitting devices when TFT characteristics vary from one pixel to another. In addition, lowering of luminance due to degradation of light emitting element is smaller in the present invention than in the voltage input type pixel of FIG. 25 where the TFT 51 operates in a linear range. Furthermore the present invention can reduce change in luminance of light emitting element regardless of change in organic light emitting layer temperature by the outside temperature and by heat generated from the light emitting panel itself, and can prevent an increase in current consumption accompanying a temperature rise.

Moreover, the ratio of current flowing into the light emitting element to the signal current Ic is smaller in the pixel of this embodiment than in the pixels shown in FIGS. 3, 5A, 5B, 7A, 7B, 9A, 9B, 10, and 11 because the drain current of the transistor Tr1 of this embodiment in a writing period is larger than the drain current of Tr1 in a display period. As a result, the signal current Ic can be set larger and the influence of noise is lessened.

In this embodiment, one of the source and drain of the transistor Tr4 is connected to the drain of the transistor Tr1 and the other is connected to the gate of the transistor Tr1 and to the gate of the transistor Tr2. However, this embodiment is not limited thereto. In the pixel of the present invention, it is sufficient if the transistor Tr4 is connected to other elements or wiring lines such that the gate of the transistor Tr1 is connected to the drain of Tr1 in a writing period Ta and the gate of the transistor Tr1 is disconnected from the drain of Tr1 in a display period Td.

In this embodiment, one of the source and drain of the transistor Tr5 is connected to the drain of Tr2 and the other is connected to the source or the drain of Tr6. However, this embodiment is not limited thereto. In the pixel of the present invention, it is sufficient if the transistor Tr5 is connected to other elements or wiring lines such that the drain of the transistor Tr2 is disconnected from the power supply line Vi in a writing period Ta and the drain of the transistor Tr2 is connected to the power supply line Vi in a display period Td.

In short, it is sufficient if Tr3, Tr4, Tr5, and Tr6 are connected as shown in FIG. 31A during Ta whereas they are connected as shown in FIG. 31B during Td. Gj, Pj, and Rj are three separate wiring lines but may be integrated into one or two wiring lines.

Further, it is sufficient if all currents that flow in Tr1 during Ta are controlled by the current source and currents that flow in Tr1 and Tr2 during Td flow into the light emitting element.

The structure of this embodiment may be combined with any one of the structures of Embodiments 4 through 12.

Embodiment 14

This embodiment gives a description on the structure of the pixel 101 of the light emitting device shown in FIG. 2.

Figure 34:
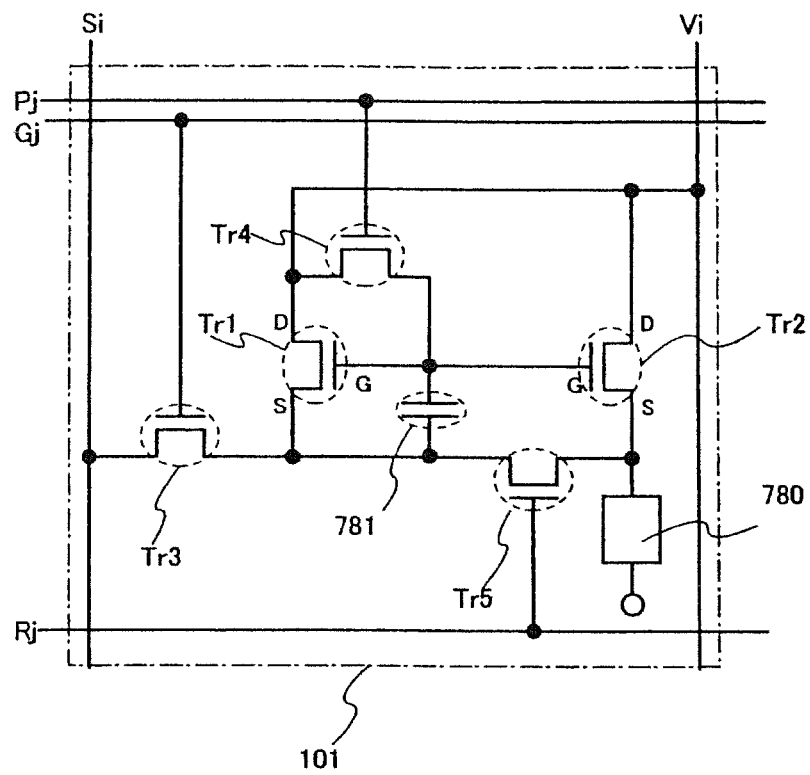
FIG. 34 is a circuit diagram of a pixel in a light emitting device of the present invention.

FIG. 34 shows a detailed structure of the pixel 101 in FIG. 2. The pixel 101 shown in FIG. 34 has a signal line Si (one of S1 to Sx), a first scanning line Gj (one of G1 to Gy), a second scanning line Pj (one of P1 to Py), a third scanning line Rj (one of R1 to Ry), and a power supply line Vi (one of V1 to Vx).

The pixel 101 also has a transistor Tr1, a transistor Tr2, a transistor Tr3, a transistor Tr4, a transistor Tr5, a light emitting element 780, and a storage capacitor 781. The storage capacitor 781 is provided to hold the voltage between a gate and source of the transistors Tr1 and Tr2 (gate voltage) more securely, but it is not always necessary.

A gate of the transistor Tr3 is connected to the first scanning line Gj. The transistor Tr3 has a source and a drain one of which is connected to the signal line Si and the other of which is connected to the source of the transistor Tr1.

A gate of the transistor Tr4 is connected to the second scanning line Pj. The transistor Tr4 has a source and a drain one of which is connected to a drain of the transistor Tr1 and the other of which is connected to the gate of the transistor Tr1 and to the gate of the transistor Tr2.

A gate of the transistor Tr5 is connected to the third scanning line Rj. The transistor Tr5 has a source and a drain one of which is connected to the source of the transistor Tr2 and a pixel electrode of the light emitting element 780 and the other of which is connected to the source of the transistor Tr1.

The gates of the transistors Tr1 and Tr2 are connected to each other. The source of the transistor Tr2 is connected to the pixel electrode of the light emitting element 780. Drains of the transistors Tr1 and Tr2 are both connected to the power supply line Vi.

The storage capacitor 781 has two electrodes one of which is connected to the gates of the transistors Tr1 and Tr2 and the other of which is connected to the source of Tr1.

The voltage of the power supply line Vi (power supply voltage) is kept at a constant level. The voltage of the opposite electrode is also kept at a constant level.

The transistors Tr1 and Tr2 each may be an n-channel transistor or a p-channel transistor. However, the transistors Tr1 and Tr2 have to have the same polarity. When the anode serves as a pixel electrode and the cathode is used as an opposite electrode, the transistors Tr1 and Tr2 are desirably n-channel transistors. On the other hand, when the anode serves as an opposite electrode and the cathode is used as a pixel electrode, the transistors Tr1 and Tr2 are desirably p-channel transistors.

The transistor Tr3 may be an n-channel transistor or a p-channel transistor, and the same applies to the transistors Tr4 and Tr5.

Figure 35A:
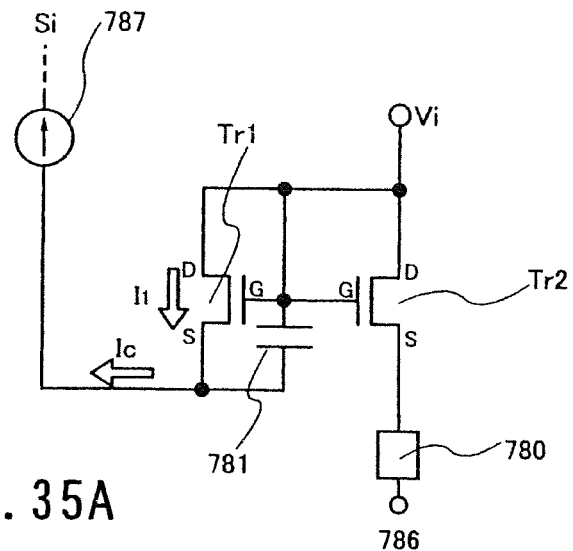
FIGS. 35A and 35B are schematic diagrams of a pixel being driven.
Figure 35B:
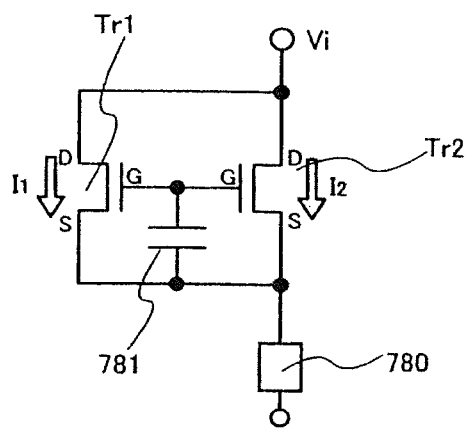
Figure 36:
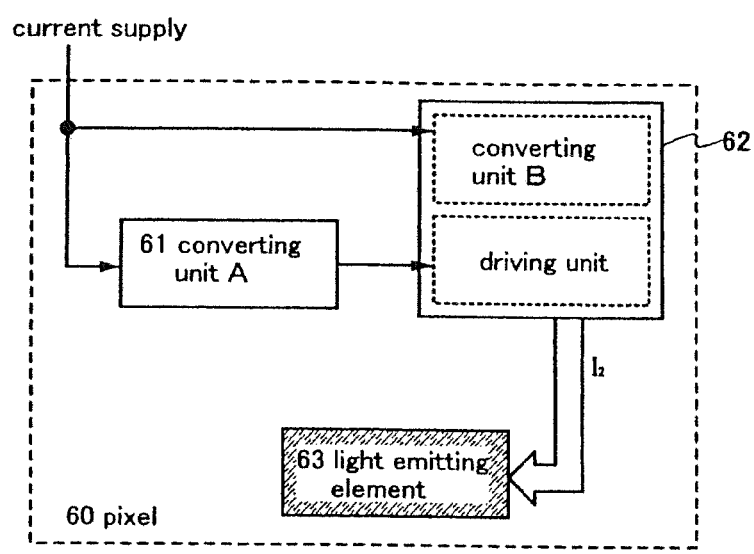
FIG. 36 is a block diagram of a current input type pixel of the present invention.

Similar to the pixel shown in FIG. 3, the description on the operation of the light emitting device that has the pixel of FIG. 34 is divided into one for a writing period Ta and one for a display period Td. For voltages applied to the first to third scanning lines, see the timing chart of FIG. 4. FIGS. 35A and 35B are simplified diagrams showing how the transistors Tr1 and Tr2 of the pixel of FIG. 34 are connected in a writing period Ta and in a display period Td.

As the writing period Ta is started, the first scanning line G and the second scanning line P are selected. This turns the transistors Tr3 and Tr4 ON. Since the third scanning line R is not selected, the transistor Tr5 is OFF.

When a video signal is inputted to the signal line driving circuit 102, a signal current Ic flows between the signal lines S1 to Sx and the power supply lines V1 to Vx in an amount according to the video signal inputted.

FIG. 35A is a schematic diagram of the pixel 101 when the signal current Ic according to the video signal flows in the signal line Si during the writing period Ta. 786 represents a terminal for connection with a power supply that gives a voltage to the opposite electrode. 787 represents a constant current source of the signal line driving circuit 102.

The transistor Tr3 is now turned ON and therefore a signal current Ic flows between the drain and source of the transistor Tr1 when the signal current Ic according to the video signal flows in the signal line Si. At this point, the gate of the transistor Tr1 is connected to the drain of Tr1 and therefore the transistor Tr1 operates in a saturation region to satisfy Expression 1. Accordingly, the gate voltage $V_{GS}$ of the transistor Tr1 is determined by the current value Ic.

The gate of the transistor Tr2 is connected to the gate of the transistor Tr1.

After the writing period Ta is ended, the first scanning line G and the second scanning line P are no longer selected. At this point, it is desirable if the selection period of the second scanning line P is ended earlier than the selection period of the first scanning line G. This is because electric charges of the storage capacitor 781 leak through Tr4 if the transistor Tr3 is turned OFF first.

The end of the writing period Ta is followed by the start of a display period Td. As the display period Td is started, the third scanning line R is selected and the transistor Tr5 is turned ON. The first scanning line G and the second scanning line P are not selected and therefore the transistors Tr3 and Tr4 are OFF.

FIG. 35B is a schematic diagram of the pixel in the display period Td. The transistors Tr3 and Tr4 are OFF. Sources of the transistors Tr1 and Tr2 are connected to the pixel electrode of the light emitting element 780.

In the transistors Tr1 and Tr2, $V_{GS}$ set in the writing period Ta is held as it is. The gate of the transistor Tr2 is connected to the gate of the transistor Tr1. The source of the transistor Tr2 is connected to the source of the transistor Tr1. Therefore the gate voltage of the transistor Tr1 is equal to the gate voltage of the transistor Tr2. Since the drain of the transistor Tr1 and the drain of the transistor Tr2 are connected to the power supply line Vi, the drain current $I_2$ of the transistor Tr2 is in proportion to the drain current $I_1$ of the transistor Tr1. If $\mu C_o$ W/L, and $V_{TH}$ of Tr1 are equal to $\mu C_o$ W/L, and $V_{TH}$ of Tr2, the drain current of the transistor Tr1 and the drain current of the transistor Tr2 are identical with each other and $I_2=I_1=Ic$ is satisfied.

Since the transistor Tr5 is ON, the drain current $I_1$ of the transistor Tr1 and the drain current $I_2$ of the transistor Tr2 both flow into the light emitting element 780. In a display period Td, the light emitting element 780 thus receive the sum of drain current $I_1$ and drain current $I_2$ and emits light at a luminance according to the sum amount of the current flowing into the light emitting element.

The start of the display period Td in the pixels on Line One is followed by the start of a display period Td in the pixels on Line Two. Then, similar to the case of the pixels on Line One, the third scanning line R2 is selected and the transistor Tr5 is turned ON. The first scanning line G2 and the second scanning line P2 are not selected and therefore the transistors Tr3 and Tr4 are OFF. The light emitting element 780 emits light at a luminance according to the sum amount of the drain current $I_1$ and the drain current $I_2$.

After the display period Td is started in the pixels on Line Two, a display period Td is started in pixels on Line Three and then in pixels on subsequent lines in order until pixels on Line Y are reached. In each display period Td, the operation described above is repeated.

When every writing period Ta and every display period Td are ended, one frame period is completed. One image is displayed in one frame period. Then the next frame period is started to start a writing period Ta and the operation described above is repeated.

The light emitting element 780 emits light at a luminance according to the amount of current flowing into the light emitting element. Therefore the gray scale of each pixel is determined by the amount of current that flows into the light emitting element in a display period Td. Although the light emitting element also emits light during a writing period Ta at a luminance according to the amount of drain current of Tr2, the influence of this light on gray scale is considered small enough to be ignored in an actual display panel. This is because, in the case of a VGA level display panel, for example, its pixel portion has 480 lines of pixels and a writing period Ta for one line of pixels is as short as 1/480 of one frame period.

In the pixel of the present invention, the current flowing into the light emitting element in a display period is the sum of drain current $I_1$ and drain current $I_2$, meaning that the light emitting element is not solely dependent on the drain current $I_2$. Accordingly, the amount of current flowing into the light emitting element is less varied from one pixel to another and recognition of fluctuation in luminance can be avoided even when characteristics of the transistors Tr1 and Tr2 are changed and the ratio of the drain current $I_2$ of the transistor Tr2 to the signal current Ic varies between pixels.

In the pixel of the present invention, the drain current of the transistor Tr1 does not flow into the light emitting element during a writing period Ta. Accordingly, the capacitance of the light emitting element does not influence the length of period which starts with supply of current to the pixel from the signal line driving circuit to cause the flow of drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

The light emitting device of the present invention also has the advantage of conventional current input type light emitting devices; the fluctuation in luminance of light emitting element between pixels is smaller in the present invention than in voltage input type light emitting devices when TFT characteristics vary from one pixel to another. In addition, lowering of luminance due to degradation of light emitting element is smaller in the present invention than in the voltage input type pixel of FIG. 25 where the TFT 51 operates in a linear range. Furthermore the present invention can reduce change in luminance of light emitting element regardless of change in organic light emitting layer temperature by the outside temperature and by heat generated from the light emitting panel itself, and can prevent an increase in current consumption accompanying a temperature rise.

In this embodiment, one of the source and drain of the transistor Tr4 is connected to the drain of the transistor Tr1 and the other is connected to the gate of the transistor Tr1 and to the gate of the transistor Tr2. However, this embodiment is not limited thereto. In the pixel of the present invention, it is sufficient if the transistor Tr4 is connected to other elements or wiring lines such that the gate of the transistor Tr1 is connected to the drain of Tr1 in a writing period Ta and the gate of the transistor Tr1 is disconnected from the drain of Tr1 in a display period Td.

Further, in this embodiment, one of the source and drain of the transistor Tr5 is connected to the source of Tr2 and the other is connected to the source of Tr1. However, this embodiment is not limited thereto. In the pixel of the present invention, it is sufficient if the transistor Tr5 is connected to other elements or wiring lines such that the source of the transistor Tr1 is disconnected from the pixel electrode in a writing period Ta and the source of the transistor Tr1 is connected to the pixel electrode in a display period Td.

In short, it is sufficient if Tr3, Tr4, and Tr5 are connected as shown in FIG. 35A during Ta whereas they are connected as shown in FIG. 35B during Td. Gj, Pj, and Rj are three separate wiring lines but may be integrated into one or two wiring lines.

Further, it is sufficient if all currents that flow in Tr1 during Ta are controlled by the current source and currents that flow in Tr1 and Tr2 during Td flow into the light emitting element.

The pixel electrode of the light emitting element may be connected to the source of Tr1 instead of the source of Tr2. In this case, however, an additional transistor is needed in order to control connection of Tr1 and the pixel electrode such that the source of Tr1 is disconnected from the pixel electrode in a writing period and is connected to the pixel electrode in a display period. The transistor for controlling connection of the source of Tr1 and pixel electrode may have a polarity different from the polarity of Tr5 so that a gate of this transistor is connected to the gate of Tr5.

The structure of this embodiment may be combined with any one of the structures of Embodiments 4 through 13.

In the pixel of the first structure of the present invention, the current flowing into the light emitting element in a display period is the sum of drain current $I_1$ and drain current $I_2$, meaning that the light emitting element is not solely dependent on the drain current $I_2$. Accordingly, the amount of current flowing into the light emitting element is less varied from one pixel to another and recognition of fluctuation in luminance can be avoided even when characteristics of the transistors Tr1 and Tr2 are changed and the ratio of the drain current $I_1$ of the transistor Tr1 to the drain current $I_2$ of the transistor Tr2 varies between pixels.

Figure 27A:
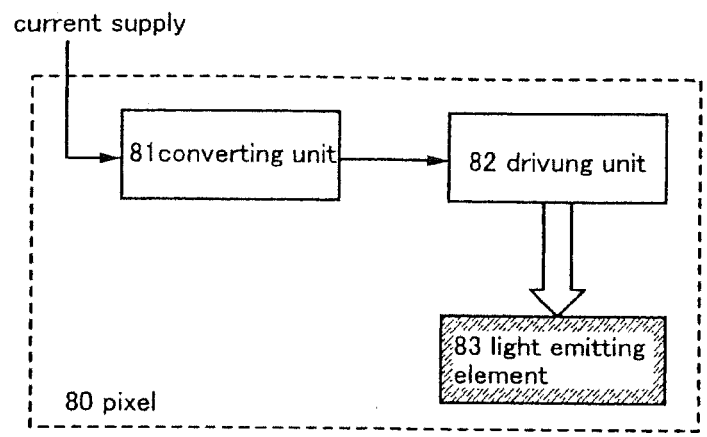
FIGS. 27A and 27B are block diagrams of conventional current input type pixels.
Figure 27B:
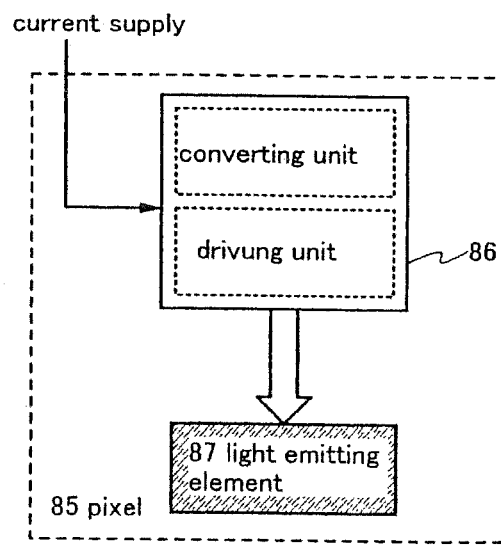

In the pixel of the second structure of the present invention, similar to the pixel shown in FIG. 27A, the amount of current $I_2$ supplied from the driving unit to the light emitting element may not be kept at a desired value if characteristics of one of the first and second means are changed and characteristic balance of the two means is lost. However, the converted voltage is averaged by using the two converting units A and B. Since the current $I_2$ supplied from the driving unit to the light emitting element is in an amount according to the averaged voltage, fluctuation in amount of current supplied to the light emitting element due to a characteristic change can be reduced to about half the fluctuation of the pixel shown in FIG. 27A. Therefore the fluctuation in luminance between pixels can be reduced in the present invention. Furthermore, the current supplied to the pixel is larger than the current $I_2$ and therefore time required to write the current can be shortened.

In the pixel of the present invention, the drain current of the transistor Tr1 does not flow into the light emitting element during a writing period Ta. Accordingly, the capacitance of the light emitting element does not influence the length of period which starts with supply of current to the pixel from the signal line driving circuit to cause the flow of drain current of the transistor Tr1 and change of the gate voltage and which ends with stabilization of the gate voltage value. Therefore, compared to pixels of prior art, the pixel of the present invention is quicker in stabilizing the voltage converted from a supplied current and shorter in current writing time, and can prevent after image from being recognized in animation display.

The light emitting device of the present invention also has the advantage of conventional current input type light emitting devices; the fluctuation in luminance of light emitting element between pixels is smaller in the present invention than in voltage input type light emitting devices when TFT characteristics vary from one pixel to another. In addition, lowering of luminance due to degradation of light emitting element is smaller in the present invention than in the voltage input type pixel of FIG. 25 where the TFT 51 operates in a linear range. Furthermore the present invention can reduce change in luminance of light emitting element regardless of change in organic light emitting layer temperature by the outside temperature and by heat generated from the light emitting panel itself, and can prevent an increase in current consumption accompanying a temperature rise.

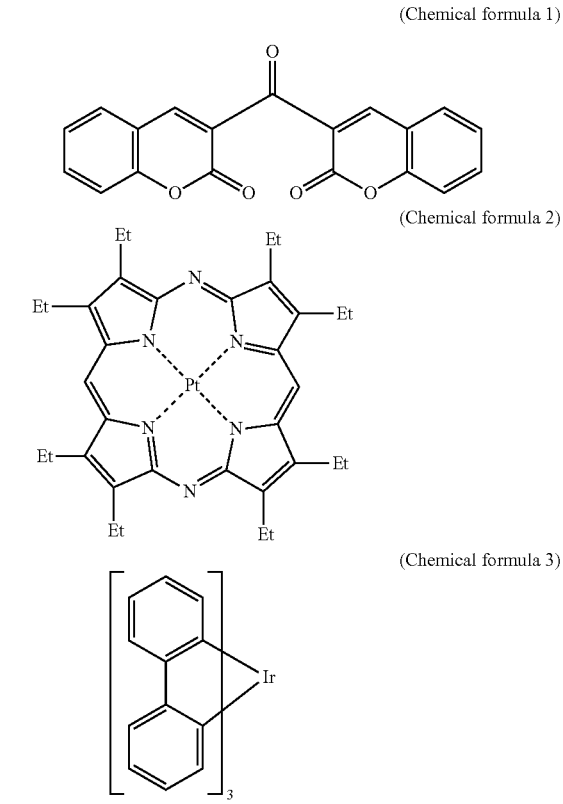

(Chemical formula 1)

(Chemical formula 2)

(Chemical formula 3)

What is claimed is:

1. A light emitting device comprising:
   a light emitting element;
   a first transistor, wherein one of a source and a drain of the first transistor is connected to the light emitting element;
   a second transistor, wherein one of a source and a drain of the second transistor is directly connected to the other of the source and the drain of the first transistor;
   a third transistor, wherein one of a source and a drain of the third transistor is directly connected to the other of the source and the drain of the second transistor;
   a power supply line directly connected to the other of the source and the drain of the third transistor;
   a first scanning line connected to a gate of the first transistor and a gate of the third transistor;
   a capacitor comprising a first electrode and a second electrode, wherein the first electrode is electrically connected to a gate of the second transistor;
   a fourth transistor, wherein one of a source and a drain of the fourth transistor is connected to the first electrode of the capacitor;
   a second scanning line connected to a gate of the fourth transistor; and
   a fifth transistor, wherein one of a source and a drain of the fifth transistor is connected to the other of the source and the drain of the first transistor.

2. The light emitting device according to claim 1, wherein the other of the source and the drain of the fourth transistor is connected to the power supply line.

3. The light emitting device according to claim 1, wherein the second electrode of the capacitor is connected to the one of the source and the drain of the fifth transistor.

4. The light emitting device according to claim 1, wherein the other of the source and the drain of the fifth transistor is connected to a signal line.

5. The light emitting device according to claim 1, further comprising a sixth transistor, wherein a gate of the sixth transistor is connected to the gate of the second transistor.

6. A light emitting device comprising:
- a light emitting element;
- a first transistor, wherein one of a source and a drain of the first transistor is connected to the light emitting element;
- a second transistor, wherein one of a source and a drain of the second transistor is directly connected to the other of the source and the drain of the first transistor;
- a third transistor, wherein one of a source and a drain of the third transistor is directly connected to the other of the source and the drain of the second transistor;
- a power supply line directly connected to the other of the source and the drain of the third transistor;
- a first scanning line connected to a gate of the first transistor and a gate of the third transistor;
- a capacitor comprising a first electrode and a second electrode, wherein the first electrode is electrically connected to a gate of the second transistor;
- a fourth transistor, wherein one of a source and a drain of the fourth transistor is connected to the first electrode of the capacitor;
- a second scanning line connected to a gate of the fourth transistor; and
- a fifth transistor, wherein one of a source and a drain of the fifth transistor is connected to the other of the source and the drain of the first transistor,
- wherein each of the first to fifth transistors comprises:
  - a semiconductor layer comprising a channel formation region, the semiconductor layer comprising polysilicon.

7. The light emitting device according to claim 6, wherein the other of the source and the drain of the fourth transistor is connected to the power supply line.

8. The light emitting device according to claim 6, wherein the second electrode of the capacitor is connected to the one of the source and the drain of the fifth transistor.

9. The light emitting device according to claim 6, wherein the other of the source and the drain of the fifth transistor is connected to a signal line.

10. The light emitting device according to claim 6, further comprising a sixth transistor, wherein a gate of the sixth transistor is connected to the gate of the second transistor.

11. A light emitting device comprising:
- a light emitting element comprising a light emitting layer between a first electrode and a second electrode, the light emitting layer comprising an organic compound capable of emitting light upon application of an electric current;
- a first transistor, wherein one of a source and a drain of the first transistor is connected to the first electrode of the light emitting element;
- a second transistor, wherein one of a source and a drain of the second transistor is directly connected to the other of the source and the drain of the first transistor;
- a third transistor, wherein one of a source and a drain of the third transistor is directly connected to the other of the source and the drain of the second transistor;
- a power supply line directly connected to the other of the source and the drain of the third transistor;
- a first scanning line connected to a gate of the first transistor and a gate of the third transistor;
- a capacitor comprising a first electrode and a second electrode, wherein the first electrode is electrically connected to a gate of the second transistor;
- a fourth transistor, wherein one of a source and a drain of the fourth transistor is connected to the first electrode of the capacitor;
- a second scanning line connected to a gate of the fourth transistor; and
- a fifth transistor, wherein one of a source and a drain of the fifth transistor is connected to the other of the source and the drain of the first transistor.

12. The light emitting device according to claim 11, wherein the other of the source and the drain of the fourth transistor is connected to the power supply line.

13. The light emitting device according to claim 11, wherein the second electrode of the capacitor is connected to the one of the source and the drain of the fifth transistor.

14. The light emitting device according to claim 11, wherein the other of the source and the drain of the fifth transistor is connected to a signal line.

15. The light emitting device according to claim 11, further comprising a sixth transistor, wherein a gate of the sixth transistor is connected to the gate of the second transistor.

* * * * *

UNITED STATES PATENT AND TRADEMARK OFFICE
CERTIFICATE OF CORRECTION

PATENT NO. : 8,704,736 B2
APPLICATION NO. : 13/936778
DATED : April 22, 2014
INVENTOR(S) : Hajime Kimura It is certified that error appears in the above-identified patent and that said Letters Patent is hereby corrected as shown below:

In the Specification

Column 4, line 42, replace "home" with --borne--;

Column 14, line 13, replace "Agate" with --A gate--;

Column 15, line 24, after "line" replace "G" with --G1--;

Column 15, line 64, replace "Van" with --$V_{TH}$--;

Column 15, line 65, replace "Van" with --$V_{TH}$--;

Column 27, line 57, replace "Agate" with --A gate--;

Column 32, line 9, after "laser" insert --,--; (First Occurrence)

Column 33, line 56, replace "15 to 450." with --15° to 45°.--;

Column 34, line 35, replace "$TaC_5$" with --$TaCl_5$--;

Column 39, line 3, replace "m" with --in--;

Column 39, line 65, replace "resistor" with --register--;

Column 41, line 35, replace "resistor" with --register--;

Column 42, line 48, replace "SWL" with --SW1--;

Column 52, line 47, after "of" replace "V" with --V1--;

Signed and Sealed this
Second Day of December, 2014

Michelle K. Lee
*Deputy Director of the United States Patent and Trademark Office*

CERTIFICATE OF CORRECTION (continued)
U.S. Pat. No. 8,704,736 B2

Column 52, line 63, replace "Agate" with --A gate--;

Column 53, line 39, replace "311A" with --31A--;

Column 57, line 33, replace "dram" with --drain--.